(12) United States Patent
Matsubayashi et al.

(10) Patent No.: US 10,074,748 B2
(45) Date of Patent: Sep. 11, 2018

(54) SEMICONDUCTOR DEVICE COMPRISING OXIDE SEMICONDUCTOR FILM

(71) Applicant: Semiconductor Energy Laboratory Co., Ltd., Atsugi-shi, Kanagawa-ken (JP)

(72) Inventors: Daisuke Matsubayashi, Kanagawa (JP); Satoshi Shinohara, Kanagawa (JP); Wataru Sekine, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/001,300

(22) Filed: Jan. 20, 2016

(65) Prior Publication Data
US 2016/0141422 A1 May 19, 2016

Related U.S. Application Data

(63) Continuation of application No. 14/093,648, filed on Dec. 2, 2013, now Pat. No. 9,252,283.

(30) Foreign Application Priority Data

Nov. 30, 2012 (JP) .................................. 2012-261795

(51) Int. Cl.
*H01L 29/49* (2006.01)
*H01L 29/786* (2006.01)

(52) U.S. Cl.
CPC ...... *H01L 29/7869* (2013.01); *H01L 29/4908* (2013.01); *H01L 29/78612* (2013.01); *H01L 29/78696* (2013.01)

(58) Field of Classification Search
CPC .............................. H01L 29/49; H01L 29/786
(Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN   101866952 A   10/2010
CN   102549757 A   7/2012
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Sheng Zhu
(74) *Attorney, Agent, or Firm* — Fish & Richardson P.C.

(57) ABSTRACT

A semiconductor device in which deterioration of electrical characteristics which becomes more noticeable as the transistor is miniaturized can be suppressed is provided. The semiconductor device includes an oxide semiconductor stack in which a first oxide semiconductor layer, a second oxide semiconductor layer, and a third oxide semiconductor layer are stacked in this order from the substrate side over a substrate; a source electrode layer and a drain electrode layer which are in contact with the oxide semiconductor stack; a gate insulating film over the oxide semiconductor stack, the source electrode layer, and the drain electrode layer; and a gate electrode layer over the gate insulating film. The first oxide semiconductor layer includes a first region. The gate insulating film includes a second region. When the thickness of the first region is $T_{S1}$ and the thickness of the second region is $T_{G1}$, $T_{S1} \geq T_{G1}$.

11 Claims, 33 Drawing Sheets

(58) Field of Classification Search
USPC ............... 257/43, E29.296, E21.46; 438/104
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,626,125 B2 | 12/2009 | Nakamura |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,089,117 B2 | 1/2012 | Shimizu |
| 8,110,748 B2 | 2/2012 | Nakamura |
| 8,164,152 B2 | 4/2012 | Lee et al. |
| 8,207,531 B2 | 6/2012 | Takahashi et al. |
| 8,318,551 B2 | 11/2012 | Akimoto et al. |
| 8,344,373 B2 | 1/2013 | Sato et al. |
| 8,362,478 B2 | 1/2013 | Yamazaki et al. |
| 8,373,237 B2 | 2/2013 | Park et al. |
| 8,692,252 B2 | 4/2014 | Takata et al. |
| 8,748,880 B2 | 6/2014 | Yamazaki et al. |
| 8,766,252 B2 | 7/2014 | Yamazaki |
| 8,785,241 B2 | 7/2014 | Sasagawa et al. |
| 8,809,853 B2 | 8/2014 | Saito et al. |
| 8,853,690 B2 | 10/2014 | Yamazaki et al. |
| 9,190,528 B2 | 11/2015 | Yamazaki et al. |
| 9,275,858 B2 | 3/2016 | Yamazaki |
| 9,379,136 B2 | 6/2016 | Sasagawa et al. |
| 9,640,642 B2 | 5/2017 | Sasagawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2010/0006834 A1* | 1/2010 | Kim ................. H01L 29/78696 257/43 |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0176392 A1 | 7/2010 | Kang et al. |
| 2010/0270619 A1 | 10/2010 | Lee |
| 2011/0049509 A1 | 3/2011 | Takahashi et al. |
| 2011/0062992 A1 | 3/2011 | Okazaki et al. |
| 2011/0073856 A1 | 3/2011 | Sato et al. |
| 2011/0121288 A1 | 5/2011 | Yamazaki et al. |
| 2011/0127522 A1 | 6/2011 | Yamazaki |
| 2011/0148455 A1 | 6/2011 | Kato et al. |
| 2011/0156027 A1 | 6/2011 | Yamazaki et al. |
| 2011/0186932 A1 | 8/2011 | Mizumura et al. |
| 2012/0001169 A1 | 1/2012 | Yamazaki |
| 2012/0001266 A1 | 1/2012 | Lim et al. |
| 2012/0132903 A1* | 5/2012 | Yamazaki et al. ............. 257/43 |
| 2012/0138922 A1 | 6/2012 | Yamazaki et al. |
| 2012/0205651 A1 | 8/2012 | Lee et al. |
| 2012/0241739 A1 | 9/2012 | Yamazaki et al. |
| 2012/0280225 A1* | 11/2012 | Sakata ............... 257/43 |
| 2014/0332809 A1 | 11/2014 | Saito et al. |
| 2016/0211380 A1 | 7/2016 | Yamazaki |
| 2017/0229563 A1 | 8/2017 | Sasagawa et al. |

FOREIGN PATENT DOCUMENTS

| | | |
|---|---|---|
| CN | 103229304 A | 7/2013 |
| EP | 1737044 | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-304167 A | 10/2004 |
| JP | 2006-165528 A | 6/2006 |
| JP | 2010-157702 A | 7/2010 |
| JP | 2011-124360 A | 6/2011 |
| JP | 2011-243745 A | 12/2011 |
| JP | 2012-039102 A | 2/2012 |
| JP | 2012-134467 A | 7/2012 |
| JP | 2012-199528 A | 10/2012 |
| TW | 201145519 | 12/2011 |
| TW | 201205815 | 2/2012 |
| TW | 201236155 | 9/2012 |
| WO | WO-2004/114391 | 12/2004 |
| WO | WO-2007/029482 | 3/2007 |
| WO | WO-2010/064590 | 6/2010 |
| WO | WO-2011/039853 | 4/2011 |
| WO | WO-2011/062057 | 5/2011 |
| WO | WO-2012/002471 | 1/2012 |
| WO | WO-2012/073918 | 6/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No.2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2OS—A2O3—BO Systems [A; Fe, Ga, or Al; B: Mg, Mn, Fe, Ni, Cu,or Zn]At Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/JP2013/081577) dated Dec. 17, 2013.
Written Opinion (Application No. PCT/JP2013/081577) dated Dec. 17, 2013.

(56) References Cited

OTHER PUBLICATIONS

Hisamoto.D et al., "A Folded-channel MOSFET for Deep-sub-tenth Micron Era", IEDM 98: Technical Digest of International Electron Devices Meeting, Dec. 6, 1998, pp. 1032-1034.
Chinese Office Action (Application No. 201380061385.6) dated Feb. 4, 2017.
Taiwanese Office Action (Application No. 106127963) dated Oct. 31, 2017.

\* cited by examiner

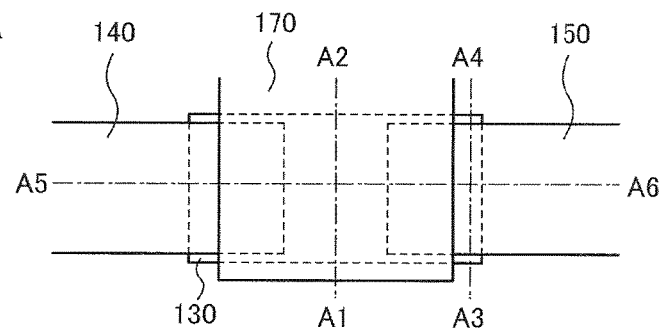
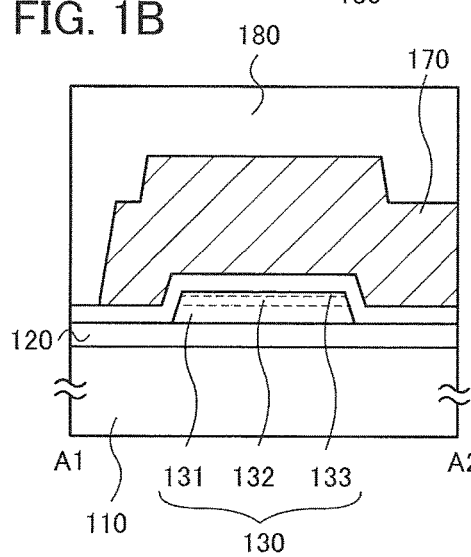
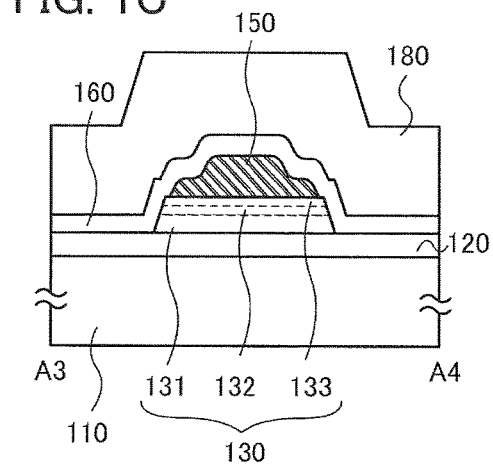
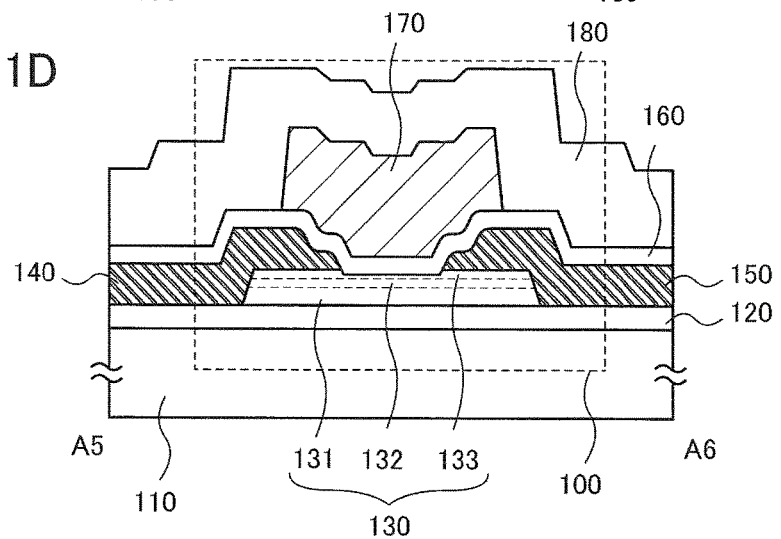

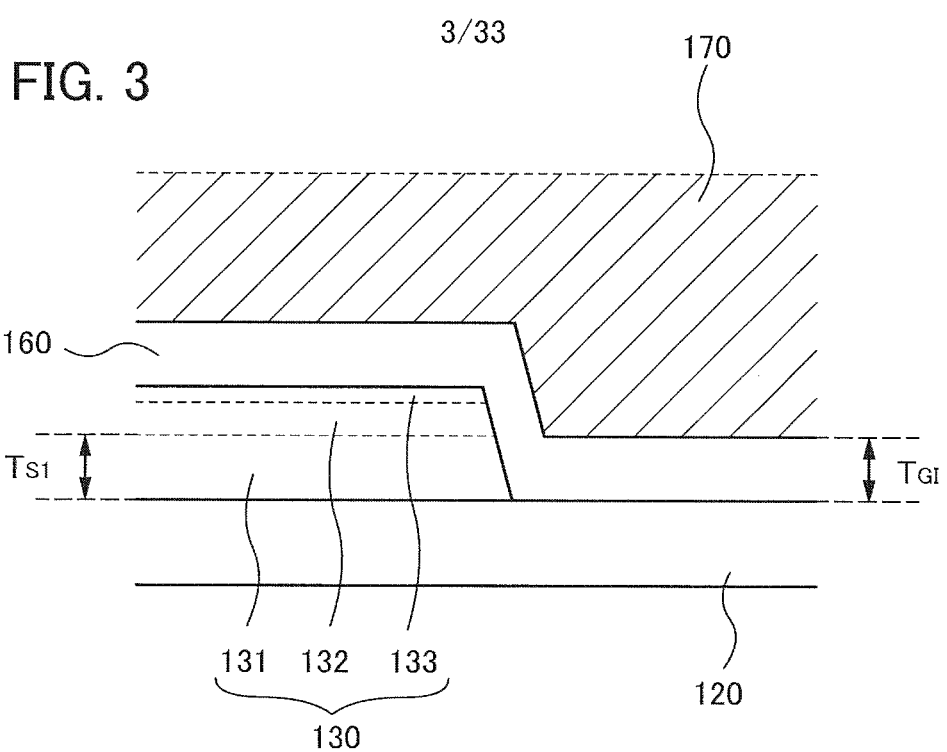

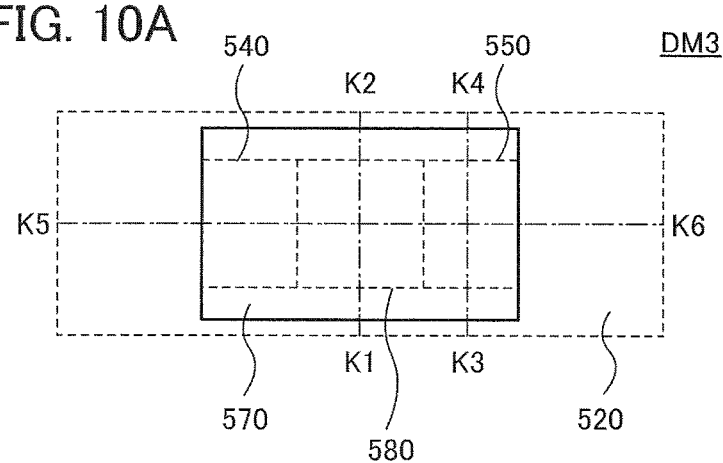
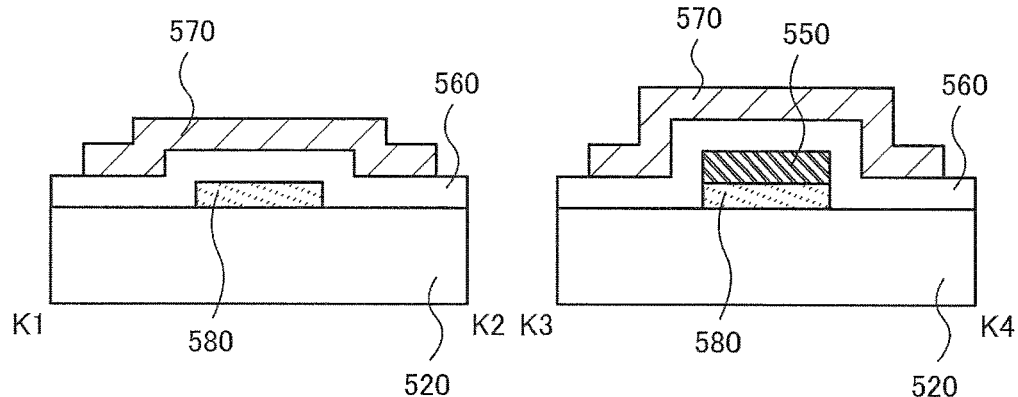
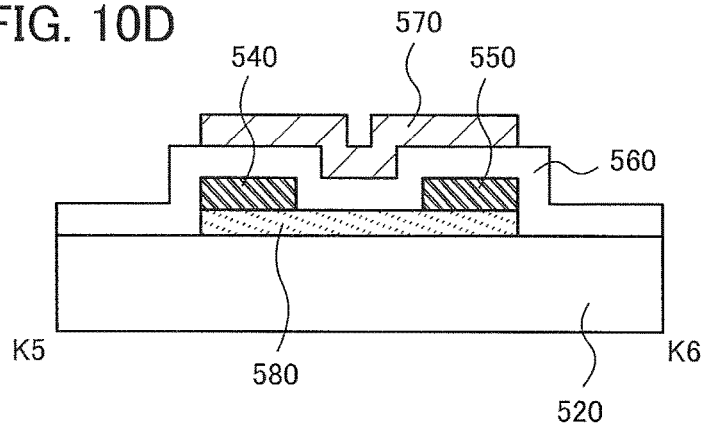

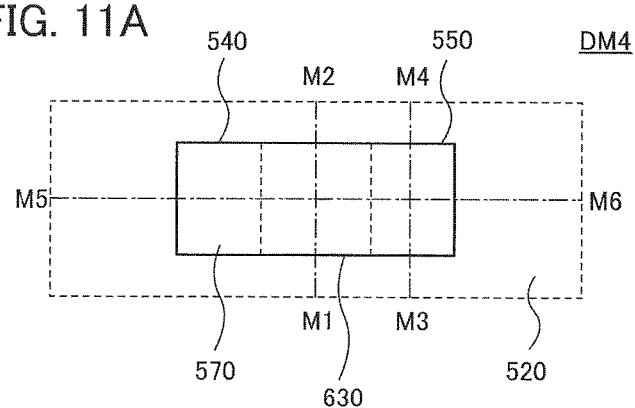
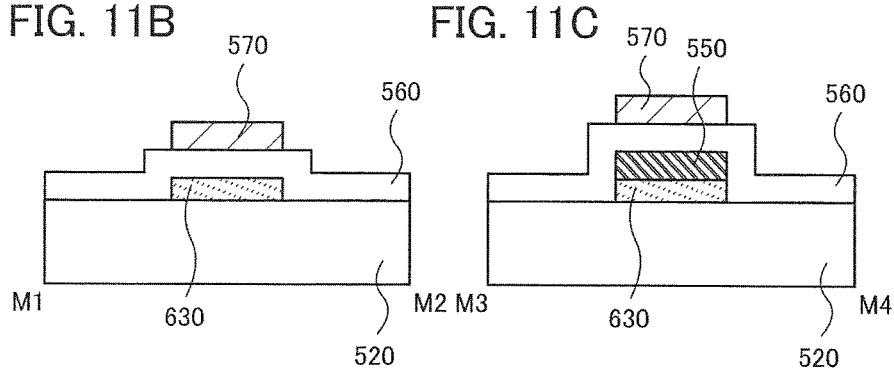
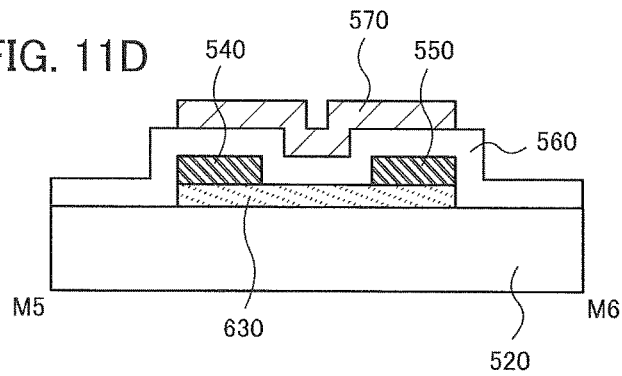

FIG. 14A
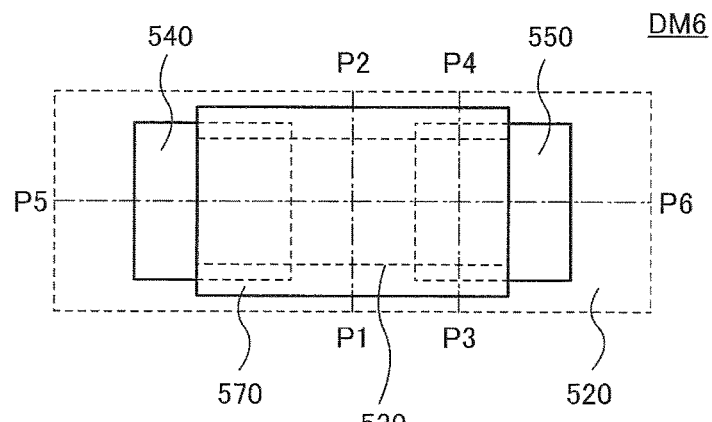
FIG. 14B
FIG. 14C
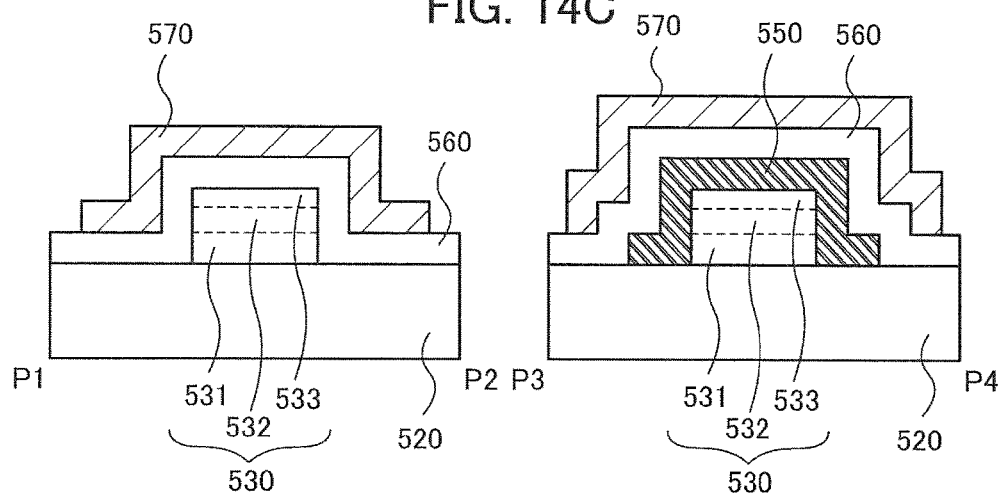
FIG. 14D
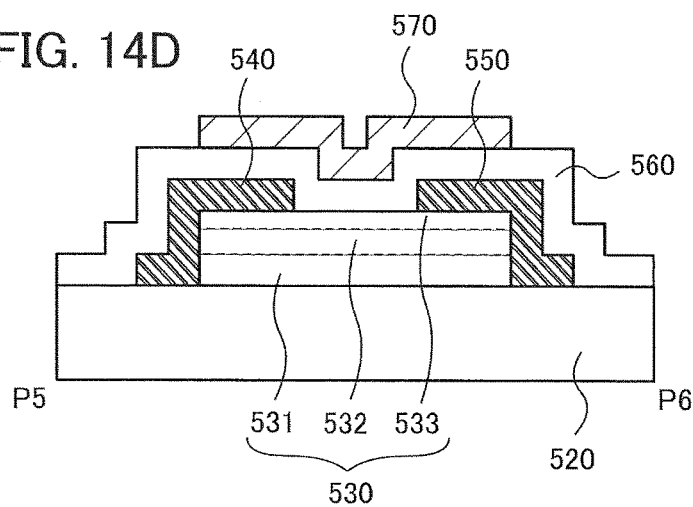

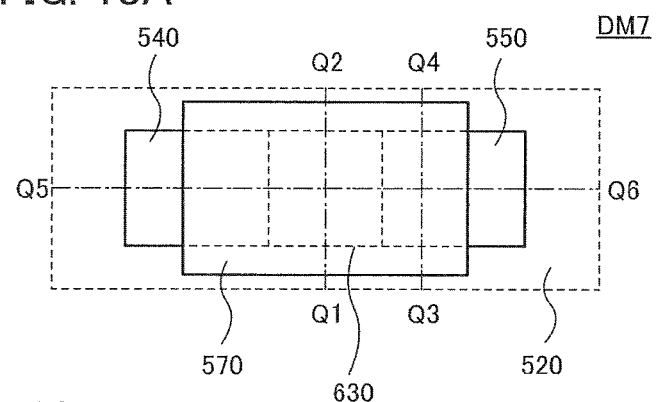
FIG. 18A
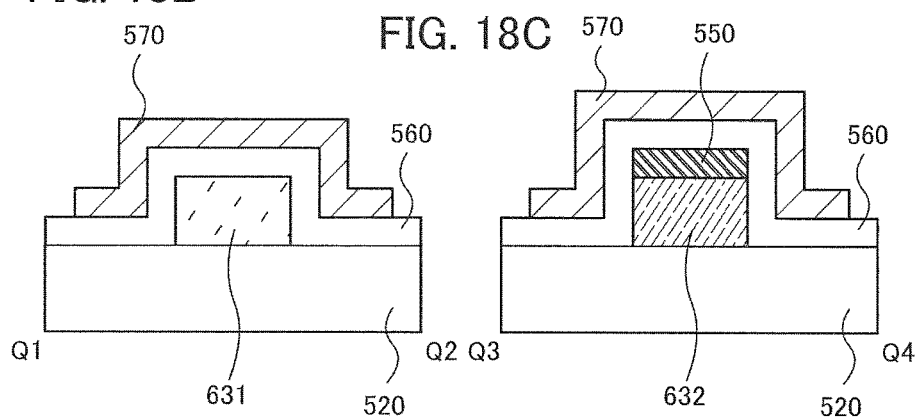
FIG. 18B
FIG. 18C
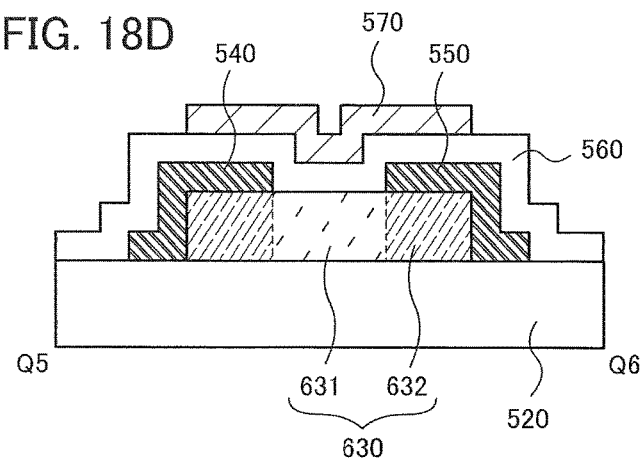
FIG. 18D

SEMICONDUCTOR DEVICE COMPRISING OXIDE SEMICONDUCTOR FILM

CROSS-REFERENCE TO RELATED APPLICATIONS

This application is a continuation of U.S. application Ser. No. 14/093,648, filed Dec. 2, 2013, now allowed, which claims the benefit of a foreign priority application filed in Japan as Serial No. 2012-261795 on Nov. 30, 2012, both of which are incorporated by reference.

TECHNICAL FIELD

The present invention relates to an object, a method, a manufacturing method, a process, a machine, manufacture, or composition of matter. In particular, the present invention relates to a semiconductor device, a display device, a light-emitting device, a method for driving them, or a method for manufacturing them, for example. In particular, the present invention relates to a semiconductor device including an oxide semiconductor, a display device including an oxide semiconductor, or a light-emitting device including an oxide semiconductor, for example.

In this specification, a "semiconductor device" refers to a device that can function by utilizing semiconductor characteristics; an electro-optical device, a semiconductor circuit, and an electronic device are all included in the category of the semiconductor device.

BACKGROUND ART

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another example, an oxide semiconductor has been attracting attention.

For example, a transistor whose active layer includes an amorphous oxide semiconductor containing indium (In), gallium (Ga), and zinc (Zn) is disclosed in Patent Document 1.

REFERENCE

Patent Document

[Patent Document 1] Japanese Published Patent Application No. 2006-165528

DISCLOSURE OF INVENTION

In general, formation of highly-integrated circuit requires miniaturization of a transistor. It is known that miniaturization of a transistor causes deterioration of electrical characteristics of the transistor, such as threshold voltage and an S value (subthreshold value).

One object of one embodiment of the present invention is to provide a semiconductor device in which deterioration of electrical characteristics which becomes more noticeable as the transistor is miniaturized can be suppressed. Another object of one embodiment of the present invention is to provide a semiconductor device with low power consumption. Another object of one embodiment of the present invention is to provide a semiconductor device with high reliability. Another object of one embodiment of the present invention is to provide a semiconductor device in which deterioration of an S value (subthreshold value) is reduced. Another object of one embodiment of the present invention is to provide a semiconductor device in which deterioration of threshold voltage is reduced. Another object of one embodiment of the present invention is to provide a semiconductor device in which generation of a parasitic channel is reduced. Another object of one embodiment of the present invention is to provide a semiconductor device which can retain data even when power supply is stopped.

Note that the descriptions of these problems do not disturb the existence of other problems. Note that in one embodiment of the present invention, there is no need to achieve all the objects. Other objects are apparent from and can be derived from the description of the specification, the drawings, the claims, and the like.

One embodiment of the present invention relates to a semiconductor device including an oxide semiconductor stack.

One embodiment of the present invention is a semiconductor device including a substrate having an insulating surface; an oxide semiconductor stack in which a first oxide semiconductor layer, a second oxide semiconductor layer, and a third oxide semiconductor layer are stacked in this order from the substrate side over the substrate; a source electrode layer and a drain electrode layer which are in contact with the oxide semiconductor stack; a gate insulating film over the oxide semiconductor stack, the source electrode layer, and the drain electrode layer; and a gate electrode layer over the gate insulating film. The first oxide semiconductor layer includes a first region. The gate insulating film includes a second region. When the thickness of the first region is $T_{S1}$ and the thickness of the second region is $T_{G1}$, $T_{S1} \geq T_{G1}$.

Note that in this specification and the like, ordinal numbers such as "first" and "second" are used in order to avoid confusion among components and do not limit the components numerically.

In the above structure, energy of a bottom of a conduction band of each of the first oxide semiconductor layer and the third oxide semiconductor layer is preferably closer to a vacuum level than that of the second oxide semiconductor layer. An energy difference of the bottom of the conduction band between the second oxide semiconductor layer and the first oxide semiconductor layer and an energy difference of the bottom of the conduction band between the second oxide semiconductor layer and the third oxide semiconductor layer are each preferably greater than or equal to 0.05 eV and smaller than or equal to 2 eV.

It is preferable that the first oxide semiconductor layer, the second oxide semiconductor layer, and the third oxide semiconductor layer be each an In-M-Zn oxide (M is Al, Ti, Ga, Y, Zr, La, Ce, Nd, or Hf), and that a proportion of M with respect to In in an atomic ratio in each of the first oxide semiconductor layer and the third oxide semiconductor layer be higher than an atomic ratio of M to In in the second oxide semiconductor layer.

The source electrode layer may include a first source electrode layer which is in contact with the oxide semiconductor stack and a second source electrode layer which covers the first source electrode layer and is in contact with the oxide semiconductor stack. The drain electrode layer may include a first drain electrode layer which is in contact with the oxide semiconductor stack and a second drain electrode layer which covers the first drain electrode layer and is in contact with the oxide semiconductor stack.

The source electrode layer may include a second source electrode layer which is in contact with the oxide semiconductor stack and a first source electrode layer which is over the second source electrode layer and is in contact with the oxide semiconductor stack. The drain electrode layer may include a second drain electrode layer which is in contact with the oxide semiconductor stack and a first drain electrode layer which is over the second drain electrode layer and is in contact with the oxide semiconductor stack.

Here, the first source electrode layer and the first drain electrode layer are each preferably formed using Al, Cr, Cu, Ta, Ti, Mo, and W, or an alloy material including any of these materials as its main component, and the second source electrode layer and the second drain electrode layer are each preferably formed using a material including tantalum nitride, titanium nitride, or ruthenium.

One embodiment of the present invention is a semiconductor device including a substrate having an insulating surface; a first oxide semiconductor layer over the substrate; a second oxide semiconductor layer over the first oxide semiconductor layer; a first source electrode layer and a first drain electrode layer over the second oxide semiconductor layer; a third oxide semiconductor layer over the second oxide semiconductor layer, the first source electrode layer, and the first drain electrode layer; a second source electrode layer covering the first source electrode layer; a second drain electrode layer covering the first drain electrode layer; a gate insulating film over the third oxide semiconductor layer, the second source electrode layer, and the second drain electrode layer; and a gate electrode layer over the gate insulating film. The first source electrode layer and the first drain electrode layer are in contact with the first oxide semiconductor layer, the second oxide semiconductor layer, and the third oxide semiconductor layer. The second source electrode layer and the second drain electrode layer are in contact with the third oxide semiconductor layer. The first oxide semiconductor layer includes a first region. The gate insulating film includes a second region. When the thickness of the first region is $T_{S1}$ and the thickness of the second region is $T_{G1}$, $T_{S1} \geq T_{G1}$.

In the above structure, the energy of the bottom of the conduction band of each of the first oxide semiconductor layer and the third oxide semiconductor layer is preferably closer to a vacuum level than that of the second oxide semiconductor layer. Further, the energy difference of the bottom of the conduction band between the second oxide semiconductor layer and the first oxide semiconductor layer and the energy difference of the bottom of the conduction band between the second oxide semiconductor layer and the third oxide semiconductor layer are each preferably greater than or equal to 0.05 eV and smaller than or equal to 2 eV.

It is preferable that the first to third oxide semiconductor layers be each formed using an In-M-Zn oxide (M is Al, Ti, Ga, Y, Zr, La, Ce, Nd, or Hf), and that the proportion of M with respect to In in the atomic ratio in each of the first and third oxide semiconductor layers be higher than that in the second oxide semiconductor layer.

In the above structure, it is preferable that the first source electrode layer and the first drain electrode layer be each formed using Al, Cr, Cu, Ta, Ti, Mo, W, or an alloy material containing any of Al, Cr, Cu, Ta, Ti, Mo, and W as its main component.

The second source electrode layer and the second drain electrode layer are each preferably formed using a material comprising tantalum nitride, titanium nitride, or ruthenium.

According to one embodiment of the present invention, the following semiconductor devices can be provided: a semiconductor device in which deterioration of electrical characteristics which becomes more noticeable as a transistor is miniaturized can be suppressed, a semiconductor device with low power consumption, a semiconductor device with high reliability, a semiconductor device in which deterioration of the S value (subthreshold value) is reduced, a semiconductor device in which deterioration of the threshold voltage is reduced, a semiconductor device in which generation of a parasitic channel is reduced, and a semiconductor device which can retain data even when power supply is stopped.

BRIEF DESCRIPTION OF DRAWINGS

FIGS. 1A to 1D are a top view and cross-sectional views of a transistor.

FIG. 3 is an enlarged cross-sectional view of a transistor.

FIGS. 10A to 10D are a top view and cross-sectional views of a model used for device simulation.

FIGS. 11A to 11D are a top view and cross-sectional views of a model used for device simulation.

FIGS. 14A to 14D are a top view and cross-sectional views of a model used for device simulation.

FIGS. 18A to 18D are a top view and cross-sectional views of a model used for device simulation.

BEST MODE FOR CARRYING OUT THE INVENTION

Figure 2A:
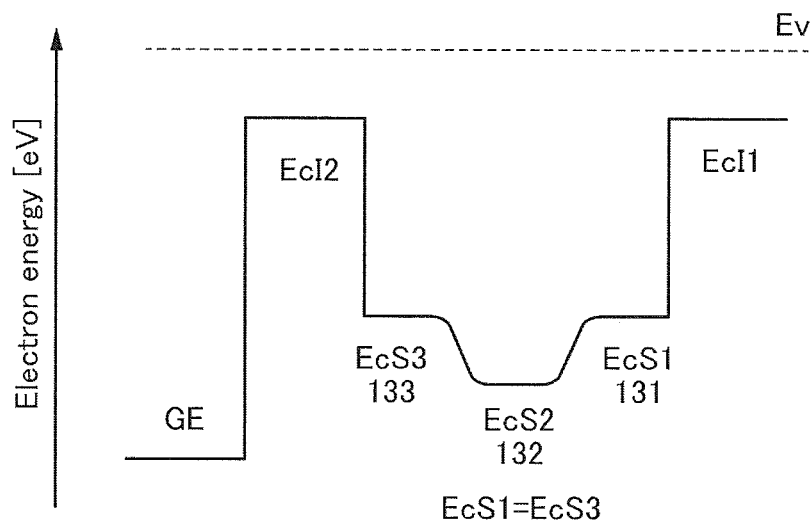
FIGS. 2A and 2B each illustrate a band structure of an oxide semiconductor stack.

Embodiments are described in detail with reference to the drawings. Note that the present invention is not limited to the following description and it is readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is omitted in some cases.

Note that in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, a layer, or the like). Accordingly, another connection relation shown in drawings and texts is included without being limited to a predetermined connection relation, for example, the connection relation shown in the drawings and the texts.

For example, in the case where X and Y are electrically connected, one or more elements which enable electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, the switch has a function of determining whether current flows or not by being turning on or off (becoming an on state and an off state). Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "A and B are electrically connected", the description is the same as the case where it is explicitly only described that "A and B are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, or the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film are attachment films formed using polypropylene, polyester, polyvinyl fluoride, polyvinyl chloride, and the like. Examples of a base film are a base film formed using polyester, polyamide, polyimide, inorganic vapor deposition film, paper, and the like. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such transistors, power consumption of the circuit can be reduced or the circuit can be highly integrated.

Note that the transistor may be formed using one substrate, and then, the transistor may be transferred to another substrate. Example of a substrate to which a transistor is transferred are, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, transistors with excellent properties or transistors with low power consumption can be formed, a device with high durability or high heat resistance can be formed, or reduction in weight or thinning can be achieved.

(Embodiment 1)

In this embodiment, a semiconductor device of one embodiment of the present invention is described with reference to drawings.

FIGS. 1A to 1D are a top view and cross-sectional views which illustrate a transistor of one embodiment of the present invention. FIG. 1A is the top view. FIG. 1B illustrates a cross section taken along a dashed-dotted line A1-A2 in FIG. 1A. FIG. 1C illustrates a cross section taken along a dashed-dotted line A3-A4 in FIG. 1A. FIG. 1D illustrates a cross section taken along a dashed-dotted line A5-A6 in FIG. 1A. Note that for simplification of the drawing, some components in the top view in FIG. 1A are not illustrated. In some cases, the direction of the dashed-dotted line A1-A2 is referred to as a channel width direction, and the direction of the dashed-dotted line A5-A6 is referred to as a channel length direction.

A transistor 100 illustrated in FIGS. 1A to 1D includes a base insulating film 120 formed over a substrate 110; an oxide semiconductor stack 130 formed over the base insulating film 120; a source electrode layer 140 and a drain electrode layer 150 formed over the oxide semiconductor stack 130; a gate insulating film 160 formed over the source electrode layer 140, the drain electrode layer 150, and the oxide semiconductor stack 130; and a gate electrode layer 170 formed over the gate insulating film 160. Further, an oxide insulating layer 180 may be formed over the gate insulating film 160 and the gate electrode layer 170. Note that the oxide insulating layer 180 may be provided as needed and another insulating layer may be further provided thereover.

Note that functions of a "source" and a "drain" of a transistor are sometimes replaced with each other when a transistor of opposite polarity is used or when the direction of current flowing is changed in circuit operation, for example. Thus, the terms "source" and "drain" can be used to denote the drain and the source, respectively, in this specification.

The substrate 110 is not limited to a simple supporting substrate, and may be a substrate where another device such as a transistor is formed. In that case, at least one of the gate electrode layer 170, the source electrode layer 140, and the drain electrode layer 150 of the transistor 100 may be electrically connected to the above device.

The base insulating film 120 can have a function of supplying oxygen to the oxide semiconductor stack 130 as well as a function of preventing diffusion of an impurity from the substrate 110; thus, the base insulating film 120 is preferably an insulating film containing oxygen, further preferably an insulating film containing excess oxygen. Note that in the case where the substrate 110 is a substrate where another device is formed as described above, the base insulating film 120 also has a function as an interlayer insulating film. In that case, the base insulating film 120 is preferably subjected to planarization treatment such as chemical mechanical polishing (CMP) treatment so as to have a flat surface.

Further, the oxide semiconductor stack 130 has a structure in which a first oxide semiconductor layer 131, a second oxide semiconductor layer 132, and a third oxide semiconductor layer 133 are stacked in this order from the substrate 110 side. Here, for the second oxide semiconductor layer 132, for example, an oxide semiconductor whose electron affinity (a difference in energy between a vacuum level and the bottom of a conduction band) is higher than those of the first oxide semiconductor layer 131 and the third oxide semiconductor layer 133 is used. The electron affinity can be obtained by subtracting an energy difference between the bottom of a conduction band and a top of a valence band (what is called an energy gap) from an energy difference between the vacuum level and the top of the valence band (what is called an ionization potential).

Although the case where the oxide semiconductor stack 130 is a stack of three layers is described in this embodiment, the oxide semiconductor stack 130 may be a single layer or a stack of two layers or four or more layers. In the case of a single layer, for example, a layer corresponding to the second oxide semiconductor layer 132 is used. In the case of the two-layer stacked structure, for example, a structure in which a layer corresponding to the second oxide semiconductor layer 132 is provided on the substrate 110 side and a layer corresponding to the first oxide semiconductor layer 131 or the third oxide semiconductor layer 133 is provided on the gate insulating film 160 side or a structure in which a layer corresponding to the first oxide semiconductor layer 131 or the third oxide semiconductor layer 133 is provided on the substrate 110 side and a layer corresponding to the second oxide semiconductor layer 132 is provided on the gate insulating film 160 side, or the like may be employed. In the case of four or more layers, for example, the second oxide semiconductor layer 132 is provided between layers each corresponding to the first oxide semiconductor layer 131 or the third oxide semiconductor layer 133 as described in this embodiment.

The first oxide semiconductor layer 131 and the third oxide semiconductor layer 133 each contain one or more kinds of metal elements forming the second oxide semiconductor layer 132. For example, the first oxide semiconductor layer 131 and the third oxide semiconductor layer 133 are preferably formed using an oxide semiconductor whose energy of the bottom of the conduction band is closer to a vacuum level than that of the second oxide semiconductor layer 132. Further, the energy difference of the bottom of the conduction band between the second oxide semiconductor layer 132 and the first oxide semiconductor layer 131 and the energy difference of the bottom of the conduction band between the second oxide semiconductor layer 132 and the third oxide semiconductor layer 133 are each preferably greater than or equal to 0.05 eV, 0.07 eV, 0.1 eV, or 0.15 eV and smaller than or equal to 2 eV, 1 eV, 0.5 eV, or 0.4 eV.

In such a structure, when an electric field is applied to the gate electrode layer 170, a channel is formed in the second oxide semiconductor layer 132 of the oxide semiconductor stack 130, whose energy at the bottom of the conduction band is the lowest. In other words, the third oxide semiconductor layer 133 is formed between the second oxide semiconductor layer 132 and the gate insulating film 160, whereby a structure in which the channel of the transistor is not in contact with the gate insulating film 160 can be obtained.

Further, since the first oxide semiconductor layer 131 includes one or more metal elements included in the second oxide semiconductor layer 132, an interface state is less likely to be formed at the interface between the second oxide semiconductor layer 132 and the first oxide semiconductor layer 131. The interface state sometimes forms a channel; therefore, the threshold voltage of the transistor is changed in some cases. Thus, with the first oxide semiconductor layer 131, fluctuation in electrical characteristics of the transistors, such as a threshold voltage, can be reduced.

Furthermore, since the third oxide semiconductor layer 133 includes one or more metal elements included in the second oxide semiconductor layer 132, scattering of carriers is less likely to occur at the interface between the second oxide semiconductor layer 132 and the third oxide semiconductor layer 133. Therefore, with the third oxide semiconductor layer 133, the field-effect mobility of the transistor can be increased.

For the first oxide semiconductor layer 131 and the third oxide semiconductor layer 133, for example, a material containing Al, Ti, Ga, Ge, Y, Zr, Sn, La, Ce, or Hf with a higher atomic ratio than that used for the second oxide semiconductor layer 132 can be used. Specifically, an atomic ratio of any of the above metal elements in the first oxide semiconductor layer 131 and the third oxide semiconductor layer 133 is 1.5 times or more, preferably 2 times or more, further preferably 3 times or more as much as that in the second oxide semiconductor layer 132 is contained. Any of the above metal elements is strongly bonded to oxygen and thus has a function of suppressing generation of an oxygen vacancy in the first oxide semiconductor layer 131 and the third oxide semiconductor layer 133. That is, an oxygen vacancy is less likely to be generated in the first oxide semiconductor layer 131 and the third oxide semiconductor layer 133 than in the second oxide semiconductor layer 132.

Note that when each of the first oxide semiconductor layer 131, the second oxide semiconductor layer 132, and the third oxide semiconductor layer 133 is an In-M-Zn oxide containing at least indium, zinc, and M (M is a metal such as Al, Ti, Ga, Ge, Y, Zr, Sn, La, Ce, or Hf), and the first oxide semiconductor layer 131 has an atomic ratio of In to M and Zn which is $x_1:y_1:z_1$, the second oxide semiconductor layer 132 has an atomic ratio of In to M and Zn which is $x_2:y_2:z_2$, and the third oxide semiconductor layer 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor layer 132, a transistor can have stable electrical characteristics. However, when $y_2$ is 3 times or more as great as $x_2$, the field-effect mobility of the transistor is reduced; accordingly, $y_2$ is preferably less than 3 times $x_2$.

Further, when summation of In and M is assumed to be 100 atomic %, the proportions of In and M in each of the first oxide semiconductor layer 131 and the third oxide semiconductor layer 133 are preferably less than 50 atomic % and greater than or equal to 50 atomic %, respectively, and further preferably less than 25 atomic % and greater than or equal to 75 atomic %, respectively. In addition, when summation of In and M is assumed to be 100 atomic %, the proportions of In and M in the second oxide semiconductor layer 132 are preferably greater than or equal to 25 atomic % and less than 75 atomic %, respectively, and further preferably greater than or equal to 34 atomic % and less than 66 atomic %, respectively.

The thicknesses of the first oxide semiconductor layer 131 and the third oxide semiconductor layer 133 are each greater than or equal to 3 nm and less than or equal to 100 nm, preferably greater than or equal to 3 nm and less than or equal to 50 nm. The thickness of the second oxide semiconductor layer 132 is greater than or equal to 3 nm and less than or equal to 200 nm, preferably greater than or equal to 3 nm and less than or equal to 100 nm, further preferably greater than or equal to 3 nm and less than or equal to 50 nm.

For the first oxide semiconductor layer 131, the second oxide semiconductor layer 132, and the third oxide semiconductor layer 133, an oxide semiconductor containing indium, zinc, and gallium can be used, for example. Note that the second oxide semiconductor layer 132 preferably contains indium because carrier mobility can be increased.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

Further, in the oxide semiconductor layer, hydrogen, nitrogen, carbon, silicon, and a metal element other than main components are impurities. For example, hydrogen and nitrogen form donor levels to increase the carrier density. Silicon forms impurity levels in an oxide semiconductor layer. The impurity levels serve as traps and might cause electrical characteristics of the transistor to deteriorate. Therefore, it is preferable to reduce the concentration of the impurities in the first oxide semiconductor layer 131, the second oxide semiconductor layer 132, and the third oxide semiconductor layer 133 and at interfaces between the layers.

In order to make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is preferably lower than $1\times10^{19}$ atoms/$cm^3$, more preferably lower than $5\times10^{18}$ atoms/$cm^3$, still more preferably lower than $1\times10^{18}$ atoms/$cm^3$. Further, the concentration of hydrogen at a certain depth of the oxide semiconductor layer or in a region of the oxide semiconductor layer is preferably lower than or equal to $2\times10^{20}$ atoms/$cm^3$, more preferably lower than or equal to $5\times10^{19}$ atoms/$cm^3$, still more preferably lower than or equal to $1\times10^{19}$ atoms/$cm^3$, yet still more preferably lower than or equal to $5\times10^{18}$ atoms/$cm^3$. Further, the concentration of nitrogen at a certain depth of the oxide semiconductor layer or in a region of the oxide semiconductor layer is preferably lower than $5\times10^{19}$ atoms/$cm^3$, more preferably lower than or equal to $5\times10^{18}$ atoms/$cm^3$, still more preferably lower than or equal to $1\times10^{18}$ atoms/$cm^3$, yet still more preferably lower than or equal to $5\times10^{17}$ atoms/$cm^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/$cm^3$, preferably lower than $5\times10^{18}$ atoms/$cm^3$, more preferably lower than $1\times10^{18}$ atoms/$cm^3$. Further, the concentration of carbon at a certain depth of the oxide semiconductor layer or in a region of the oxide semiconductor layer may be lower than $1\times10^{19}$ atoms/$cm^3$, preferably lower than $5\times10^{18}$ atoms/$cm^3$, more preferably lower than $1\times10^{18}$ atoms/$cm^3$, for example.

A transistor in which a highly purified oxide semiconductor film is used for a channel formation region as described above has an extremely low off-state current, and the off-state current standardized on the channel width of the transistor can be as low as several yoktoamperes per micrometer to several zeptoamperes per micrometer. The voltage between the source and the drain in this case is, for example, about 0.1 V, 5 V, or 10 V.

Note that as the gate insulating film of the transistor, an insulating film containing silicon is used in many cases; therefore, it is preferable that a region of the oxide semiconductor layer, which serves as a channel, be not in contact with the gate insulating film for the above-described reason. In the case where a channel is formed at the interface between a gate insulating film and an oxide semiconductor layer, scattering of carriers occurs at the interface, whereby the field-effect mobility of a transistor is reduced in some cases. Also from the view of the above, it is preferable that a region of the oxide semiconductor layer, which serves as a channel, be separated from the gate insulating film.

Therefore, with the oxide semiconductor stack 130 having a stacked-layer structure including the first oxide semiconductor layer 131, the second oxide semiconductor layer 132, and the third oxide semiconductor layer 133, the second oxide semiconductor layer 132 where a channel of the transistor is formed can be separated from the gate insulating film; accordingly, the transistor can have a high field-effect mobility and stable electrical characteristics.

Next, the band structure of the oxide semiconductor stack 130 is described. A stack corresponding to the oxide semiconductor stack 130 in which an In—Ga—Zn oxide having an energy gap of 3.5 eV is used as a layer corresponding to each of the first oxide semiconductor layer 131 and the third oxide semiconductor layer 133 and an In—Ga—Zn oxide having an energy gap of 3.15 eV is used as a layer corresponding to the second oxide semiconductor layer 132 is fabricated, and the band structure thereof is analyzed. Note that for convenience, the stack is referred to as the oxide semiconductor stack 130, and the layers forming the stack are referred to as the first oxide semiconductor layer 131, the second oxide semiconductor layer 132, and the third oxide semiconductor layer 133.

The thickness of each of the first oxide semiconductor layer 131, the second oxide semiconductor layer 132, and the third oxide semiconductor layer 133 was 10 nm. The energy gap was measured with the use of a spectroscopic ellipsometer (UT-300 manufactured by HORIBA Jobin Yvon). Further, the energy difference between the vacuum level and the top of the valence band was measured using an ultraviolet photoelectron spectroscopy (UPS) device (VersaProbe, ULVAC-PHI, Inc.).

FIG. 2A schematically shows part of a band structure of an energy gap (electron affinity) between the vacuum level and the bottom of the conduction band of each layer, which is calculated by subtracting the energy gap of each layer from the energy gap between the vacuum level and the top of the valence band. FIG. 2A is a band diagram showing the case where a silicon oxide film is provided in contact with the first oxide semiconductor layer 131 and the third oxide semiconductor layer 133. Here, By represents energy of the vacuum level, EcI1 and EcI2 represent energy at the bottom of the conduction band of the silicon oxide film, EcS1 represents energy at the bottom of the conduction band of the first oxide semiconductor layer 131, EcS2 represents energy at the bottom of the conduction band of the second oxide semiconductor layer 132, and EcS3 represents energy at the bottom of the conduction band of the third oxide semiconductor layer 133. Further, in forming a transistor, a gate electrode layer (the gate electrode layer 170 in the transistor 100) is to be in contact with a silicon oxide film having EcI2.

As shown in FIG. 2A, the energies of the bottoms of the conduction bands of the first oxide semiconductor layer 131, the second oxide semiconductor layer 132, and the third oxide semiconductor layer 133 are changed continuously. This can be understood also from the fact that the compositions of the first oxide semiconductor layer 131, the second oxide semiconductor layer 132, and the third oxide semiconductor layer 133 are close to one another and oxygen is easily diffused among the first oxide semiconductor layer 131, the second oxide semiconductor layer 132, and the third oxide semiconductor layer 133. Thus, the first oxide semiconductor layer 131, the second oxide semiconductor layer 132, and the third oxide semiconductor layer 133 have a continuous physical property although they are a stack of layers having different compositions. In the drawings in this specification, interfaces between the oxide semiconductor layers of the oxide semiconductor stack are indicated by dotted lines.

The oxide semiconductor stack 130 in which layers containing the same main components are stacked is formed to have not only a simple stacked-layer structure of the layers but also a continuous energy band (here, in particular, a well structure having a U shape in which energies of the bottoms of the conduction bands are changed continuously between layers). In other words, the stacked-layer structure is formed such that there exist no impurities which form a defect level such as a trap center or a recombination center at each interface. If impurities are mixed between the layers of the oxide semiconductor stack, the continuity of the energy band is lost and carriers disappear by a trap or recombination.

In order to form continuous junction, the layers need to be stacked successively without being exposed to the air by using a multi-chamber deposition system (sputtering apparatus) provided with a load lock chamber. It is preferable that each chamber of the sputtering apparatus be able to be evacuated to a high vacuum (to about $1\times10^{-4}$ Pa to $5\times10^{-7}$ Pa) by an adsorption vacuum pump such as a cryopump and that the chamber be able to heat a substrate over which a film is to be deposited to 100° C. or higher, preferably 500° C. or higher, so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evaporation of the chamber but also high purity of a sputtering gas is necessary to obtain a highly purified intrinsic oxide semiconductor. As an oxygen gas or an argon gas used as the sputtering gas, a gas that is highly purified to have a dew point of −40° C. or lower, preferably −80° C. or lower, further preferably −100° C. or lower is used, so that entry of moisture or the like into the oxide semiconductor film can be prevented as much as possible.

Note that FIG. 2A shows the case where EcS1 and EcS3 are similar to each other; however, EcS1 and EcS3 may be different from each other. For example, part of the band structure in the case where EcS1 is higher than EcS3 is shown as in FIG. 2B.

For example, when EcS1 is equal to EcS3, an In—Ga—Zn oxide whose atomic ratio of In to Ga and Zn is 1:3:2, 1:6:4, or 1:9:6 can be used for the first oxide semiconductor layer 131 and the third oxide semiconductor layer 133 and an In—Ga—Zn oxide whose atomic ratio of In to Ga and Zn is 1:1:1 or 3:1:2 can be used for the second oxide semiconductor layer 132. Further, when EcS1 is higher than EcS3, an In—Ga—Zn oxide whose atomic ratio of In to Ga and Zn is 1:6:4 or 1:9:6 can be used for the first oxide semiconductor layer 131, an In—Ga—Zn oxide whose atomic ratio of In to Ga and Zn is 1:1:1 or 3:1:2 can be used for the second oxide semiconductor layer 132, and an In—Ga—Zn oxide whose atomic ratio of In to Ga and Zn is 1:3:2 can be used for the third oxide semiconductor layer 133, for example.

Figure 2B:
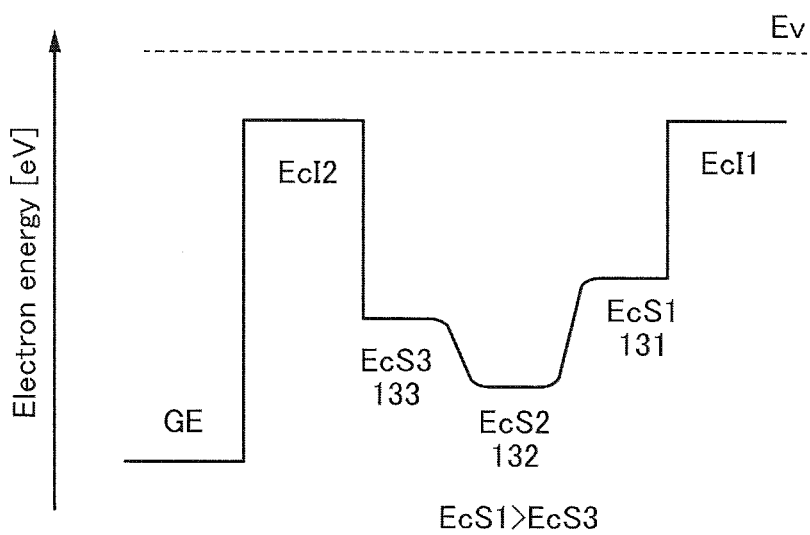

According to FIGS. 2A and 2B, the second oxide semiconductor layer 132 of the oxide semiconductor stack 130 serves as a well, so that a channel is formed in the second oxide semiconductor layer 132 in a transistor including the oxide semiconductor stack 130. Note that since the energies of the bottoms of the conduction bands are changed continuously, the oxide semiconductor stack 130 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 131 and the third oxide semiconductor layer 133. The second oxide semiconductor layer 132 can be distanced away from the trap levels owing to existence of the first oxide semiconductor layer 131 and the third oxide semiconductor layer 133. However, when the energy difference between EcS1 and EcS2 and the energy difference between EcS3 and EcS2 is small, an electron in the second oxide semiconductor layer 132 might reach the trap level by passing over the energy difference. By being trapped in the trap level, a negative fixed charge is caused at the interface with the insulating film, whereby the threshold voltage of the transistor is shifted in the positive direction.

Thus, the energy difference between EcS1 and EcS2 and the energy difference between EcS3 and EcS2 are each preferably greater than or equal to 0.1 eV, further preferably greater than or equal to 0.15 eV, so that the amount of change of the threshold voltage of the transistor is reduced and stable electrical characteristics can be obtained.

Note that at least one of the first oxide semiconductor layer 131, the second oxide semiconductor layer 132, and the third oxide semiconductor layer 133 preferably contains a crystal part. For example, the first oxide semiconductor layer 131 is amorphous, and the second oxide semiconductor layer 132 and the third oxide semiconductor layer 133 each include a crystal part. Since the second oxide semiconductor layer 132 where a channel is formed includes a crystal part, the transistor can have stable electrical characteristics.

In particular, a crystal part included in each of the second oxide semiconductor layer 132 and the third oxide semiconductor layer 133 preferably includes a crystal whose c-axis is aligned in a direction approximately perpendicular to its surface.

In the transistor having the structure in FIGS. 1A to 1C, the third oxide semiconductor layer 133 is in contact with the source electrode layer 140 and the drain electrode layer 150, and it is preferable that the energy gap of the third oxide semiconductor layer 133 be not large like an insulator and the film thickness be small in order that current can be extracted efficiently. Further, in the case where an In—Ga—Zn oxide is used for the oxide semiconductor stack 130, it is preferable that the third oxide semiconductor layer 133 contain less In than the second oxide semiconductor layer 132 so that diffusion of In to the gate insulating film can be prevented.

In order to form a semiconductor device with low power consumption, it is effective to reduce the off-state current of a transistor, in particular, current at the time when a gate voltage is 0 V (also referred to as Icut). However, it is known that miniaturization of a transistor causes deterioration of electrical characteristics of the transistor, such as threshold voltage and an S value (subthreshold value), and a semiconductor device in which both miniaturization and low power consumption are achieved has been desired.

In one embodiment of the present invention, as illustrated in FIG. 3 which is the enlarged cross-sectional view of FIG. 1B, when the thickness of the first region which is part of the first oxide semiconductor layer 131 is $T_{S1}$ and the thickness of the second region which is part of the gate insulating film 160 is $T_{G1}$, $T_{S1}$ is greater than or equal to $T_{G1}$ ($T_{S1} \geq T_{G1}$). Accordingly, the gate electrode layer 170 covers a side surface of the second oxide semiconductor layer 132 with the gate insulating film 160 provided therebetween.

A channel is formed in the second oxide semiconductor layer 132. With a structure in which an electric field is easily applied from the gate electrode layer 170 to the side surface of the second oxide semiconductor layer 132, the electric field is applied to the entire second oxide semiconductor layer 132, so that the threshold voltage and the S value of the transistor can be improved. This structure is especially effective for a transistor having a short channel width; thus, even when the transistor is miniaturized, Icut and power consumption can be lowered. Further, the threshold voltage of the transistor becomes stable; thus, long-term reliability of the semiconductor device can be improved.

In one embodiment of the present invention, it is preferable that, as illustrated in the top view of the transistor of FIG. 1A, the length in the channel width direction of each of the source electrode layer 140 and the drain electrode layer 150 be smaller than that of the oxide semiconductor stack 130, and the source electrode layer 140 and the drain electrode layer 150 cover end portions of the oxide semiconductor stack 130 in the channel length direction. Such a structure can reduce obstruction of electric field application from the gate electrode layer 170 to the side surface of the second oxide semiconductor layer 132, and thus can further improve the threshold voltage and the S value of the above-described transistor in which $T_{S1} \geq T_{G1}$.

Figure 4A:
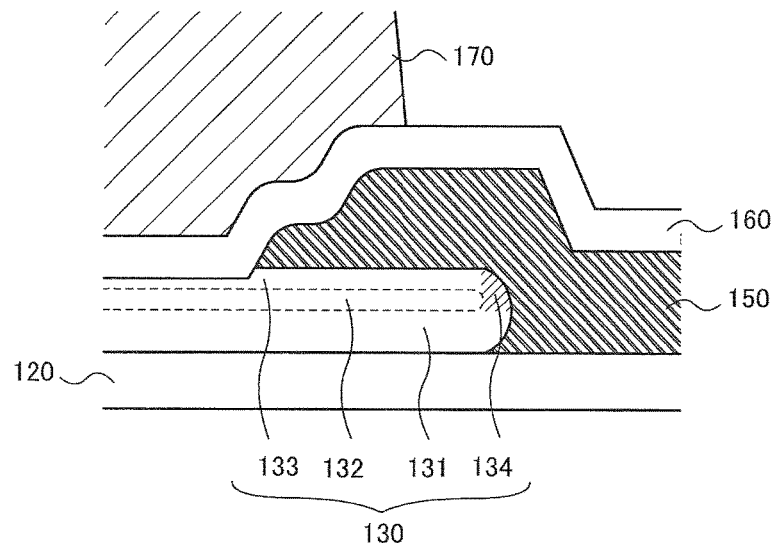
FIGS. 4A and 4B are enlarged cross-sectional views of a transistor.

As illustrated in the enlarged cross-sectional view (part of a cross section in the channel length direction) of the transistor of FIG. 4A, a region 134 having a curved surface may be provided at the end portion of the oxide semiconductor stack 130. In the case where the oxide semiconductor stack 130 is formed using an In-M-Zn oxide (M is Al, Ti, Ga, Y, Zr, La, Ce, Nd, or Hf), the atomic proportion of M ($M_{S4}$) contained in the region 134 is preferably larger than that of M ($M_{S2}$) contained in the second oxide semiconductor layer 132. Further preferably, the atomic proportion of $M_{S4}$ is the same as that of M ($M_{S1}$) contained in the first oxide semiconductor layer 131. With such a structure, the second oxide semiconductor layer 132 can be protected.

The region 134 at the end portion of the oxide semiconductor stack 130 can be formed in such a manner that the components of the first oxide semiconductor layer 131 are attached to the second oxide semiconductor layer 132 and the third oxide semiconductor layer 133 by a dry etching method, i.e. by utilizing what is called a rabbit ear. Further, when the etching gas component attached at the formation of the rabbit ear is removed and the M component is oxidized by oxidation treatment, the insulating property of the region 134 can be improved.

Figure 4B:
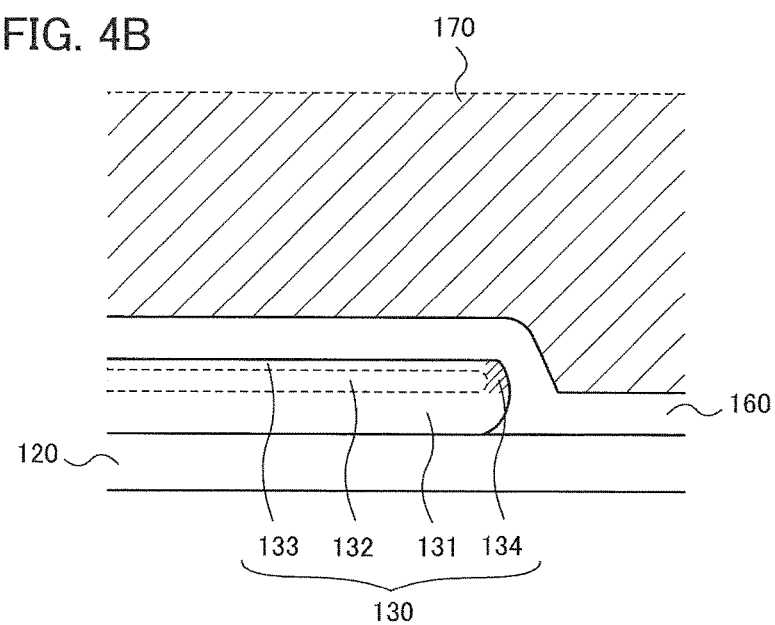

The end portion of oxide semiconductor stack 130 overlapping with the gate electrode layer easily becomes n-type because of mixture of impurities or occurrence of oxygen vacancies due to an external factor, and may become a parasitic channel. In particular, the second oxide semiconductor layer 132 having a small energy gap is likely to be changed to an n-type. Thus, formation of the region 134 as illustrated in the enlarged cross-sectional view (part of a cross section in the channel width direction) of the transistor of FIG. 4B can suppress generation of a parasitic channel.

Figure 5A:
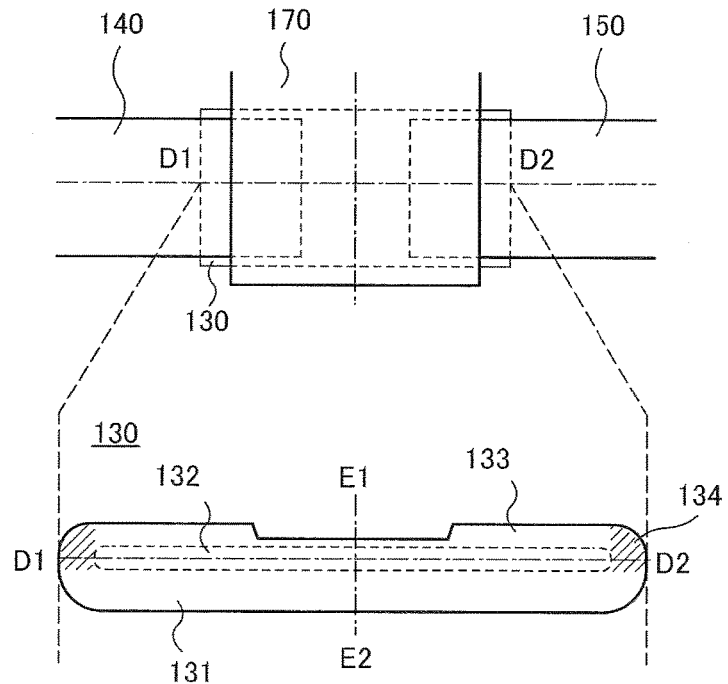
FIG. 5A is a top view and a cross-sectional view of a transistor.

FIG. 5A is a top view of the transistor including the region 134 and a cross-sectional view of the oxide semiconductor stack 130. When the main components of the first oxide semiconductor layer 131 are the same as those of the region 134, the effect of suppressing generation of a parasitic channel can be more enhanced as a difference (ΔE) between energy (EcS2) at the bottom of the conduction band of the second oxide semiconductor layer 132 and energy (EcS4) at the bottom of the conduction band of the region 134 gets larger. Further, the region 134 is preferably thicker than the first oxide semiconductor layer 131 or the third oxide semiconductor layer 133, and generation of a parasitic channel due to change of an end portion of the second oxide semiconductor layer 132 to an n-type can be suppressed as the region 134 gets thicker.

Figure 5B:
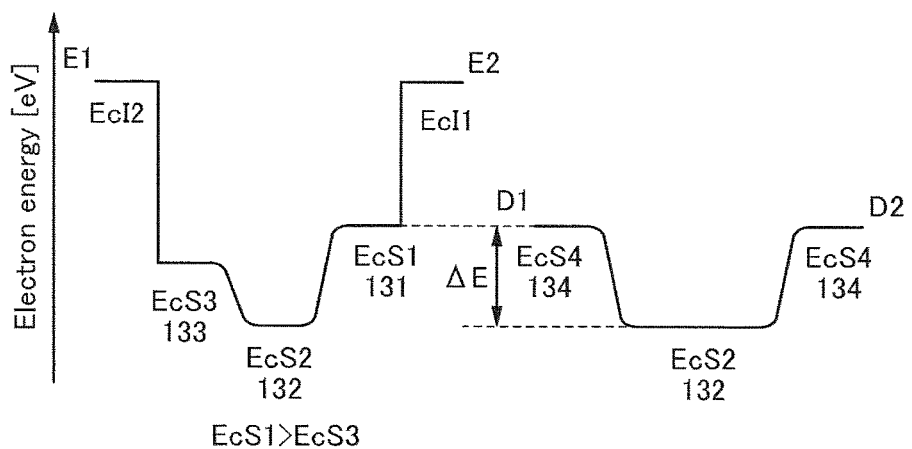
FIG. 5B illustrates a band structure of an oxide semiconductor stack.

When the compositions of the first oxide semiconductor layer 131, the second oxide semiconductor layer 132, and the third oxide semiconductor layer 133 are approximate to one another, in the region 134, the energies at the bottoms of the conduction bands of the oxide semiconductor layers are changed continuously as in FIG. 5B which illustrates part of the band structure of the oxide semiconductor stack 130. That is, it can be said that the first oxide semiconductor layer 131, the second oxide semiconductor layer 132, the third oxide semiconductor layer 133, and the region 134 form continuous junctions. Note that the direction of D1-D2 and the direction of E1-E2 in FIG. 5B corresponds to the direction of a dashed-dotted line D1-D2 and the direction of a dashed-dotted line E1-E2 in the cross-sectional view of the oxide semiconductor stack 130 in FIG. 5A, respectively.

For the source electrode layer 140 and the drain electrode layer 150, a conductive material which is easily bonded to oxygen is preferably used. For example, Al, Cr, Cu, Ta, Ti, Mo, or W can be used. Among the materials, in particular, it is preferable to use Ti which is easily bonded to oxygen or W with a high melting point, which allows subsequent process temperatures to be relatively high. Note that the conductive material which is easily bonded to oxygen includes, in its category, a material to which oxygen is easily diffused.

When the conductive material which is easily bonded to oxygen is in contact with an oxide semiconductor layer, a phenomenon occurs in which oxygen of the oxide semiconductor layer is diffused to the conductive material which is easily bonded to oxygen. The phenomenon noticeably occurs when the temperature is high. Since the fabrication process of the transistor involves some heat treatment steps, the above phenomenon causes generation of oxygen vacancies in a region of the oxide semiconductor layer, which is in contact with the source electrode or the drain electrode, and the region is changed to an n-type. Thus, the n-type region can serve as a source or a drain of the transistor.

Figure 6:
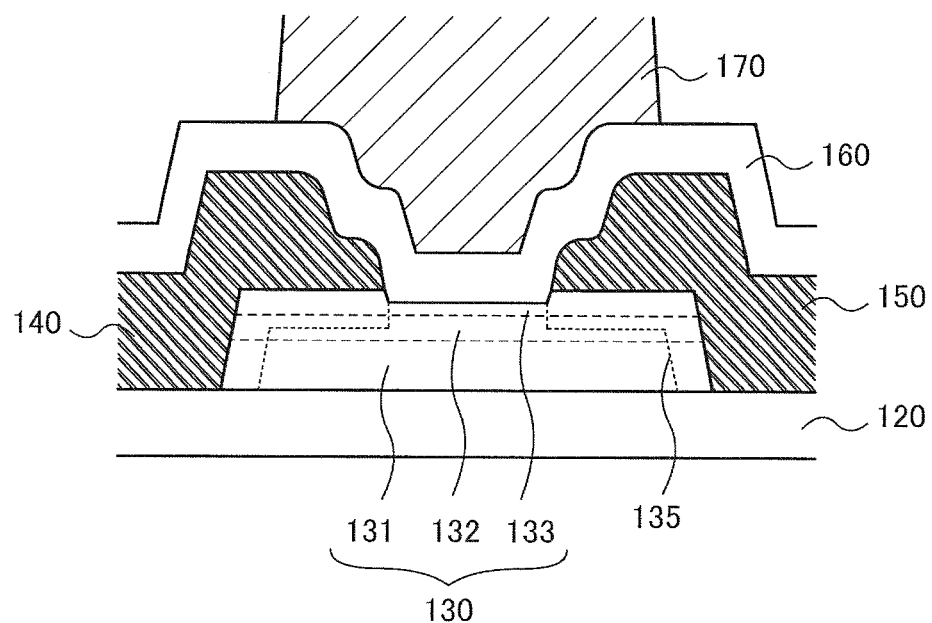
FIG. 6 is an enlarged cross-sectional view of a transistor.

The n-type region is illustrated in the enlarged cross-sectional view (a cross section in the channel width direction) of the transistor of FIG. 6. A boundary 135 indicated by a dotted line in the oxide semiconductor stack 130 is a boundary between an intrinsic semiconductor region and the n-type semiconductor region. In the oxide semiconductor stack 130, a region near and in contact with the source electrode layer 140 or the drain electrode layer 150 becomes the n-type region. The boundary 135 is schematically illustrated here, but actually the boundary is not clearly seen in some cases. Further, the boundary 135 extends in the lateral direction in the second oxide semiconductor layer 132 in FIG. 6; however, the boundary 135 may extend in the lateral direction in the first oxide semiconductor layer 131 or the third oxide semiconductor layer 133. In the oxide semiconductor stack 130, a region sandwiched between the base insulating film 120 and the source electrode layer 140 or between the base insulating film 120 and the drain electrode layer 150 may become n-type entirely in the film thickness direction.

However, in the case of forming a transistor with an extremely short channel length, the n-type region which is formed by the generation of oxygen vacancies sometimes extends in the channel length direction of the transistor. In that case, electrical characteristics of the transistor change; for example, the threshold voltage is shifted or on and off states of the transistor cannot be controlled with the gate voltage (i.e., the transistor is on). Accordingly, when a transistor with an extremely short channel length is formed, it is not always preferable that the conductive material which is easily bonded to oxygen be used for a source electrode layer and a drain electrode layer.

Figure 7A:
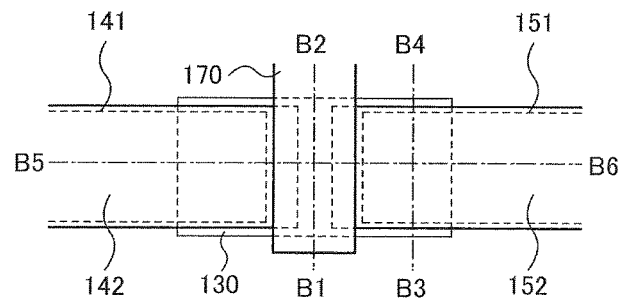
FIGS. 7A to 7D are a top view and cross-sectional views of a transistor.
Figure 7B:
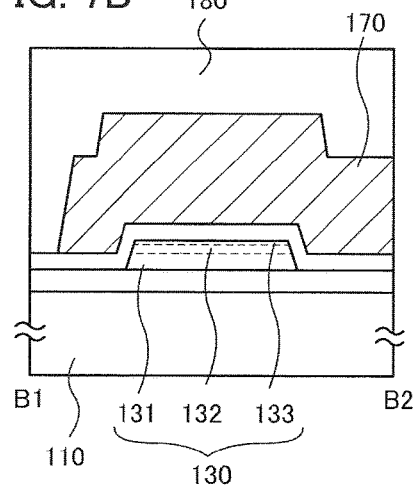
Figure 7C:
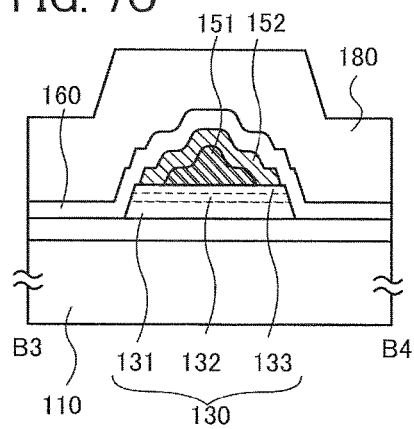
Figure 7D:
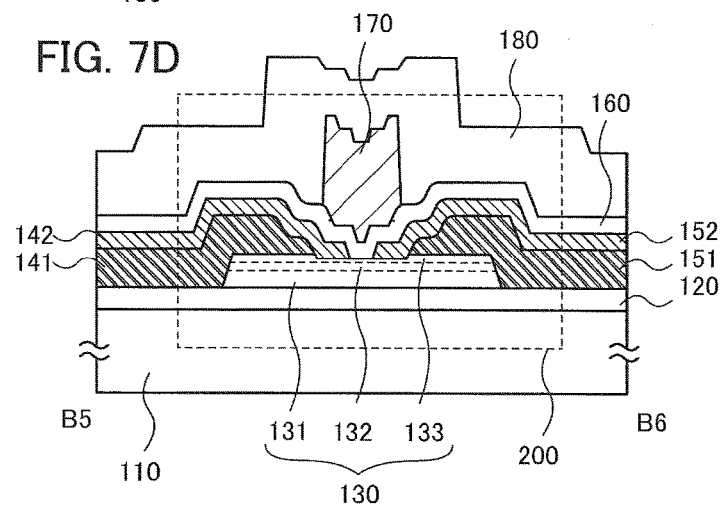

Thus, like a transistor 200 illustrated in FIGS. 7A to 7D, the source electrode layer and the drain electrode layer may each have a stacked-layer structure. FIG. 7A is a top view. FIG. 7B illustrates a cross section taken along a dashed-dotted line B1-B2 in FIG. 7A. FIG. 7C illustrates a cross section taken along a dashed-dotted line B3-B4 in FIG. 7A. FIG. 7D illustrates a cross section taken along a dashed-dotted line B5-B6 in FIG. 7A. In some cases, the direction of the dashed-dotted line B1-B2 is referred to as a channel width direction, and the direction of the dashed-dotted line B5-B6 is referred to as a channel length direction.

A titanium film is used for a first source electrode layer 141 and a first drain electrode layer 151, and a conductive material which is not easily bonded to oxygen is used for a second source electrode layer 142 and a second drain electrode layer 152 which determine the channel length. As the conductive material which is not easily bonded to oxygen, for example, a material containing tantalum nitride, titanium nitride, or ruthenium or the like is preferably used. Note that the conductive material which is not easily bonded to oxygen includes, in its category, a material to which oxygen is not easily diffused.

Note that in the transistor having the structure illustrated in FIGS. 7A to 7C, a channel length refers to a distance between the second source electrode layer 142 and the second drain electrode layer 152.

Further, in the transistor having the structure illustrated in FIGS. 7A to 7C, a channel refers to a region of the second oxide semiconductor layer 132, which is between the second source electrode layer 142 and the second drain electrode layer 152.

Furthermore, in the transistor having the structure illustrated in FIGS. 7A to 7C, a channel formation region refers to a region of the stack of the first oxide semiconductor layer 131, the second oxide semiconductor layer 132, and the third oxide semiconductor layer 133, which is between the second source electrode layer 142 and the second drain electrode layer 152.

By the use of the above conductive material which is not easily bonded to oxygen for the second source electrode layer 142 and the second drain electrode layer 152, generation of oxygen vacancies in the channel formation region of the oxide semiconductor stack 130 can be suppressed, so that change of the channel to an n-type can be suppressed. In this manner, even a transistor with an extremely short channel length can have favorable electrical characteristics.

In the case where the source electrode layer and the drain electrode layer are formed using only the above conductive material which is not easily bonded to oxygen, the contact resistance with the oxide semiconductor stack 130 becomes too high; thus, it is preferable that as illustrated in FIG. 7C, the first source electrode layer 141 and the first drain electrode layer 151 be formed over the oxide semiconductor stack 130 and the second source electrode layer 142 and the second drain electrode layer 152 be formed so as to cover the first source electrode layer 141 and the first drain electrode layer 151.

At this time, it is preferable that the oxide semiconductor stack 130 have a large contact area with the first source electrode layer 141 or the first drain electrode layer 151, and the oxide semiconductor stack 130 have a small contact area with the second source electrode layer 142 or the second drain electrode layer 152. The region of the oxide semiconductor stack 130, which is in contact with the first source electrode layer 141 or the first drain electrode layer 151, is changed to an n-type region due to generation of oxygen vacancies. Owing to the n-type region, the contact resistance between the oxide semiconductor stack 130 and the first source electrode layer 141 or the first drain electrode layer 151 can be reduced. Accordingly, when the oxide semiconductor stack 130 has a large contact area with the first source electrode layer 141 or the first drain electrode layer 151, the area of the n-type region can also be large.

Note that the oxide semiconductor stack 130 does not necessary have a large contact area with the first source electrode layer 141 or the first drain electrode layer 151 in the case where a nitride such as tantalum nitride or titanium nitride is used for the second source electrode layer 142 and the second drain electrode layer 152. This is because when nitrogen in the nitride is slightly diffused to a region of the oxide semiconductor stack 130 which is close to the interface with the second source electrode layer 142 and the second drain electrode layer 152, nitrogen acts as a donor and forms an n-type region in the oxide semiconductor stack 130; accordingly, the contact resistance between the oxide semiconductor stack 130 and the second source electrode layer 142 or the second drain electrode layer 152 can be reduced.

The distance between the first source electrode layer 141 and the first drain electrode layer 151 is set to 0.8 µm or longer, preferably 1.0 µm or longer. In the case where the distance is shorter than 0.8 µm, influence of oxygen vacancies generated in the channel formation region cannot be eliminated, which causes deterioration of the electrical characteristics of the transistor.

Even when the distance between the second source electrode layer 142 and the second drain electrode layer 152 is, for example, 30 nm or shorter, the transistor can have favorable electrical characteristics.

Further, it is preferable to employ a structure in which a gate electrode layer does not overlap with a source electrode layer or a drain electrode layer as much as possible in order to make small parasitic capacitance which is caused between a gate and a drain and between the gate and a source, which enables the frequency characteristics of a semiconductor device to be improved.

Furthermore, end portions of the source electrode layer 140 and the drain electrode layer 150 of the transistor 100 and end portions of the first source electrode layer 141 and the first drain electrode layer 151 of the transistor 200 preferably have staircase-like shapes including a plurality of steps. With such shapes including a plurality of steps, coverage with the films formed over the source electrode layer 140 and the drain electrode layer 150, or the first source electrode layer 141 and the first drain electrode layer 151 can be improved, whereby the electrical characteristics and long-term reliability of the transistor can be improved.

Figure 31A:
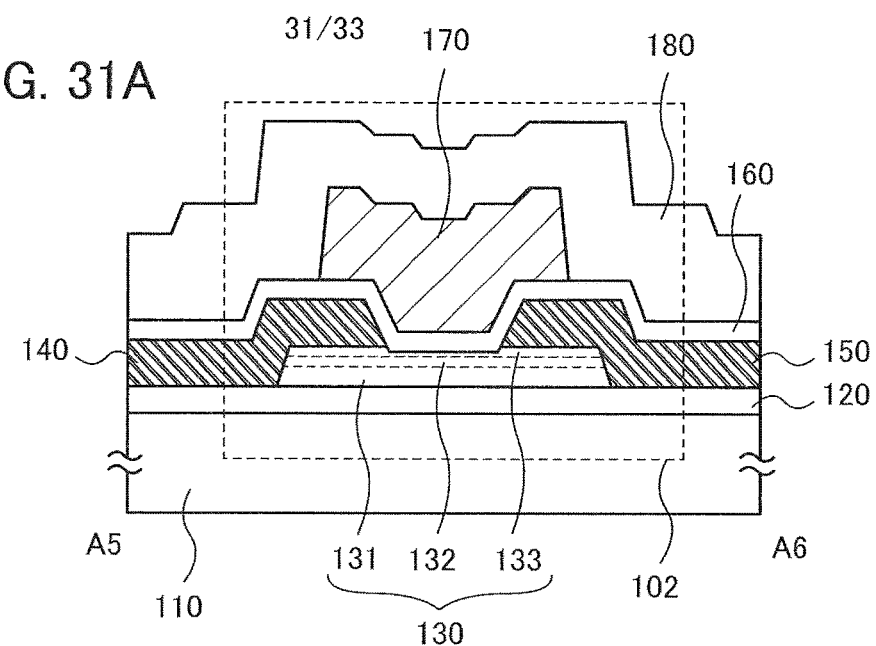
FIGS. 31A and 31B are cross-sectional views each illustrating shapes of a source electrode and a drain electrode of a transistor.
Figure 31B:
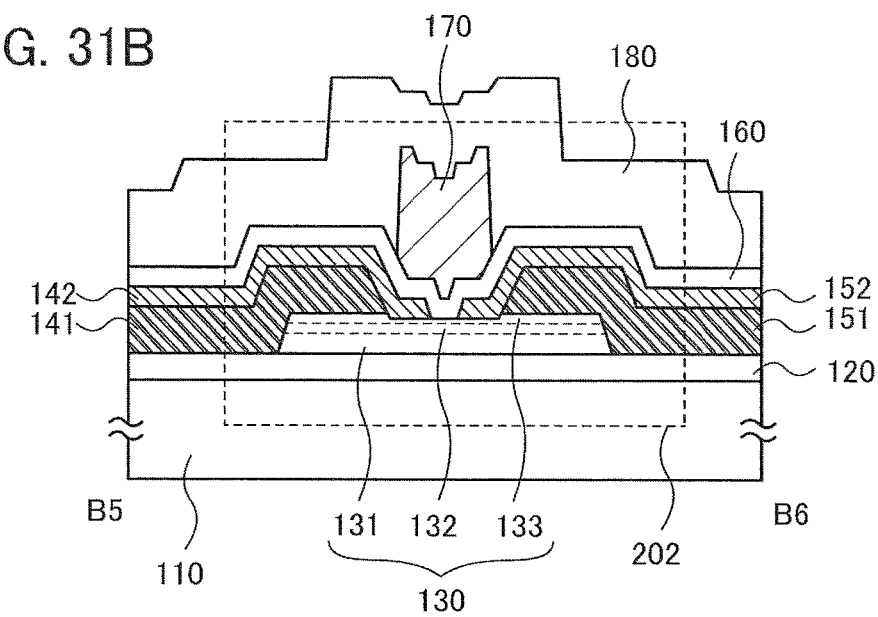

As illustrated in FIGS. 31A and 31B, the end portions of the source electrode layer 140 and the drain electrode layer 150 of a transistor 102 and the end portions of the first source electrode layer 141 and the first drain electrode layer 151 of a transistor 202 each does not have to have a staircase-like shape.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack of any of the above materials.

For the gate electrode layer 170, a conductive film formed using Al, Ti, Cr, Co, Ni, Cu, Y, Zr, Mo, Ru, Ag, Ta, W, or the like can be used. The gate electrode layer may be a stack of any of the above materials.

The oxide insulating layer 180 may be formed over the gate insulating film 160 and the gate electrode layer 170. The oxide insulating layer 180 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer 180 may be a stack of any of the above materials.

Here, the oxide insulating layer 180 preferably contains excess oxygen. An oxide insulating layer containing excess oxygen refers to an oxide insulating layer from which oxygen can be released by heat treatment or the like. The oxide insulating layer containing excess oxygen is preferably a film in which the amount of released oxygen when converted into oxygen atoms is $1.0 \times 10^{19}$ atoms/cm$^3$ or more in thermal desorption spectroscopy analysis. Oxygen released from the oxide insulating layer 180 can be diffused to a channel formation region of the oxide semiconductor stack 130 through the gate insulating film 160, so that oxygen vacancies which are undesirably formed can be filled with the oxygen. In this manner, stable electrical characteristics of the transistor can be achieved.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

(Embodiment 2)

In this embodiment, the results of simulation of the structure of the transistor of one embodiment of the present invention which is described in Embodiment 1 are described.

Figure 8A:
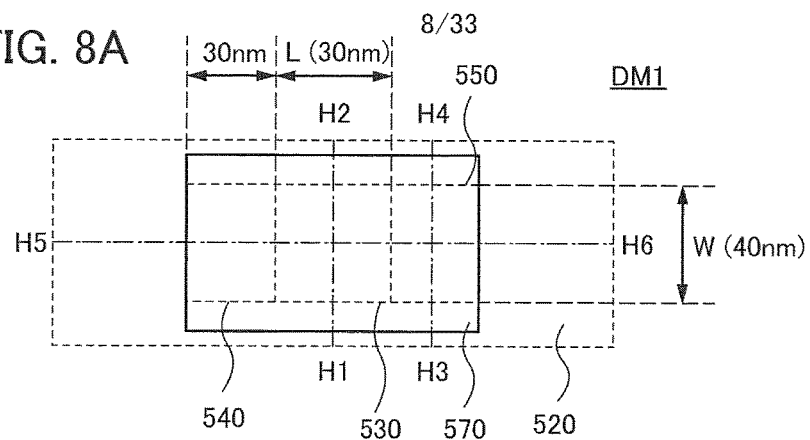
FIGS. 8A to 8D are a top view and cross-sectional views of a model used for device simulation.
Figure 8B:
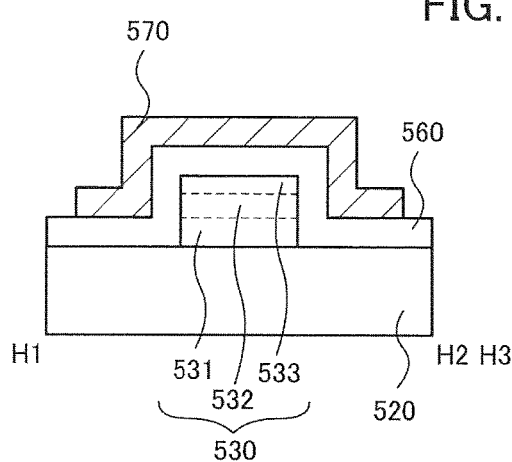
Figure 8C:
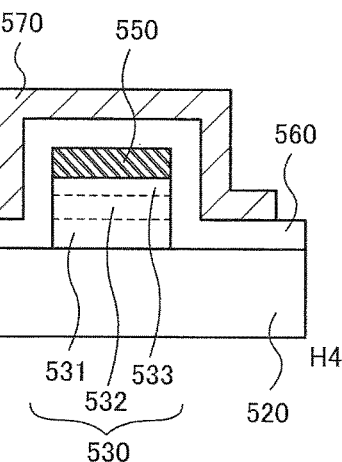
Figure 8D:
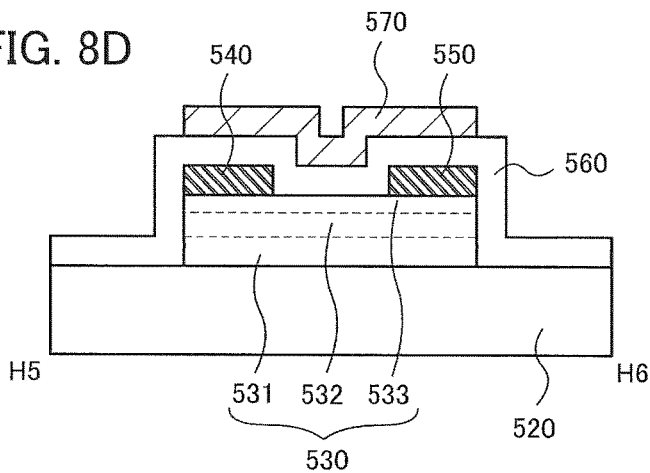
Figure 9A:
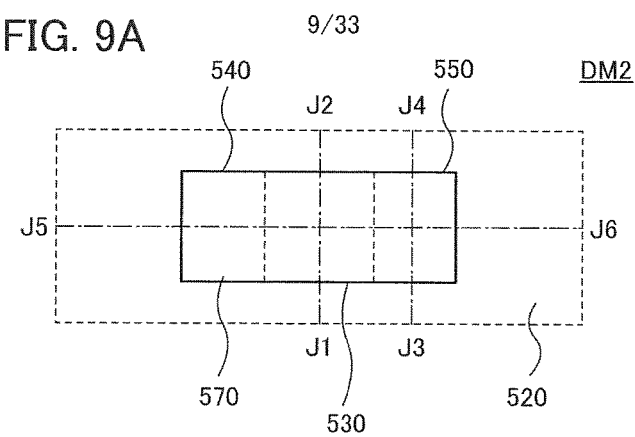
FIGS. 9A to 9D are a top view and cross-sectional views of a model used for device simulation.
Figures 9B, 9C:
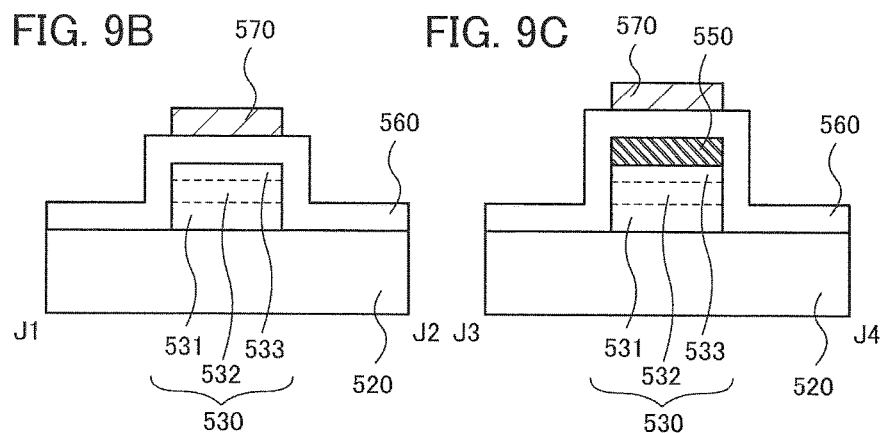
Figure 9D:
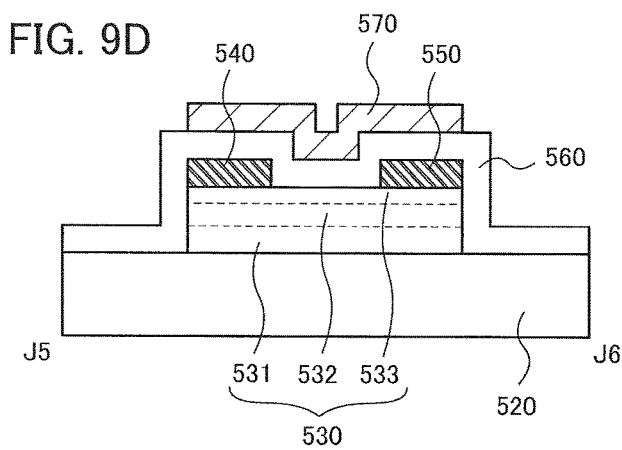

FIGS. 8A to 8D, FIGS. 9A to 9D, FIGS. 10A to 10D, and FIGS. 11A to 11D illustrate device models used for first simulation. FIG. 8A is a top view. FIG. 8B illustrates a cross section taken along a dashed-dotted line H1-H2 in FIG. 8A. FIG. 8C illustrates a cross section taken along a dashed-dotted line H3-H4 in FIG. 8A. FIG. 8D illustrates a cross section taken along a dashed-dotted line H5-H6 in FIG. 8A. FIG. 9A is a top view. FIG. 9B illustrates a cross section taken along a dashed-dotted line J1-J2 in FIG. 9A. FIG. 9C illustrates a cross section taken along a dashed-dotted line J3-J4 in FIG. 9A. FIG. 9D illustrates a cross section taken along a dashed-dotted line J5-J6 in FIG. 9A. FIG. 10A is a top view. FIG. 10B illustrates a cross section taken along a dashed-dotted line K1-K2 in FIG. 10A. FIG. 10C illustrates a cross section taken along a dashed-dotted line K3-K4 in FIG. 10A. FIG. 10D illustrates a cross section taken along a dashed-dotted line K5-K6 in FIG. 10A. FIG. 11A is a top view. FIG. 11B illustrates a cross section taken along a dashed-dotted line M1-M2 in FIG. 11A. FIG. 11C illustrates a cross section taken along a dashed-dotted line M3-M4 in FIG. 11A. FIG. 11D illustrates a cross section taken along a dashed-dotted line M5-M6 in FIG. 11A. In some cases, the direction of each of the dashed-dotted lines H1-H2, J1-J2, K1-K2, and M1-M2 is referred to as a channel width direction, and the direction of each of the dashed-dotted lines H5-H6, J5-J6, K5-K6, and M5-M6 is referred to as a channel length direction.

A device model 1 (hereinafter, DM1) illustrated in FIGS. 8A to 8D includes, over a base insulating film 520, an oxide semiconductor stack 530 including a first oxide semiconductor layer 531, a second oxide semiconductor layer 532, and a third oxide semiconductor layer 533, a source electrode layer 540, a drain electrode layer 550, a gate insulating film 560, and a gate electrode layer 570. The gate electrode layer 570 covers an end portion of the oxide semiconductor stack 530 in the channel width direction.

In DM1, the channel length L and the channel width W of the transistor are 30 nm and 40 nm, respectively; the length of a region where the source electrode layer 540 or the drain electrode layer 550 overlaps with the oxide semiconductor stack 530 in the channel length direction is 30 nm; the thickness of the base insulating film 520 is 300 nm; the dielectric constant of the gate insulating film 560 is 4.1; the thickness of the gate insulating film 560 is 20 nm; the work function of the gate electrode layer is 4.9 eV; and the work function of each of the source electrode layer 540 and the drain electrode layer 550 is 4.4 eV. The atomic ratios (In:Ga:Zn) of In—Ga—Zn oxides used for the first oxide semiconductor layer 531 (S1), the second oxide semiconductor layer 532 (S2), and the third oxide semiconductor layer 533 (S3) and values used for the simulation are shown in Table 1. For the simulation, software Sentaurus Device manufactured by Synopsys, Inc. is used. Fixed charge, electron traps, and the like localized in the layers or at the interface of the layers are not considered.

TABLE 1

|  | atomic ratios | electron affinity [eV] | Eg [eV] | dielectric constant | Nd [cm$^{-3}$] | electron mobility [cm$^2$/Vs] | hole mobility [cm$^2$/Vs] | film thickness [nm] |
|---|---|---|---|---|---|---|---|---|
| S1 | 1:3:2 | 4.4 | 3.4 | 15 | 1.00E+13 | 2 | 0.1 | 20 |
| S2 | 1:1:1 | 4.6 | 3.15 | 15 | 1.00E+13 | 10 | 0.1 | 15 |
| S3 | 1:3:2 | 4.4 | 3.4 | 15 | 1.00E+13 | 2 | 0.1 | 5 |

In a device model 2 (hereinafter, DM2) illustrated in FIGS. 9A to 9D, the shape of the gate electrode layer 570 is different from that in DM1. In the channel width direction, the gate electrode layer 570 does not cover an end portion of the oxide semiconductor stack 530. That is, the top shape of the gate electrode layer 570 is the same as that of the oxide semiconductor stack 530. The other conditions are the same as those in DM1.

In a device model 3 (hereinafter, DM3) illustrated in FIGS. 10A to 10D, an oxide semiconductor layer 580 is a single layer having the same conditions as those of S2 shown in Table 1, and the other conditions are the same as those of DM1 (a structure in which the gate electrode layer 570 covers an end portion of the oxide semiconductor stack 530 in the channel width direction).

In a device model 4 (hereinafter, DM4) illustrated in FIGS. 11A to 11D, the oxide semiconductor layer 580 is a single layer having the same conditions as those of S2 in Table 1, and the other conditions are the same as those of DM2 (a structure in which the gate electrode layer 570 does not cover an end portion of the oxide semiconductor stack 530 in the channel width direction).

Figure 12A:
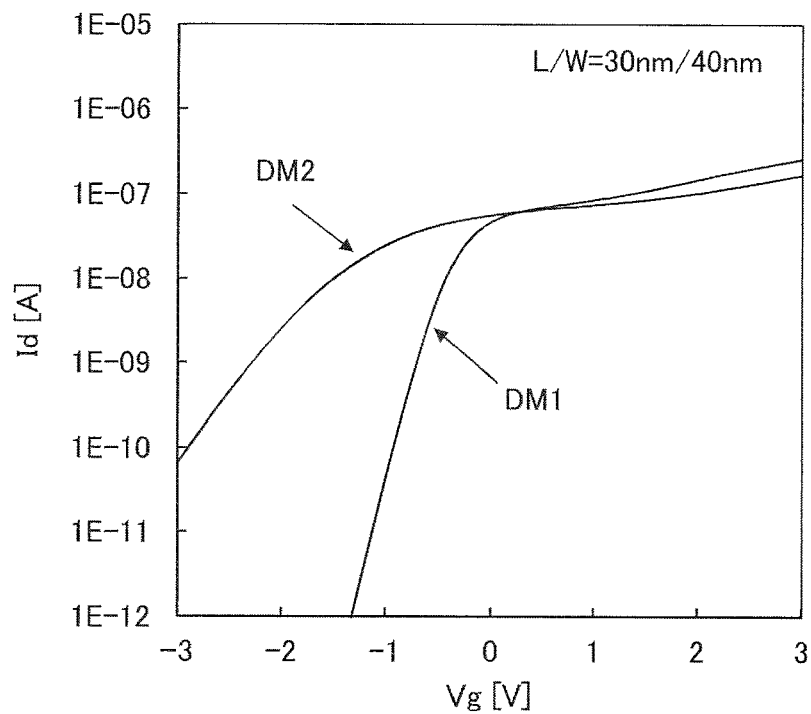
FIGS. 12A and 12B show the results of device simulation.
Figure 12B:
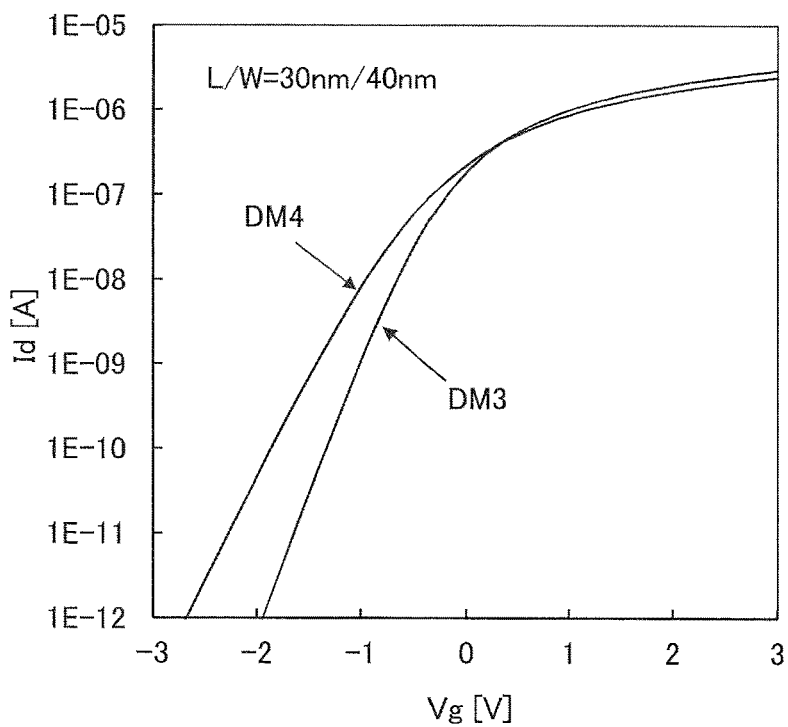

FIGS. 12A and 12B show Id-Vg characteristics obtained by the simulation using the device models having the above conditions (DM1, DM2, DM3, and DM4).

When DM1 and DM2 in each of which the oxide semiconductor stack has a stacked-layer structure are compared, DM1 in which the gate electrode layer 570 covers the end portion of the oxide semiconductor stack 530 in the channel width direction has better characteristics than DM2 (see FIG. 12A). When DM3 and DM4 in each of which the single oxide semiconductor layer is formed are compared, DM3 in which the gate electrode layer 570 covers an end portion of the oxide semiconductor layer 580 in the channel width direction has better characteristics than DM4 (see FIG. 12B). Here, when DM1 and DM3 are compared, DM1 has better S value and threshold voltage than DM3. Thus, for the purpose of reduction in Icut, the structure of DM1, that is, a structure in which an oxide semiconductor stack has a stacked layer structure and a gate electrode layer covers an end portion of the oxide semiconductor layer in the channel width direction is advantageous.

This is because, in DM1, the thickness of part of the first oxide semiconductor layer 531 is set to be the same as that of part of the gate insulating film 560. In this case, the relative position of the second oxide semiconductor layer 532 in which a channel is formed is higher in the oxide semiconductor stack 530. Accordingly, an end portion of the second oxide semiconductor layer 532 is covered with the gate electrode layer 570 with the gate insulating film 560 provided therebetween. Thus, an electric field is easily applied from the gate electrode layer 570 to the entire second oxide semiconductor layer 532. In contrast, in DM2, DM3, and DM4, the end portions of the oxide semiconductor stack 530 and the oxide semiconductor layer 580 are not covered with the gate electrode layer 570 with the gate insulating film 560 provided therebetween. Thus, DM2, DM3, and DM4 have poor Id-Vg characteristics.

The results of the first simulation show that a structure in which an oxide semiconductor layer has a stacked layer structure and the position of a layer in which a channel is formed is relatively high in the stacked layer so that an electric field is easily applied to the layer in which a channel is formed also in the lateral direction is effective. Specifically, the thickness of part of a layer positioned below the layer in which a channel is formed is the same as or greater than that of part of the gate insulating film, and a gate electrode layer is formed to cover an end portion of the oxide semiconductor layer.

Figure 13A:
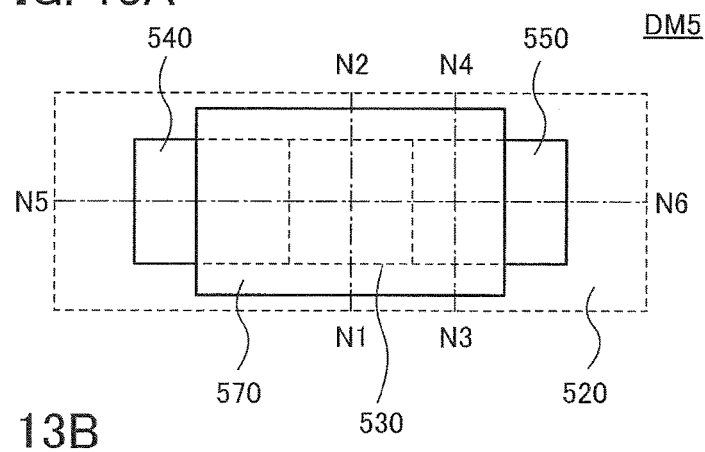
FIGS. 13A to 13D are a top view and cross-sectional views of a model used for device simulation.
Figure 13B:
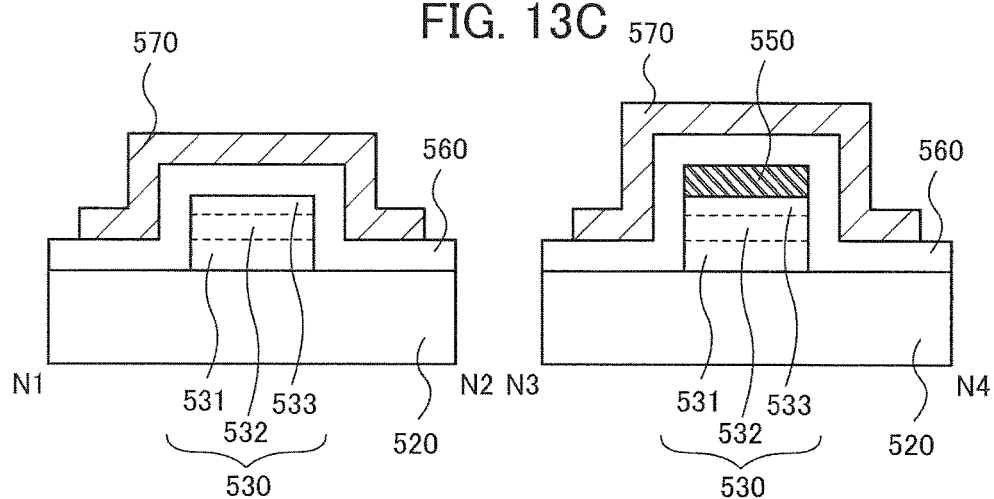
Figure 13C:
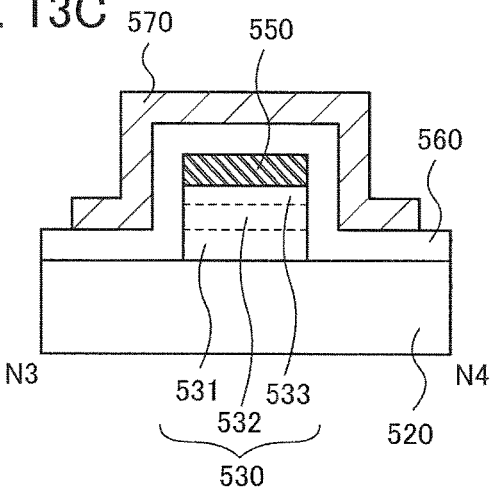
Figure 13D:
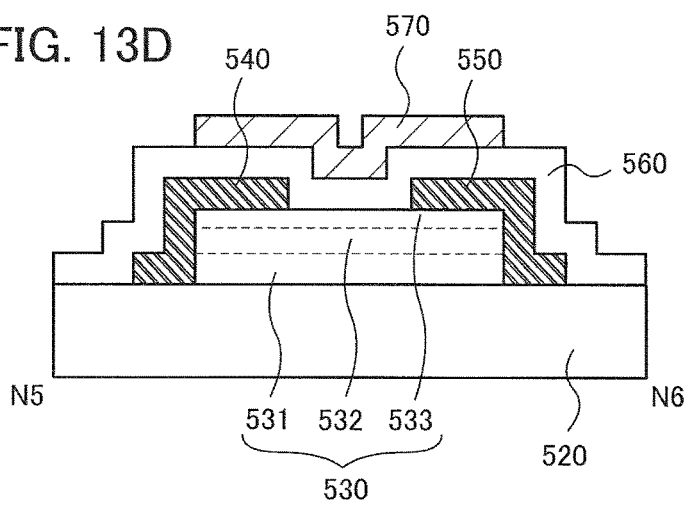

FIGS. 13A to 13D and FIGS. 14A to 14D illustrate device models used for second simulation. FIG. 13A is a top view. FIG. 13B illustrates a cross section taken along a dashed-dotted line N1-N2 in FIG. 13A. FIG. 13C illustrates a cross section taken along a dashed-dotted line N3-N4 in FIG. 13A. FIG. 13D illustrates a cross section taken along a dashed-dotted line N5-N6 in FIG. 13A. FIG. 14A is a top view. FIG. 14B illustrates a cross section taken along a dashed-dotted line P1-P2 in FIG. 14A. FIG. 14C illustrates a cross section taken along a dashed-dotted line P3-P4 in FIG. 14A. FIG. 14D illustrates a cross section taken along a dashed-dotted line P5-P6 in FIG. 14A. In some cases, the direction of each of the dashed-dotted lines N1-N2 and P1-P2 is referred to as a channel width direction, and the direction of each of the dashed-dotted lines N5-N6 and P5-P6 is referred to as a channel length direction.

In a device model 5 (hereinafter, DM5) illustrated in FIGS. 13A to 13D, the shape of the source electrode layer 540 or the drain electrode layer 550 is different from that in DM1. The source electrode layer 540 or the drain electrode layer 550 covers an end portion of the oxide semiconductor stack 530 in the channel length direction. The other conditions are the same as those in DM1.

In a device model 6 (hereinafter, DM6) illustrated in FIGS. 14A to 14D, the shape of the source electrode layer 540 or the drain electrode layer 550 is different from that in DM1. The source electrode layer 540 or the drain electrode layer 550 covers an end portion of the oxide semiconductor stack 530 in the channel length direction and part of the end portion of the oxide semiconductor stack 530 in the channel width direction. The other conditions are the same as those in DM1. That is, DM6 is different from DM5 in that the source electrode layer 540 or the drain electrode layer 550 covers the part of the end portion of the oxide semiconductor stack 530 in the channel width direction.

Figure 15:
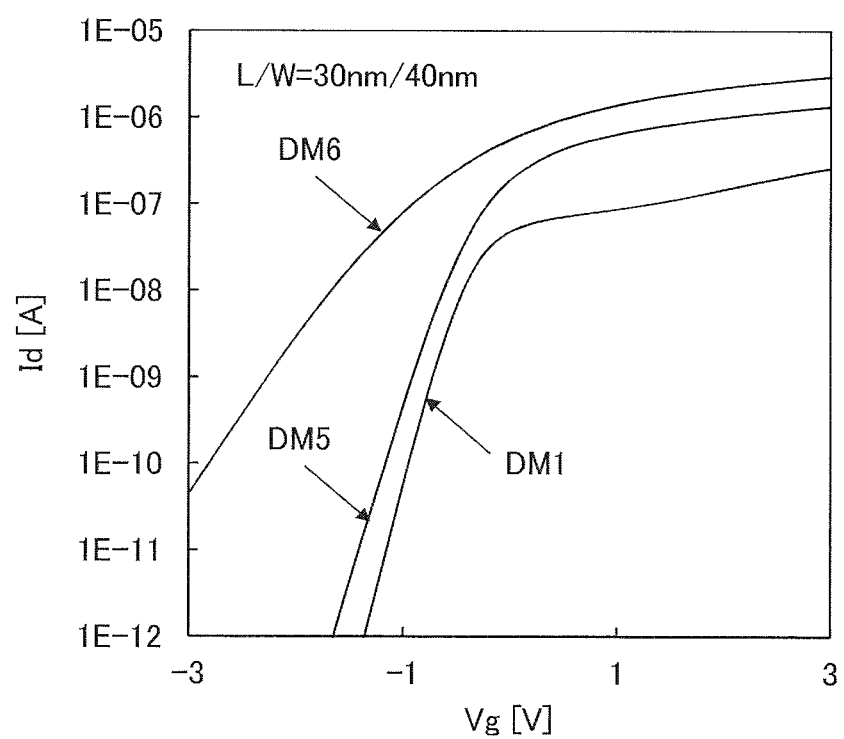
FIG. 15 shows the results of device simulation.

FIG. 15 shows Id-Vg characteristics obtained by the simulation using the device models having the above conditions (DM1, DM5, and DM6). In FIG. 15, DM5 in which the source electrode layer 540 or the drain electrode layer 550 does not cover the end portion of the oxide semiconductor stack 530 in the channel width direction has better characteristics than DM6. As compared to DM1, although DM5 has threshold voltage on a slightly more negative side, DM5 has an equivalent S value and high on-state current. Thus, for the purpose of improvement of characteristics including on-state current, the structure of DM5, that is, a structure in which a source electrode layer or a drain electrode layer covers an end portion of an oxide semiconductor layer in the channel length direction and does not cover an end portion of an oxide semiconductor layer in the channel width direction is preferable.

This is because, when the source electrode layer 540 or the drain electrode layer 550 covers the end portion of the oxide semiconductor stack 530 in the channel width direction, part of an electric field from the gate electrode layer 570 is blocked, so that the electric field is unlikely to be applied to the oxide semiconductor stack 530, especially the second oxide semiconductor layer 532 in which a channel is formed.

Thus, from the results of the second simulation, it is found that a structure in which an oxide semiconductor layer has a stacked layer structure and application of an electric field from a gate electrode layer to a layer in which a channel is formed is not blocked is effective. Specifically, a structure in which a source electrode layer or a drain electrode layer covers an end portion of an oxide semiconductor layer in the channel length direction and does not cover an end portion of the oxide semiconductor layer in the channel width direction may be used. In other words, the structure is a structure in which the length of the source electrode layer or the drain electrode layer in the channel width direction is the same as or smaller than that of the oxide semiconductor layer in the channel width direction.

Next, third simulation of a channel width of a transistor is performed using a device model having a structure based on DM5. In the device model for the third simulation, the length of the oxide semiconductor stack 530 in the channel width direction is the same as that of a source electrode layer or a drain electrode layer in the channel width direction, and the length is defined as a channel width. In the third simulation, the channel width is 300 nm, 40 nm, 30 nm, and 10 nm. The other conditions are the same as those in DM5.

Figure 16:
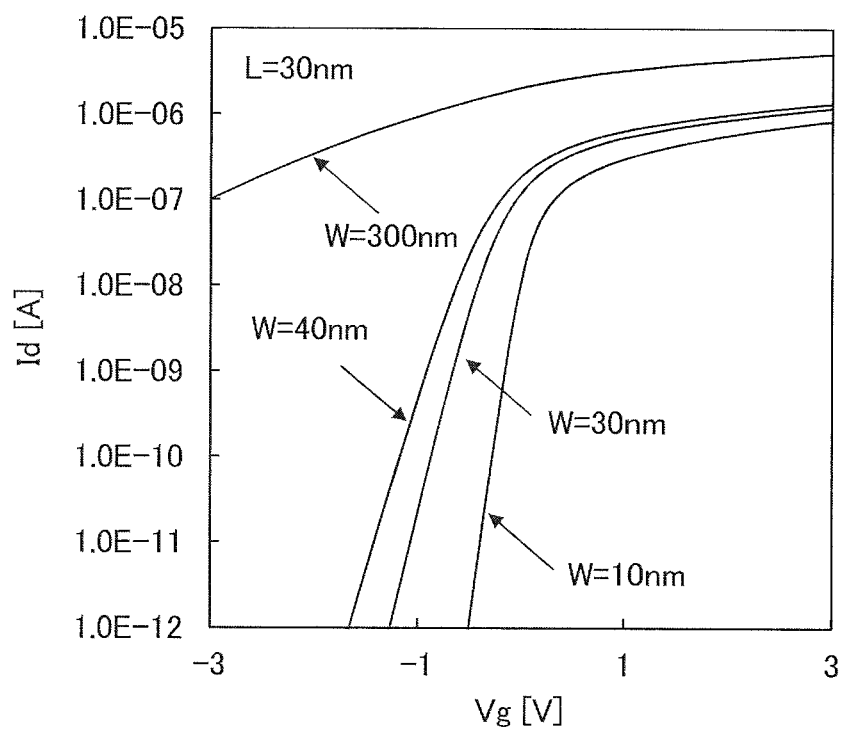
FIG. 16 shows the results of device simulation.

FIG. 16 shows Id-Vg characteristics obtained by the simulation using the device models having the above conditions. The off-state characteristics are extremely poor when the channel width is 300 nm. Meanwhile, the S value is markedly improved when the channel width is smaller than or equal to 40 nm.

Figure 33A:
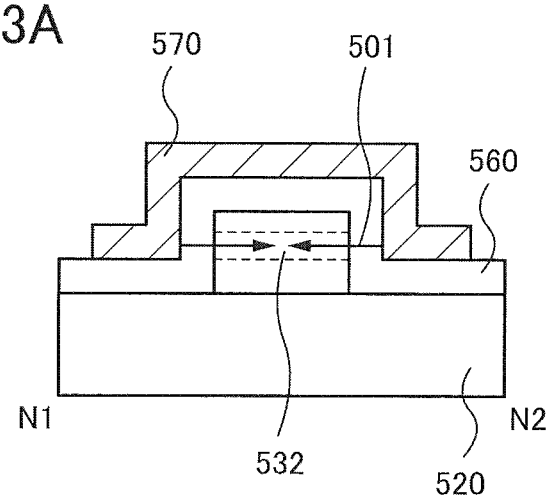
FIGS. 33A and 33B show the results of device simulation.
Figure 33B:
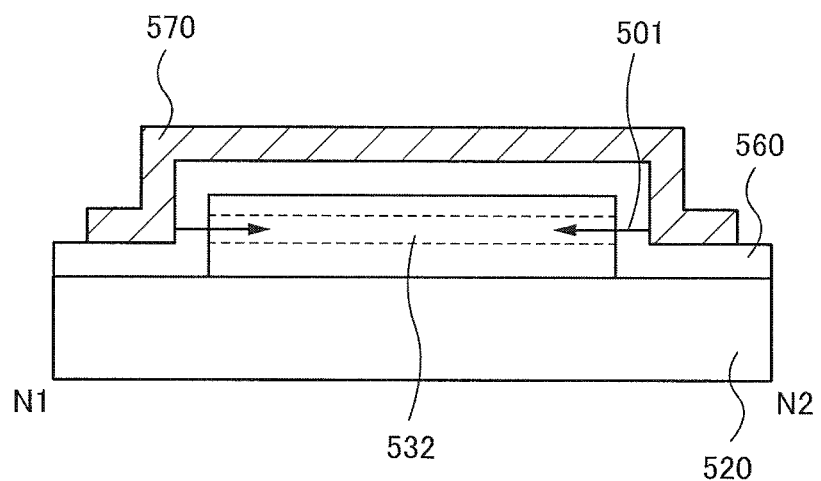

This is because the influence of application of an electric field from a side surface of the second oxide semiconductor layer 532 on a region of the second oxide semiconductor layer 532 in which a channel is formed is large when the channel width is small. FIGS. 33A and 33B illustrate cross-sectional views in the channel width direction of DM5 corresponding to FIG. 13B. In FIGS. 33A and 33B, the intensity of the electric field applied to the second oxide semiconductor layer 532 in the lateral direction is schematically represented by vectors. When the channel width is small, the electric field applied in the lateral direction to the second oxide semiconductor layer 532 affects the entire channel as illustrated in FIG. 33A, whereas when the channel width is large, the electric field does not affect the entire channel as illustrated in FIG. 33B. Thus, the structure of DM5 is more advantageous in the case of a transistor having a small channel width.

Next, fourth simulation of the thickness of the second oxide semiconductor layer 532 included in the oxide semiconductor stack 530 is performed using a device model having a structure based on DM5. In the fourth simulation, for a device model having a channel length of 30 nm and a channel width of 40 nm, the thickness of the second oxide semiconductor layer 532 is 5 nm to 90 nm. For a device model having a channel length of 30 nm and a channel width of 300 nm, the thickness of the second oxide semiconductor layer 532 is 5 nm to 50 nm. The other conditions are the same as those in DM5.

Figure 17A:
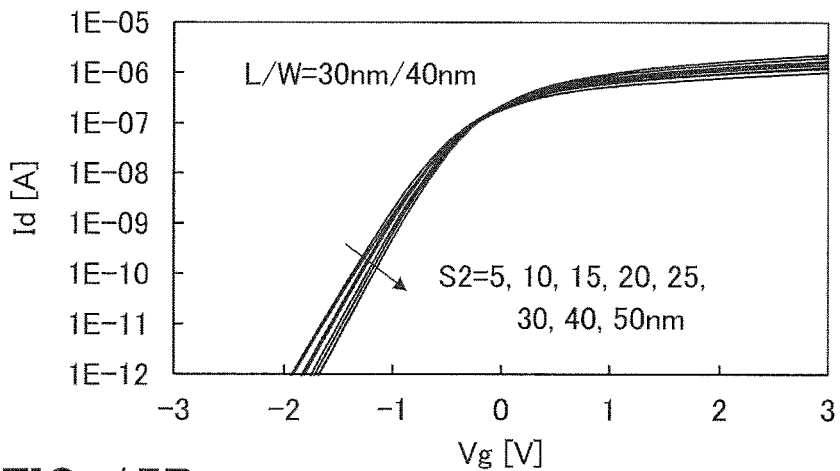
FIGS. 17A to 17C show the results of device simulation.
Figure 17B:
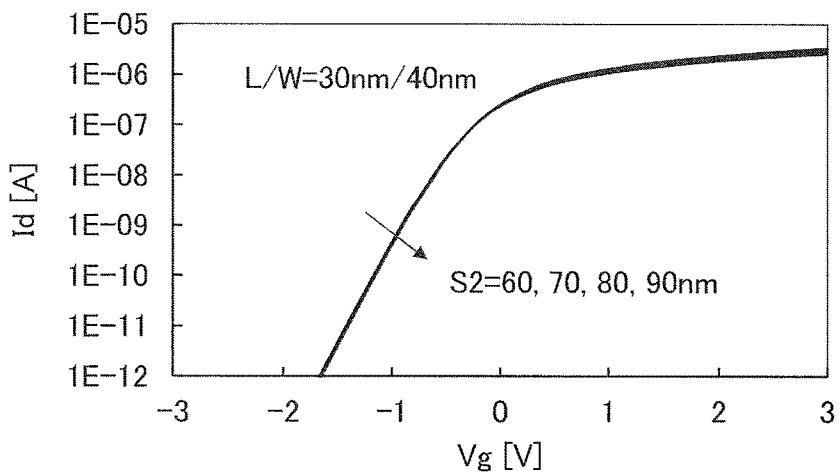
Figure 17C:
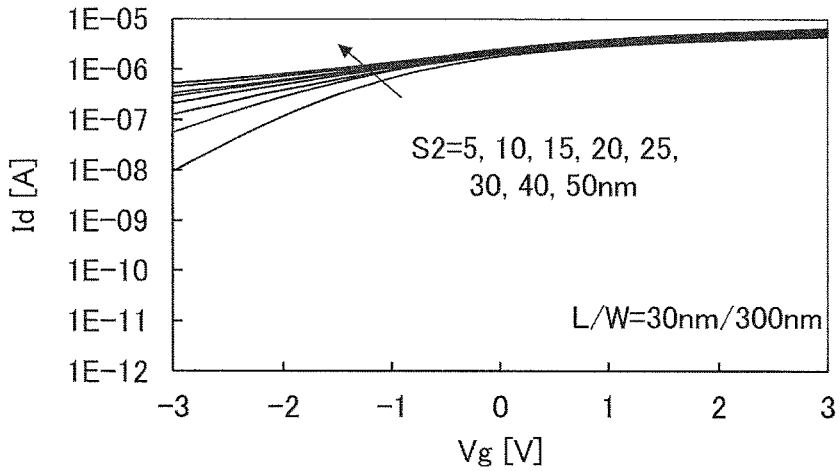

FIGS. 17A to 17C show Id-Vg characteristics obtained by the simulation using the device models having the above conditions. FIGS. 17A and 17B show the results of simulation of Id-Vg characteristics of the device model having a channel length of 30 nm and a channel width of 40 nm. FIG. 17A shows the results of the cases where the thicknesses of the second oxide semiconductor layer 532 are 5 nm, 10 nm, 15 nm, 20 nm, 25 nm, 30 nm, 40 nm, and 50 nm. FIG. 17B shows the results of the cases where the thicknesses of the second oxide semiconductor layer 532 are 60 nm, 70 nm, 80 nm, and 90 nm. FIG. 17C shows the results of simulation of Id-Vg characteristics of the device model having a channel length of 30 nm and a channel width of 300 nm. FIG. 17C shows the results of the cases where the thicknesses of the second oxide semiconductor layer 532 are 5 nm, 10 nm, 15 nm, 20 nm, 25 nm, 30 nm, 40 nm, and 50 nm. In each view, the thickness is sequentially increased from a starting point to an end point of an arrow.

As shown in FIG. 17A, in the device model having a channel length of 30 nm and a channel width of 40 nm, as the thickness of the second oxide semiconductor layer 532 is increased to about 50 nm, the S value and the on-state current are improved. As shown in FIG. 17B, when the thickness of the second oxide semiconductor layer 532 is greater than or equal to 60 nm, the S value and the threshold voltage are hardly changed, and only the on-state current is increased as the thickness is increased.

In contrast, as shown in FIG. 17C, in the device model having a channel length of 30 nm and a channel width of 300 nm, the S value and the threshold voltage are not improved when the thickness of the second oxide semiconductor layer 532 is in the range of 5 nm to 50 nm. The device model having a channel length of 30 nm and a channel width of 300 nm has an opposite dependence on the thickness of the second oxide semiconductor layer 532 to the device model having a channel length of 30 nm and a channel width of 40 nm.

This is because, as the thickness of the second oxide semiconductor layer 532 is increased, the area of the side surface is increased, so that an electric field is easily applied to the entire second oxide semiconductor layer 532 from the gate electrode layer 570. In contrast, when the channel width is large, similarly to the results of the third simulation, an electric field from the gate electrode layer 570 which is applied from the side surface side of the second oxide semiconductor layer 532 does not affect the entire channel formed in the second oxide semiconductor layer 532; thus, the Id-Vg characteristics are not improved.

The above shows that it is effective to make the channel width very small and increase the thickness of the second oxide semiconductor layer 532; thus, the structure of DM5 is appropriate for a fin-type transistor (the thickness of the oxide semiconductor stack 530 is greater than the channel width) and can suppress the reduction in on-state current due to miniaturization.

Next, the comparison between a device model in which an active layer of a transistor is formed using an oxide semiconductor (OS) and a device model in which an active layer of a transistor is Rained using silicon is made as fifth simulation. A device model 7 (hereinafter, DM7) whose active layer is formed using silicon has a structure based on DM5 as illustrated in FIGS. 18A to 18D, and a silicon active layer 630 includes an n$^+$-type region 632 and a p$^-$-type region 631. Here, the simulation is performed assuming that the donor impurity density ($N_D$) of the n$^+$-type region 632 is 1E20/cm$^3$ and the acceptor impurity densities ($N_A$) of the p$^-$-type region 631 are 1E17 cm$^3$, 1E18 cm$^3$, and 1E19 cm$^3$.

Figure 19:
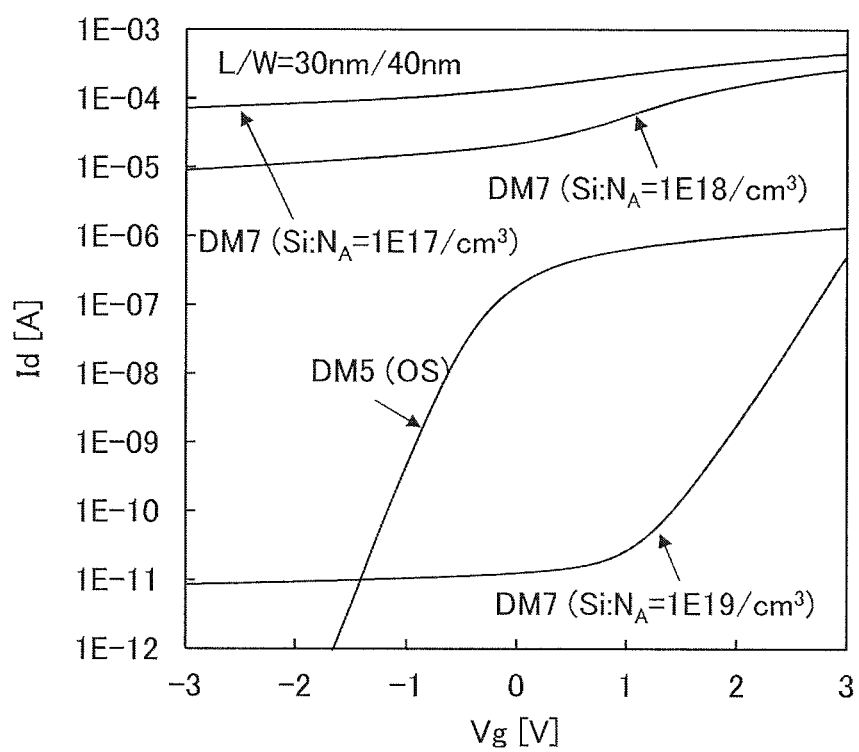
FIG. 19 shows the results of device simulation.

FIG. 19 shows Id-Vg characteristics obtained by the simulation using the device model DM7 whose active layer is formed using silicon. For comparison, Id-Vg characteristics of DM5 including an oxide semiconductor layer as an active layer, which are shown in FIG. 15, are also shown.

In DM7, when $N_A$ is relatively small, the off-state characteristics are very poor, and the on/off ratio is hardly obtained. When $N_A$ is relatively large, the on/off ratio can be obtained, but the off-state current is not as low as that of DM5.

The above results of the first to fifth simulation described in this embodiment reveal that the following structures are significant for improvement of the characteristics of a transistor: a structure in which an oxide semiconductor stack is used as an active layer; a structure in which the position of an intermediate layer in which a channel is formed is relatively high in the stacked layer and an electric field from a gate electrode layer is easily applied from a side surface of the intermediate layer; and a structure in which a source electrode layer or a drain electrode layer does not cover an end portion of the active layer so that the electric field from the gate electrode layer to the active layer is not blocked. Further, with any of the structures, reducing the channel width and increasing the thickness of the intermediate layer in which a channel is formed are also significant. Thus, a miniaturized semiconductor device of one embodiment of the present invention described in other embodiments has excellent electrical characteristics and high reliability.

This embodiment can be combined as appropriate with any of the other embodiments in this specification.

(Embodiment 3)

In this embodiment, a transistor having a structure different from that of the transistor described in Embodiment 1 is described.

Figure 20A:
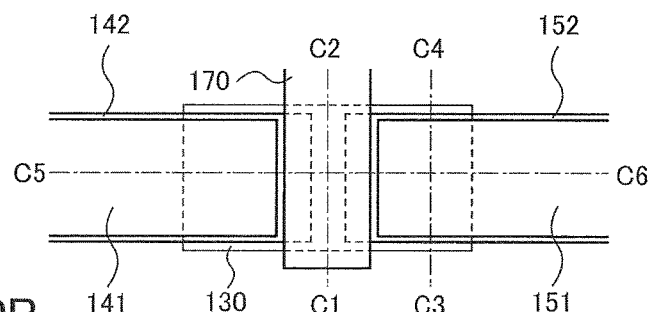
FIGS. 20A to 20D are a top view and cross-sectional views of a transistor.
Figure 20B:
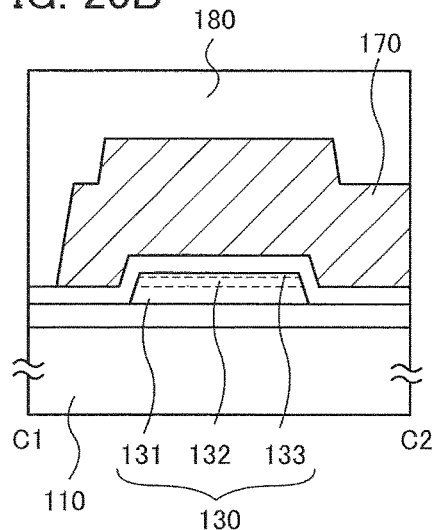
Figure 20C:
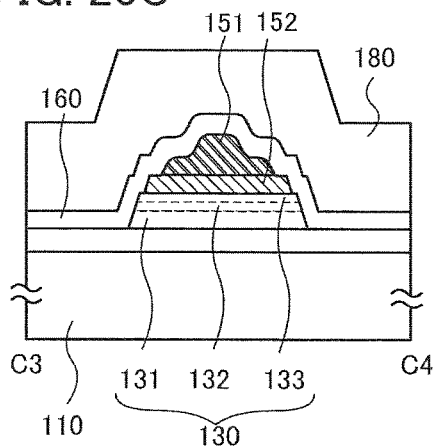
Figure 20D:
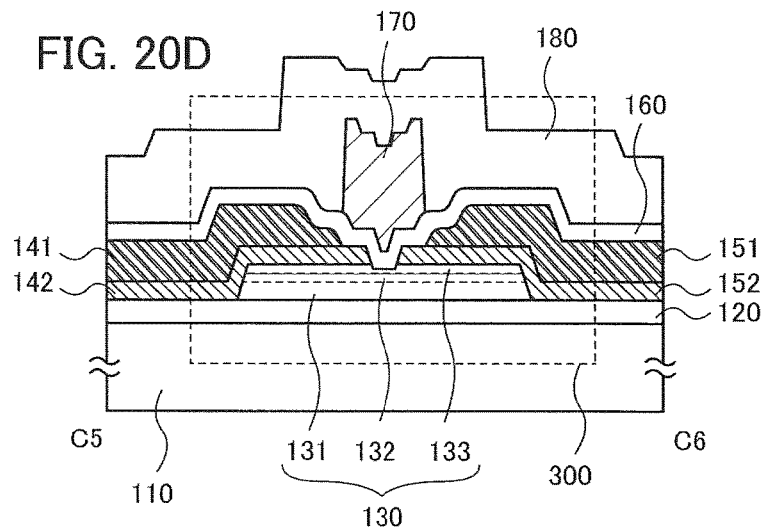

FIGS. 20A to 20D are a top view and cross-sectional views which illustrate a transistor of one embodiment of the present invention. FIG. 20A is the top view. FIG. 20B illustrates a cross section taken along a dashed-dotted line C1-C2 in FIG. 20A. FIG. 20C illustrates a cross section taken along a dashed-dotted line C3-C4 in FIG. 20A. FIG. 20D illustrates a cross section taken along a dashed-dotted line C5-C6 in FIG. 20A. Note that for simplification of the drawing, some components in the top view in FIG. 20A are not illustrated. In some cases, the direction of the dashed-dotted line C1-C2 is referred to as a channel width direction, and the direction of the dashed-dotted line C5-C6 is referred to as a channel length direction.

A transistor 300 illustrated in FIGS. 20A to 20D includes the base insulating film 120 formed over the substrate 110; the oxide semiconductor stack 130 formed over the base insulating film 120; the second source electrode layer 142 and the second drain electrode layer 152 formed over the oxide semiconductor stack 130; the first source electrode layer 141 and the first drain electrode layer 151 formed over the second source electrode layer 142 and the second drain electrode layer 152, respectively; the gate insulating film 160 formed over the first source electrode layer 141, the second source electrode layer 142, the first drain electrode layer 151, the second drain electrode layer 152, and the oxide semiconductor stack 130; the gate electrode layer 170 formed over the gate insulating film 160; and the oxide insulating layer 180 formed over the gate insulating film 160 and the gate electrode layer 170. Note that the oxide insulating layer 180 may be provided as needed and another insulating layer may be further provided thereover.

The transistor 300 illustrated in FIGS. 20A to 20D is similar to the transistor 200 illustrated in FIGS. 7A to 7D except for the stack order of the first source electrode layer 141 and the second source electrode layer 142 and the stack order of the first drain electrode layer 151 and the second drain electrode layer 152.

Since the first source electrode layer 141 and the first drain electrode layer 151 are not in contact with the oxide semiconductor stack 130 in the transistor 300, an oxygen vacancy due to the first source electrode layer 141 and the first drain electrode layer 151 is not generated in the oxide semiconductor stack 130. Thus, an n-type region formed by the oxygen vacancy, which serves as a source or a drain, is not formed.

In the transistor 300, the conductive nitride (tantalum nitride or titanium nitride) described in Embodiment 1 is used for the second source electrode layer 142 and the second drain electrode layer 152. Therefore, nitrogen acting as a donor can be diffused from the nitride to a region of the oxide semiconductor stack 130 which is close to the interface with the second source electrode layer 142 and the second drain electrode layer 152, so that the region to which nitrogen is diffused can serve as a source or a drain. Note that nitrogen is sometimes diffused in a channel length direction; thus, it is preferable to remove part of a channel formation region as illustrated in FIG. 7D and FIG. 20D. The part of the channel formation region can be removed through an etching step at the formation of the second source electrode layer 142 and the second drain electrode layer 152. Note that it is not necessary to diffuse nitrogen deeply to the oxide semiconductor stack 130 because the region of the oxide semiconductor stack 130 which is close to the interface with the second source electrode layer 142 and the second drain electrode layer 152 can sufficiently serve as a source or a drain by diffusing nitrogen only thereto.

Further, since an oxygen vacancy due to the first source electrode layer 141 and the first drain electrode layer 151 is not generated in the oxide semiconductor stack 130 in the transistor 300, the distance between the first source electrode layer 141 and the first drain electrode layer 151 can be made shorter than the distance between the source electrode layer 140 and the drain electrode layer 150 in the transistor 100. For example, an end surface of the second source electrode layer 142 may be aligned with an end surface of the first source electrode layer 141, and an end surface of the second drain electrode layer 152 may be aligned with an end surface of the first drain electrode layer 151. With such a structure, the resistance of the whole source electrode layer and the whole drain electrode layer can be reduced.

Figure 32A:
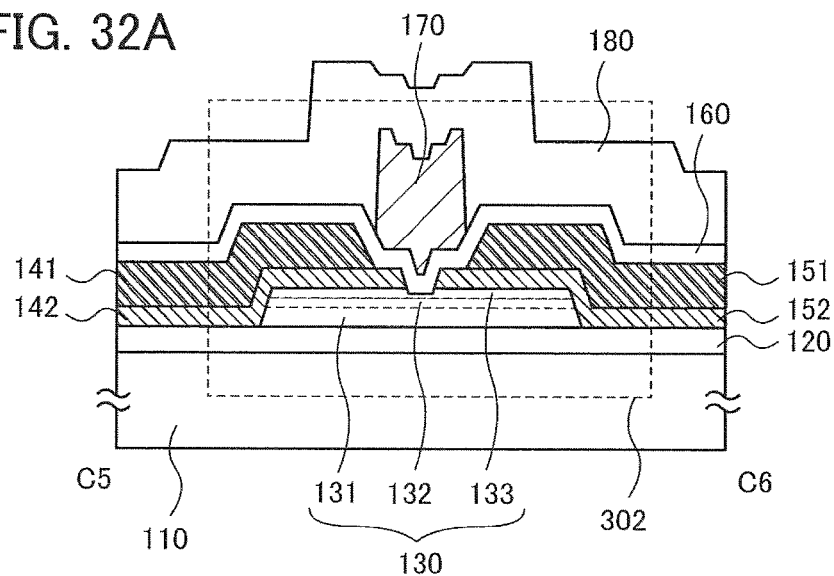
FIGS. 32A and 32B are cross-sectional views each illustrating shapes of a source electrode and a drain electrode of a transistor.

Each of end portions of the first source electrode layer 141 and the first drain electrode layer 151 of the transistor 300 preferably has a staircase-like shape including a plurality of steps. With such a shape including a plurality of steps, the coverage with a film formed thereover is improved, so that the electrical characteristics and long-term reliability of the transistor can be improved. Like a transistor 302 illustrated in FIG. 32A, each of the end portions of the first source electrode layer 141 and the first drain electrode layer 151 does not have to have a staircase-like shape.

In order to form a semiconductor device with low power consumption, it is effective to reduce the off-state current of a transistor, in particular, current when a gate voltage is 0 V (also referred to as Icut). However, it is known that miniaturization of a transistor causes deterioration of electrical characteristics of the transistor, such as threshold voltage and an S value (subthreshold value), and a miniaturized semiconductor device with low power consumption has been desired.

In one embodiment of the present invention, when the thickness of the first region which is part of the first oxide semiconductor layer 131 is $T_{S1}$ and the thickness of the second region which is part of the gate insulating film 160 is $T_{G1}$, $T_{S1} \geq T_{G1}$ ($T_{S1}$ is greater than or equal to $T_{G1}$). Accordingly, the gate electrode layer 170 covers a side surface of the second oxide semiconductor layer 132 with the gate insulating film 160 provided therebetween.

A channel is formed in the second oxide semiconductor layer 132. With a structure in which an electric field is easily applied from the gate electrode layer 170 to the side surface of the second oxide semiconductor layer 132, the electric field is applied to the entire second oxide semiconductor layer 132, so that the threshold voltage and the S value of the transistor can be improved. This structure is especially effective for a transistor having a short channel width; thus, even when the transistor is miniaturized, Icut and power consumption can be lowered. Further, the threshold voltage of the transistor becomes stable; thus, long-term reliability of the semiconductor device can be improved.

In one embodiment of the present invention, it is preferable that, as illustrated in the top view of the transistor of FIG. 20A, the length in the channel width direction of each of the source electrode layer 140 and the drain electrode layer 150 be smaller than that of the oxide semiconductor stack 130, and the source electrode layer 140 and the drain electrode layer 150 cover end portions of the oxide semiconductor stack 130 in the channel length direction. Such a structure can reduce obstruction of electric field application from the gate electrode layer 170 to the side surface of the second oxide semiconductor layer 132, and thus further improve the threshold voltage and the S value of the above-described transistor in which $T_{S1} \geq T_{G1}$.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

(Embodiment 4)

In this embodiment, a transistor having a structure different from that of the transistor described in Embodiments 1 and 3 is described.

Figure 21A:
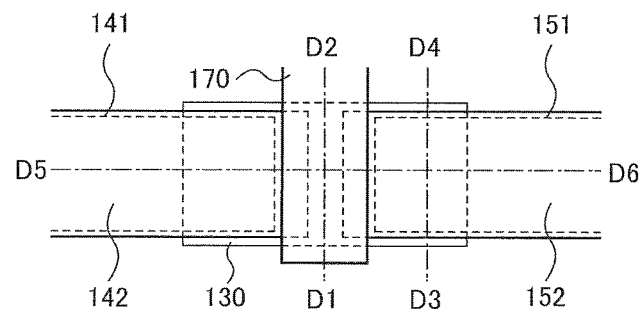
FIGS. 21A to 21D are a top view and cross-sectional views of a transistor.
Figure 21B:
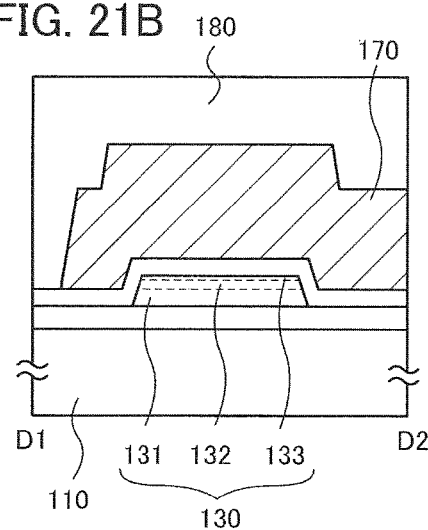
Figure 21C:
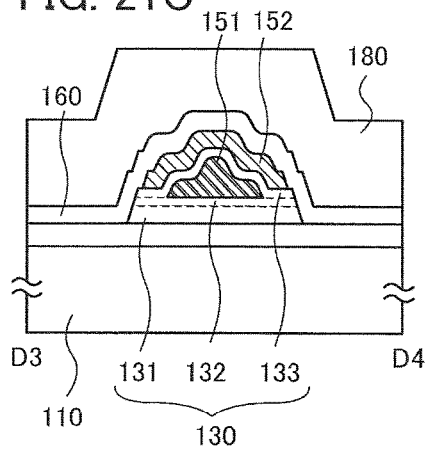
Figure 21D:
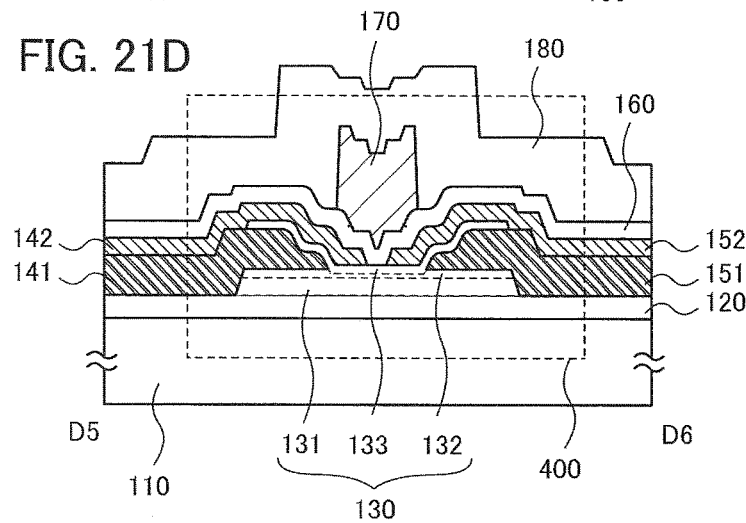

FIGS. 21A to 21D are a top view and cross-sectional views which illustrate a transistor of one embodiment of the present invention. FIG. 21A is the top view. FIG. 21B illustrates a cross section taken along a dashed-dotted line D1-D2 in FIG. 21A. FIG. 21C illustrates a cross section taken along a dashed-dotted line D3-D4 in FIG. 21A. FIG. 21D illustrates a cross section taken along a dashed-dotted line D5-D6 in FIG. 21A. Note that for simplification of the drawing, some components in the top view in FIG. 21A are not illustrated. In some cases, the direction of the dashed-dotted line D1-D2 is referred to as a channel width direction, and the direction of the dashed-dotted line D5-D6 is referred to as a channel length direction.

A transistor 400 illustrated in FIGS. 21A to 21D includes the base insulating film 120 formed over the substrate 110; the first oxide semiconductor layer 131 and the second oxide semiconductor layer 132 formed over the base insulating film 120; the first source electrode layer 141 and the first drain electrode layer 151 formed over the second oxide semiconductor layer 132; the third oxide semiconductor layer 133 formed over the second oxide semiconductor layer 132, the first source electrode layer 141, and the first drain electrode layer 151; the second source electrode layer 142 which covers the first source electrode layer 141 and is in contact with the first source electrode layer 141 and the third oxide semiconductor layer 133; the second drain electrode layer 152 which covers the first drain electrode layer 151 and is in contact with the first drain electrode layer 151 and the third oxide semiconductor layer 133; the gate insulating film 160 formed over the third oxide semiconductor layer 133, the second source electrode layer 142, and the second drain electrode layer 152; the gate electrode layer 170 formed over the gate insulating film 160; and the oxide insulating layer 180 formed over the gate insulating film 160 and the gate electrode layer 170. Note that the oxide insulating layer 180 may be provided as needed and another insulating layer may be further provided thereover.

The transistor 400 illustrated in FIGS. 21A to 21D is similar to the transistor 200 illustrated in FIGS. 7A to 7D except that the third oxide semiconductor layer 133 is formed over the first source electrode layer 141 and the first drain electrode layer 151.

In the transistor 400, the second oxide semiconductor layer 132 where a channel is formed is in contact with the first source electrode layer 141 and the first drain electrode layer 151; thus, high-density oxygen vacancies are generated in the second oxide semiconductor layer 132 and accordingly an n-type region is formed. Therefore, there is a few resistance component in a carrier path and carriers can be transported efficiently.

Further, since the third oxide semiconductor layer 133 is formed after the first source electrode layer 141 and the first drain electrode layer 151 are formed, the third oxide semiconductor layer 133 is not over-etched when the first source electrode layer 141 and the first drain electrode layer 151 are formed. Therefore, the second oxide semiconductor layer 132 where a channel is formed can be sufficiently separated from the gate insulating film 160, and the effect of suppressing influence of diffusion of impurities from the interface between the third oxide semiconductor layer 133 and the gate insulating film 160 can be enhanced.

Figure 32B:
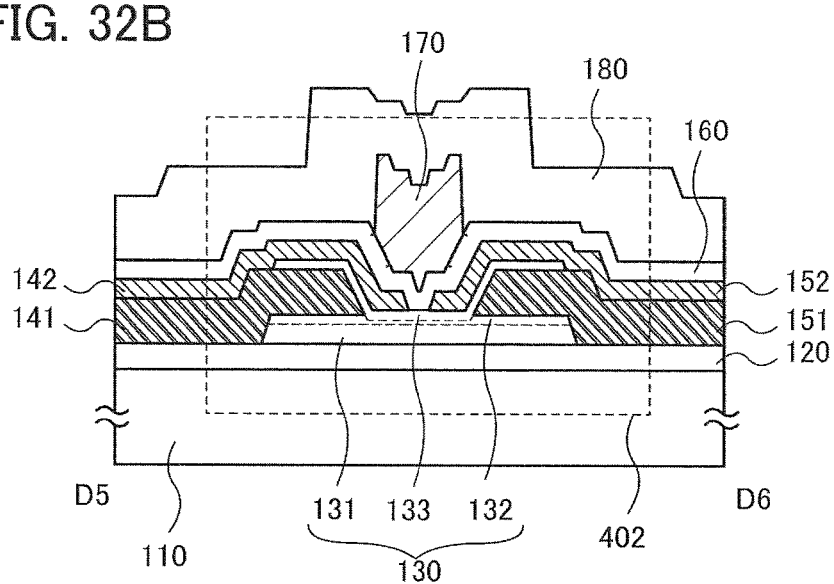

Each of the end portions of the first source electrode layer 141 and the first drain electrode layer 151 of the transistor 400 preferably has a staircase-like shape including a plurality of steps. With such a shape including a plurality of steps, the coverage with a film formed thereover is improved, so that the electrical characteristics and long-term reliability of the transistor can be improved. Like a transistor 402 illustrated in FIG. 32B, each of the end portions of the first source electrode layer 141 and the first drain electrode layer 151 does not have to have a staircase-like shape.

In order to form a semiconductor device with low power consumption, it is effective to reduce the off-state current of a transistor, in particular, current when a gate voltage is 0 V (also referred to as Icut). However, it is known that miniaturization of a transistor causes deterioration of electrical characteristics of the transistor, such as threshold voltage and an S value (subthreshold value), and a miniaturized semiconductor device with low power consumption has been desired.

In one embodiment of the present invention, when the thickness of the first region which is part of the first oxide semiconductor layer 131 is $T_{S1}$ and the thickness of the second region which is part of the gate insulating film 160 is $T_{G1}$, $T_{S1} \geq T_{G1}$ ($T_{S1}$ is greater than or equal to $T_{G1}$). Accordingly, the gate electrode layer 170 covers a side surface of the second oxide semiconductor layer 132 with the gate insulating film 160 provided therebetween.

A channel is formed in the second oxide semiconductor layer 132. With a structure in which an electric field is easily applied from the gate electrode layer 170 to the side surface of the second oxide semiconductor layer 132, the electric field is applied to the entire second oxide semiconductor layer 132, so that the threshold voltage and the S value of the transistor can be improved. This structure is especially effective for a transistor having a short channel width; thus, even when the transistor is miniaturized, Icut and power consumption can be lowered. Further, the threshold voltage of the transistor becomes stable; thus, long-term reliability of the semiconductor device can be improved.

In one embodiment of the present invention, it is preferable that, as illustrated in the top view of the transistor of FIG. 21A, the length in the channel width direction of each of the first source electrode layer 141, the second source electrode layer 142, the first drain electrode layer 151, and the second drain electrode layer 152 be smaller than that of the oxide semiconductor stack 130, and the first source electrode layer 141, the second source electrode layer 142, the first drain electrode layer 151, and the second drain electrode layer 152 cover end portions of the oxide semiconductor stack 130 in the channel length direction. Such a structure can reduce obstruction of electric field application from the gate electrode layer 170 to the side surface of the second oxide semiconductor layer 132, and thus further improve the threshold voltage and the S value of the above-described transistor in which $T_{S1} \geq T_{G1}$.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

(Embodiment 5)

In this embodiment, a method for forming the transistor 200 described in Embodiment 1 with reference to FIGS. 7A to 7D is described with reference to FIGS. 22A to 22C, FIGS. 23A to 23C, and FIGS. 24A and 24B.

For the substrate 110, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used. Still alternatively, any of these substrates further provided with a semiconductor element can be used.

The base insulating film 120 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a stack containing any of the above materials may be used, and at least an upper layer of the base insulating film 120 which is in contact with the oxide semiconductor stack 130 is preferably formed using a material containing oxygen that might serve as a supply source of oxygen to the oxide semiconductor stack 130.

In the case where a surface of the substrate 110 is made of an insulator and there is no influence of impurity diffusion to the oxide semiconductor stack 130 to be formed later, the base insulating film 120 is not necessarily provided.

Figure 22A:
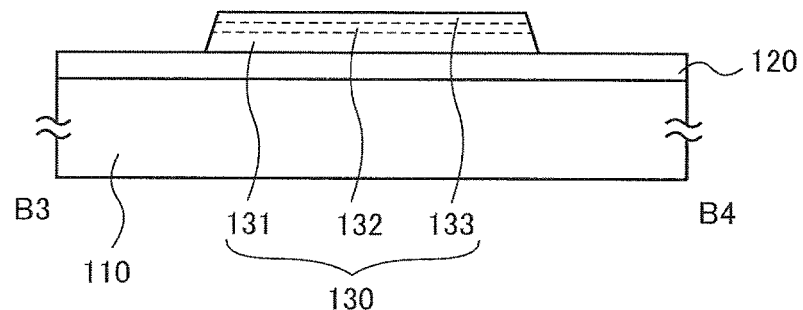
FIGS. 22A to 22C illustrate a method for manufacturing a transistor.

Then, the first oxide semiconductor layer 131, the second oxide semiconductor layer 132, and the third oxide semiconductor layer 133 are formed over the base insulating film 120 by a sputtering method, a CVD method, an MBE method, an ALD method, or a PLD method and selectively etched, so that the oxide semiconductor stack 130 is formed (see FIG. 22A). Note that heating may be performed before etching.

For the first oxide semiconductor layer 131, the second oxide semiconductor layer 132, and the third oxide semiconductor layer 133, the material described in Embodiment 1 can be used. For example, the first oxide semiconductor layer 131 can be formed using an In—Ga—Zn oxide whose atomic ratio of In to Ga and Zn is 1:3:2, the second oxide semiconductor layer 132 can be formed using an In—Ga—Zn oxide whose atomic ratio of In to Ga and Zn is 1:1:1, and the third oxide semiconductor layer 133 can be formed using an In—Ga—Zn oxide whose atomic ratio of In to Ga and Zn is 1:3:2.

An oxide semiconductor that can be used for each of the first oxide semiconductor layer 131, the second oxide semiconductor layer 132, and the third oxide semiconductor layer 133 preferably contains at least indium (In) or zinc (Zn). Alternatively, the oxide semiconductor preferably contains both In and Zn. In order to reduce variation in electrical characteristics of the transistor including the oxide semiconductor, the oxide semiconductor preferably contains a stabilizer in addition to In and/or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and the like can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that an In—Ga—Zn oxide refers to, for example, an oxide containing In, Ga, and Zn as its main components and there is no particular limitation on the ratio of In to Ga and Zn. The In—Ga—Zn oxide may contain a metal element other than In, Ga, and Zn. Further, in this specification, a film formed using an In—Ga—Zn oxide is also referred to as an IGZO film.

Alternatively, a material represented by $InMO_3(ZnO)_m$ (m>0, where m is not an integer) may be used. Note that M represents one or more metal elements selected from Ga, Fe, Mn, and Co. Further alternatively, a material represented by $In_2SnO_5(ZnO)_n$ (n>0, where n is an integer) may be used.

Note that as described in Embodiment 1 in detail, a material of the first oxide semiconductor layer 131 and the third oxide semiconductor layer 133 is selected so that the first oxide semiconductor layer 131 and the third oxide semiconductor layer 133 each have an electron affinity higher than that of the second oxide semiconductor layer 132.

Note that the oxide semiconductor layers are each preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case where an In—Ga—Zn oxide is used for each of the first oxide semiconductor layer 131, the second oxide semiconductor layer 132, and the third oxide semiconductor layer 133, a material whose atomic ratio of In to Ga and Zn is any of 1:1:1, 2:2:1, 3:1:2, 1:3:2, 1:4:3, 1:5:4, 1:6:6, 2:1:3, 1:6:4, 1:9:6, 1:1:4, and 1:1:2 is used so that the first oxide semiconductor layer 131 and the third oxide semiconductor layer 133 each have an electron affinity higher than that of the second oxide semiconductor layer 132.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content of the second oxide semiconductor layer 132 is preferably higher than those of the first oxide semiconductor layer 131 and the third oxide semiconductor layer 133. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the second oxide semiconductor layer 132, a transistor having high mobility can be achieved.

A structure of an oxide semiconductor film is described below.

Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the layer is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ω scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases.

Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, change in electrical characteristics due to irradiation with visible light or ultraviolet light is small. Thus, the transistor has high reliability.

Note that an oxide semiconductor film may be a stacked film including two or more films of an amorphous oxide semiconductor layer, a microcrystalline oxide semiconductor layer, and a CAAC-OS layer, for example.

A CAAC-OS film can be deposited by a sputtering method using a polycrystalline oxide semiconductor sputtering target, for example.

For the deposition of the CAAC-OS film, the following conditions are preferably employed.

The amount of impurities entering the CAAC-OS film during the deposition is reduced, so that the crystal state can be prevented from being broken by the impurities. For example, impurities (e.g., hydrogen, water, carbon dioxide, or nitrogen) which exist in the deposition chamber is reduced. Further, impurities in a deposition gas are reduced. Specifically, a deposition gas whose dew point is lower than or equal to −80° C., preferably lower than or equal to −100° C. is used.

When the substrate heating temperature during the deposition is increased, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. An increase in substrate heating temperature during the deposition causes migration to occur over the substrate when the flat-plate-like sputtered particle reaches the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As a sputtering target, an In—Ga—Zn—O compound target can be used, for example. The In—Ga—Zn—O compound target is a polycrystalline body which is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. The grain size of the polycrystalline body is preferably as small as possible, for example, less than or equal to 1 μm. The kinds of powder and the molar ratio for mixing powder may be determined as appropriate depending on the desired sputtering target.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the second oxide semiconductor layer 132 can be improved, and in addition, impurities such as hydrogen and water can be removed from the base insulating film 120, the first oxide semiconductor layer 131, and the third oxide semiconductor layer 133. Note that the first heat treatment may be performed before etching for formation of the oxide semiconductor stack 130.

In the case where the oxide semiconductor stack 130 is a stacked layer and an amorphous layer is formed as a lower layer, a CAAC-OS film can be easily formed thereover. Thus, the first oxide semiconductor layer 131 may be an amorphous layer and the second oxide semiconductor layer 132 may be a CAAC-OS film.

Then, a first conductive film to be the first source electrode layer 141 and the first drain electrode layer 151 is faulted over the oxide semiconductor stack 130. For the first conductive film, Al, Cr, Cu, Ta, Ti, Mo, W, or an alloy material containing any of these as its main component can be used. For example, a 100-nm-thick titanium film is formed by a sputtering method or the like.

Figure 22B:
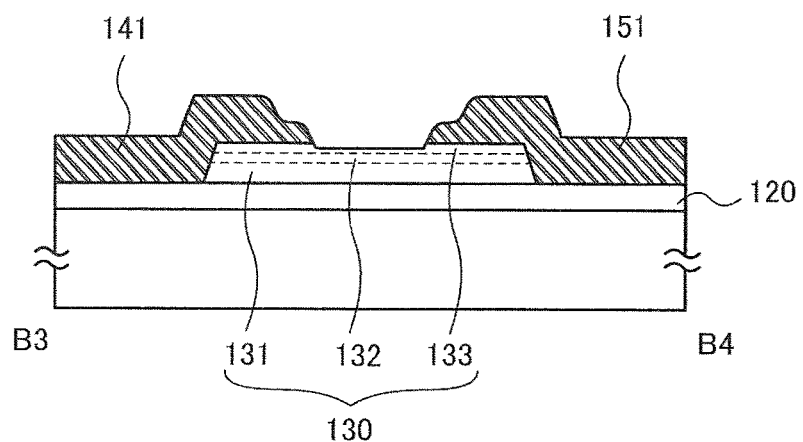

Next, the first conductive film is etched so as to be divided over the oxide semiconductor stack 130, so that the first source electrode layer 141 and the first drain electrode layer 151 are formed (see FIG. 22B). Here, the end portions of the first source electrode layer 141 and the first drain electrode layer 151 are each preferably formed so as to have a staircase-like shape as illustrated in FIG. 22B. The end portions can be formed in such a manner that a step of making a resist mask recede by ashing and an etching step are alternately performed plural times.

At this time, the first conductive film is over-etched, so that the oxide semiconductor stack 130 is partly etched as illustrated in FIG. 22B. However, when the etching selectivity of the first conductive film to the oxide semiconductor stack 130 is high, the oxide semiconductor stack 130 is hardly etched.

Then, a second conductive film 800 (which is not shown in FIG. 22C) to be the second source electrode layer 142 and the second drain electrode layer 152 is formed over the oxide semiconductor stack 130, the first source electrode layer 141, and the first drain electrode layer 151. For the second conductive film 800, tantalum nitride, titanium nitride, ruthenium, or an alloy material containing any of these as its main component can be used. For example, a 20-nm-thick tantalum nitride film is formed by a sputtering method or the like.

Figure 22C:
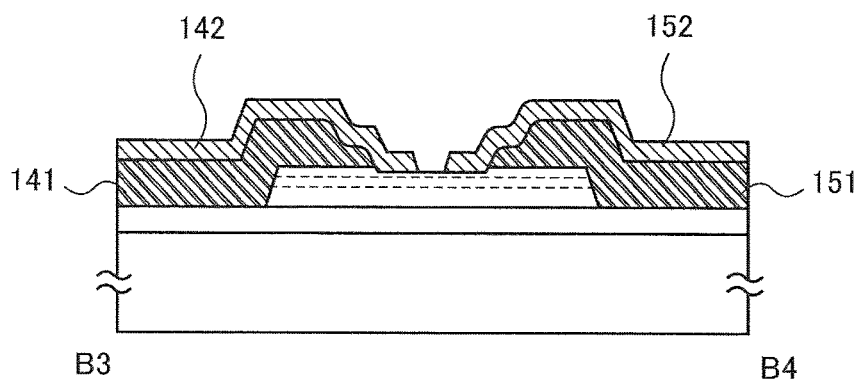

Next, the second conductive film 800 is etched so as to be divided over the oxide semiconductor stack 130, so that the second source electrode layer 142 and the second drain electrode layer 152 are formed (see FIG. 22C). At this time, part of the oxide semiconductor stack 130 may be etched.

Figure 24A:
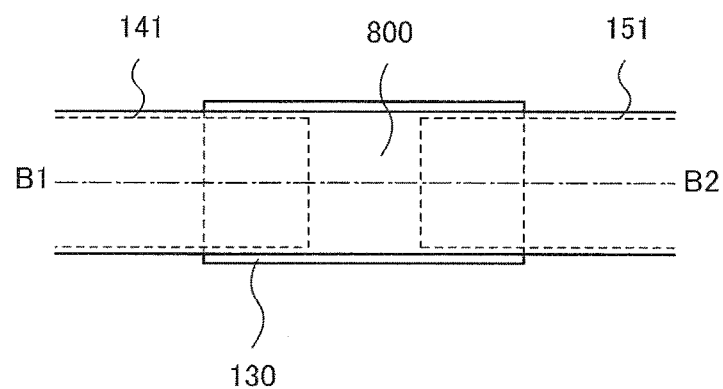
FIGS. 24A and 24B illustrate a method for manufacturing a transistor.

Note that in the case of forming a transistor whose channel length (a distance between the second source electrode layer 142 and the second drain electrode layer 152) is extremely short, the second conductive film 800 is etched first so as to cover the first source electrode layer 141 and the first drain electrode layer 151, as illustrated in a top view in FIG. 24A.

Figure 24B:
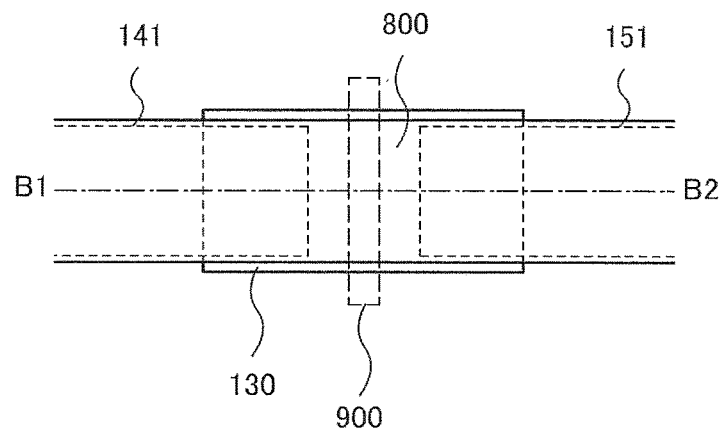

Then, a region 900 for dividing the second conductive film 800, which is illustrated in FIG. 24B is etched using a resist mask that is processed by a method suitable for fine line processing, such as electron beam exposure; accordingly, the second source electrode layer 142 and the second drain electrode layer 152 are formed. Note that with the use of a positive type resist for the resist mask, the exposed region can be minimized and throughput can be thus improved. In the above manner, a transistor having a channel length of 30 nm or less can be formed.

Next, second heat treatment is preferably performed. The second heat treatment can be performed under conditions similar to those of the first heat treatment. By the second heat treatment, impurities such as hydrogen and water can be further removed from the oxide semiconductor stack 130.

Figure 23A:
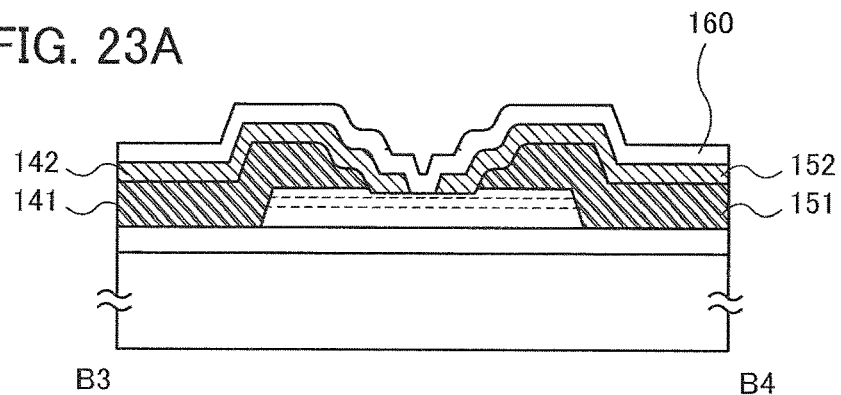
FIGS. 23A to 23C illustrate a method for manufacturing a transistor.
Figure 23B:
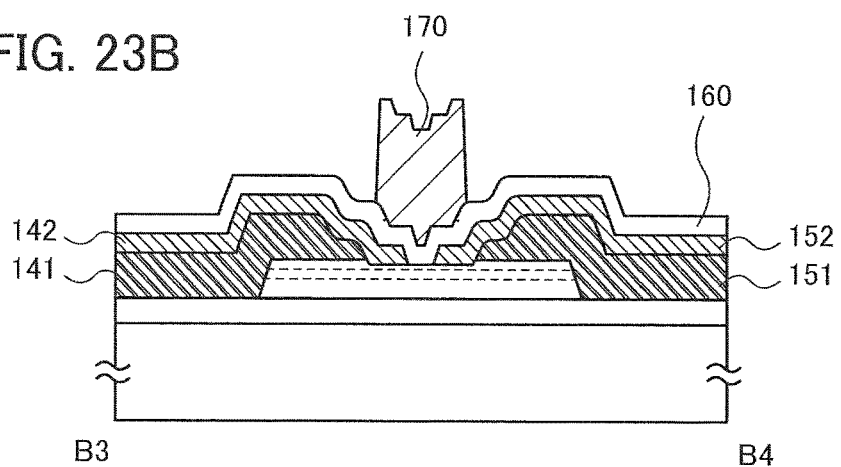

Next, the gate insulating film 160 is formed over the oxide semiconductor stack 130, the second source electrode layer 142, and the second drain electrode layer 152 (see FIG. 23A). The gate insulating film 160 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 160 may be a stack containing any of the above materials. The gate insulating film 160 can be formed by a sputtering method, a CVD method, an MBE method, an ALD method, a PLD method, or the like.

After that, a third conductive film is formed over the gate insulating film 160. For the third conductive film, Al, Ti, Cr, Co, Ni, Cu, Y, Zr, Mo, Ru, Ag, Ta, W, or an alloy material containing any of these as its main component can be used. The third conductive film can be formed by a sputtering method or the like. The third conductive film is etched so that the gate electrode layer 170 is formed to overlap with the channel formation region (see FIG. 23B).

Figure 23C:
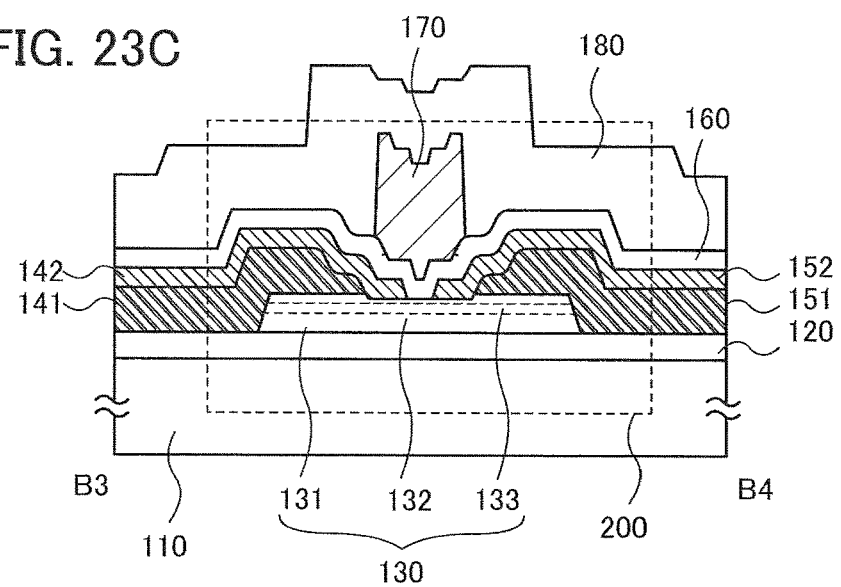

Next, the oxide insulating layer 180 is formed over the gate insulating film 160 and the gate electrode layer 170 (see FIG. 23C). The oxide insulating layer 180 can be formed using a material and a method which are similar to those of the base insulating film 120. The oxide insulating layer 180 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or an oxide insulating layer containing nitrogen. The oxide insulating layer 180 can be formed by a sputtering method, a CVD method, an MBE method, an ALD method, or a PLD method, and is preferably formed to contain excess oxygen so as to be able to supply oxygen to the oxide semiconductor stack 130.

Oxygen may be added to the oxide insulating layer 180 by an ion implantation method, an ion doping method, a plasma immersion ion implantation method, or the like. By addition of oxygen, the oxide insulating layer 180 can supply oxygen much easily to the oxide semiconductor stack 130.

Next, third heat treatment is preferably performed. The third heat treatment can be performed under conditions similar to those of the first heat treatment. By the third heat treatment, excess oxygen is easily released from the base insulating film 120, the gate insulating film 160, and the oxide insulating layer 180, so that oxygen vacancies in the oxide semiconductor stack 130 can be reduced.

Through the above process, the transistor 200 illustrated in FIGS. 7A to 7D can be formed.

This embodiment can be combined as appropriate with any of the other embodiments in this specification.

(Embodiment 6)

In this embodiment, an example of a semiconductor device (memory device) which includes a transistor of one embodiment of the present invention, which can retain stored data even when not powered, and which has an unlimited number of write cycles is described with reference to drawings.

Figure 25A:
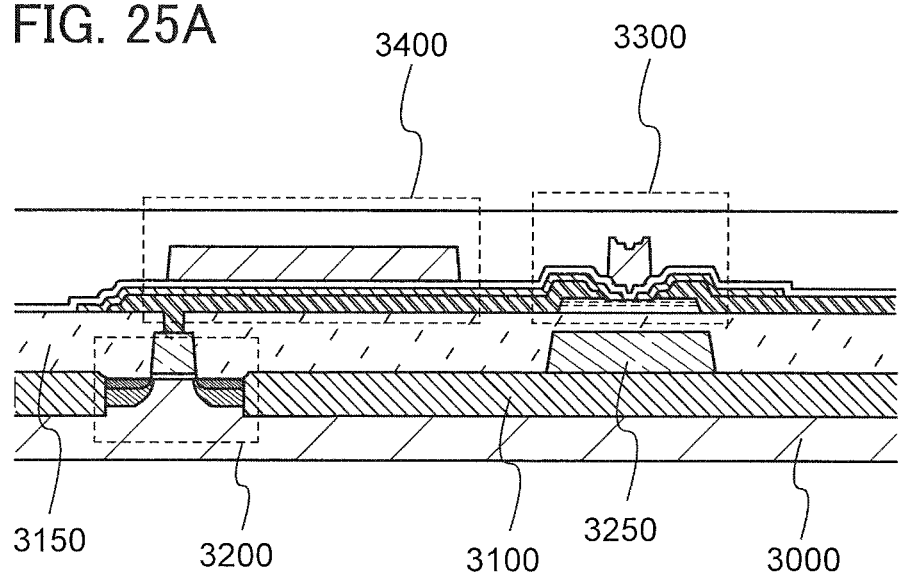
FIGS. 25A and 25B are a cross-sectional view and a circuit diagram of a semiconductor device.
Figure 25B:
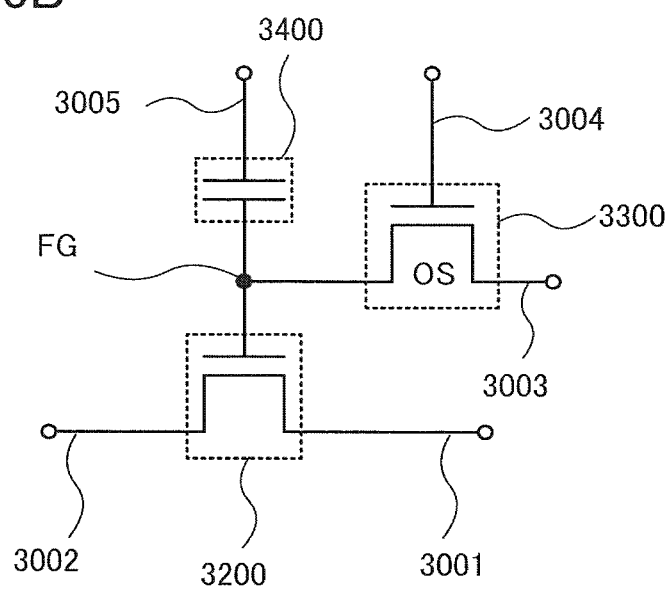

FIG. 25A is a cross-sectional view of the semiconductor device, and FIG. 25B is a circuit diagram of the semiconductor device.

The semiconductor device illustrated in FIGS. 25A and 25B includes a transistor 3200 including a first semiconductor material in a lower portion, and a transistor 3300 including a second semiconductor material and a capacitor 3400 in an upper portion. As the transistor 3300, the transistor described in Embodiment 1, 3, or 4 can be used, and an example in which the transistor 200 described in Embodiment 1 with reference to FIGS. 7A to 7D is applied to the transistor 3300 is described in this embodiment. Note that FIG. 25A illustrates a cross section of the portion taken along the dashed-dotted line B5-B6 in FIG. 7A.

One electrode of the capacitor 3400 is formed using the same material as a source electrode layer and a drain electrode layer of the transistor 3300, the other electrode of the capacitor 3400 is formed using the same material as a gate electrode layer of the transistor 3300, and a dielectric of the capacitor 3400 is formed using the same material as the gate insulating film 160 of the transistor 3300; thus, the capacitor 3400 can be formed at the same time as the transistor 3300.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. On the other hand, a transistor including an oxide semiconductor enables charge to be held for a long time owing to its electrical characteristics, that is, the low off-state current.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to that described here except for the use of the transistor described in Embodiment 1, 3, or 4, which is formed using an oxide semiconductor for holding data.

The transistor 3200 in FIG. 25A includes a channel formation region provided in a substrate 3000 including a semiconductor material (such as crystalline silicon), impurity regions provided such that the channel formation region is provided therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region.

Further, an element isolation insulating layer 3100 is formed on the substrate 3000 so as to surround the transistor 3200, and an insulating layer 3150 is formed so as to cover the transistor 3200. Note that the element isolation insulating layer 3100 can be formed by an element isolation technique such as local oxidation of silicon (LOCOS) or shallow trench isolation (STI).

For example, in the case where the transistor 3200 is formed using a crystalline silicon substrate, the transistor 3200 can operate at high speed. Thus, when the transistor is used as a reading transistor, data can be read at high speed.

The transistor 3300 is provided over the insulating layer 3150, and one of the source electrode layer and the drain electrode layer thereof is extended so as to function as the one electrode of the capacitor 3400. Further, the one electrode of the capacitor 3400 is electrically connected to the gate electrode layer of the transistor 3200.

The transistor 3300 in FIG. 25A is a top-gate transistor in which a channel is formed in an oxide semiconductor layer. Since the off-state current of the transistor 3300 is low, stored data can be retained for a long period owing to such a transistor. In other words, refresh operation becomes unnecessary or the frequency of the refresh operation in a semiconductor memory device can be extremely low, which leads to a sufficient reduction in power consumption.

Further, an electrode 3250 overlaps with the transistor 3300 with the insulating layer 3150 provided therebetween. By supplying an appropriate potential to the electrode 3250, the threshold voltage of the transistor 3300 can be controlled. In addition, long-term reliability of the transistor 3300 can be improved. Note that the electrode 3250 is not necessarily provided.

The transistor 3200 can be formed so as to overlap with the transistor 3300 or the capacitor 3400 as illustrated in FIG. 25A, whereby the area occupied by them can be reduced. Accordingly, the degree of integration of the semiconductor device can be increased.

An example of a circuit configuration corresponding to FIG. 25A is illustrated in FIG. 25B.

In FIG. 25B, a first wiring 3001 is electrically connected to a source electrode layer of the transistor 3200. A second wiring 3002 is electrically connected to a drain electrode layer of the transistor 3200. A third wiring 3003 is electrically connected to the one of the source electrode layer and the drain electrode layer of the transistor 3300. A fourth wiring 3004 is electrically connected to the gate electrode layer of the transistor 3300. The gate electrode layer of the transistor 3200 and the other of the source electrode layer and the drain electrode layer of the transistor 3300 are electrically connected to the one electrode of the capacitor 3400. A fifth wiring 3005 is electrically connected to the other electrode of the capacitor 3400.

The semiconductor device in FIG. 25B utilizes a characteristic in which the potential of the gate electrode layer of the transistor 3200 can be held, and thus enables writing, holding, and reading of data as follows.

Writing and holding of data are described. First, the potential of the fourth wiring 3004 is set to a potential at which the transistor 3300 is turned on, so that the transistor 3300 is turned on. Accordingly, the potential of the third wiring 3003 is supplied to the gate electrode layer of the transistor 3200 and the capacitor 3400. That is, a predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode layer of the transistor 3200 is held (holding).

Since the off-state current of the transistor 3300 is extremely low, the charge of the gate electrode layer of the transistor 3200 is held for a long time.

Next, reading of data is described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$ in the case where the low-level charge is given to the gate electrode layer of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode layer of the transistor 3200 can be determined. For example, in the case where the high-level charge is supplied in writing, when the potential of the fifth wiring 3005 is $V_0(>V_{th\_H})$, the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode layer can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate electrode layer, that is, a potential lower than $V_{th\_H}$. Alternatively, the fifth wiring 3005 may be supplied with a potential at which the transistor 3200 is turned on regardless of the state of the gate electrode layer, that is, a potential higher than $V_{th\_L}$.

When including a transistor having a channel formation region formed using an oxide semiconductor and having an extremely low off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics can be provided.

This embodiment can be combined as appropriate with any of the other embodiments in this specification.
(Embodiment 7)

In this embodiment, a semiconductor device including a transistor of one embodiment of the present invention, which can retain stored data even when not powered, which does not have a limitation on the number of write cycles, and which has a structure different from that described in Embodiment 6, is described.

Figure 26:
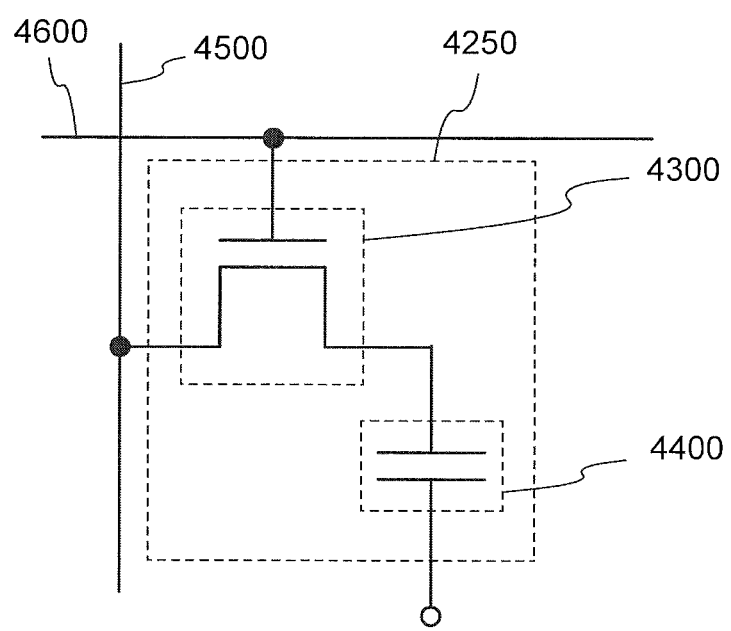
FIG. 26 illustrates a circuit diagram of a semiconductor device.

FIG. 26 illustrates an example of a circuit configuration of the semiconductor device. In the semiconductor device, a first wiring 4500 is electrically connected to a source electrode layer of a transistor 4300, a second wiring 4600 is electrically connected to a first gate electrode layer of the transistor 4300, and a drain electrode layer of the transistor 4300 is electrically connected to a first terminal of a capacitor 4400. Note that the transistor described in Embodiment 1, 3, or 4 can be used as the transistor 4300 included in the semiconductor device. The first wiring 4500 can serve as a bit line and the second wiring 4600 can serve as a word line.

The semiconductor device (a memory cell 4250) can have a connection mode similar to that of the transistor 3300 and the capacitor 3400 illustrated in FIGS. 25A and 25B. Thus, the capacitor 4400 can be formed through the same process and at the same time as the transistor 4300 in a manner similar to that of the capacitor 3400 described in Embodiment 6.

Next, writing and holding of data in the semiconductor device (a memory cell 4250) illustrated in FIG. 26 are described.

First, a potential at which the transistor 4300 is turned on is supplied to the second wiring 4600, so that the transistor 4300 is turned on. Accordingly, the potential of the first wiring 4500 is supplied to the first terminal of the capacitor 4400 (writing). After that, the potential of the second wiring 4600 is set to a potential at which the transistor 4300 is turned off, so that the transistor 4300 is turned off. Thus, the potential of the first terminal of the capacitor 4400 is held (holding).

In addition, the transistor 4300 including an oxide semiconductor has an extremely low off-state current. For that reason, the potential of the first terminal of the capacitor 4400 (or a charge accumulated in the capacitor 4400) can be held for an extremely long time by turning off the transistor 4300.

Next, reading of data is described. When the transistor 4300 is turned on, the first wiring 4500 which is in a floating state and the capacitor 4400 are electrically connected to each other, and the charge is redistributed between the first wiring 4500 and the capacitor 4400. As a result, the potential of the first wiring 4500 is changed. The amount of change in potential of the first wiring 4500 varies depending on the potential of the first terminal of the capacitor 4400 (or the charge accumulated in the capacitor 4400).

For example, the potential of the first wiring 4500 after charge redistribution is $(C_B \times V_{B0} + C \times V)/(C_B + C)$, where V is the potential of the first terminal of the capacitor 4400, C is the capacitance of the capacitor 4400, $C_B$ is the capacitance component of the first wiring 4500, and $V_{B0}$ is the potential of the first wiring 4500 before the charge redistribution. Therefore, it can be found that assuming that the memory cell 4250 is in either of two states in which the potentials of the first terminal of the capacitor 4400 are $V_1$ and $V_0$ ($V_1>V_0$), the potential of the first wiring 4500 in the case of holding the potential $V_1$ ($=(C_B \times V_{B0}+C \times V_1)/(C_B+C)$) is higher than the potential of the first wiring 4500 in the case of holding the potential $V_0$ ($=(C_B \times V_{B0}+C \times V_0)/(C_B+C)$).

Then, by comparing the potential of the first wiring 4500 with a predetermined potential, data can be read.

As described above, the semiconductor device (the memory cell 4250) illustrated in FIG. 26 can hold charge that is accumulated in the capacitor 4400 for a long time because the off-state current of the transistor 4300 is extremely low. In other words, refresh operation becomes unnecessary or the frequency of the refresh operation can be extremely low, which leads to a sufficient reduction in power consumption. Moreover, stored data can be retained for a long period even when power is not supplied.

A substrate over which a driver circuit for the memory cell 4250 is formed and the memory cell 4250 illustrated in FIG. 26 are preferably stacked. When the memory cell 4250 and the driver circuit are stacked, the size of the semiconductor device can be reduced. Note that there is no limitation on the numbers of the memory cells 4250 and the driver circuits which are stacked.

It is preferable that a semiconductor material of a transistor included in the driver circuit be different from that of the transistor 4300. For example, silicon, germanium, silicon germanium, silicon carbide, or gallium arsenide can be used, and a single crystal semiconductor is preferably used. A transistor formed using such a semiconductor material can operate at higher speed than a transistor formed using an oxide semiconductor and is suitable for the driver circuit for the memory cell 4250.

As described above, a miniaturized and highly-integrated semiconductor device having high electrical characteristics can be provided.

This embodiment can be combined as appropriate with any of the other embodiments in this specification.

(Embodiment 8)

In this embodiment, a CPU in which at least the transistor described in Embodiment 1, 3, or 4 can be used and the storage device described in Embodiment 6 is included is described.

Figure 27:
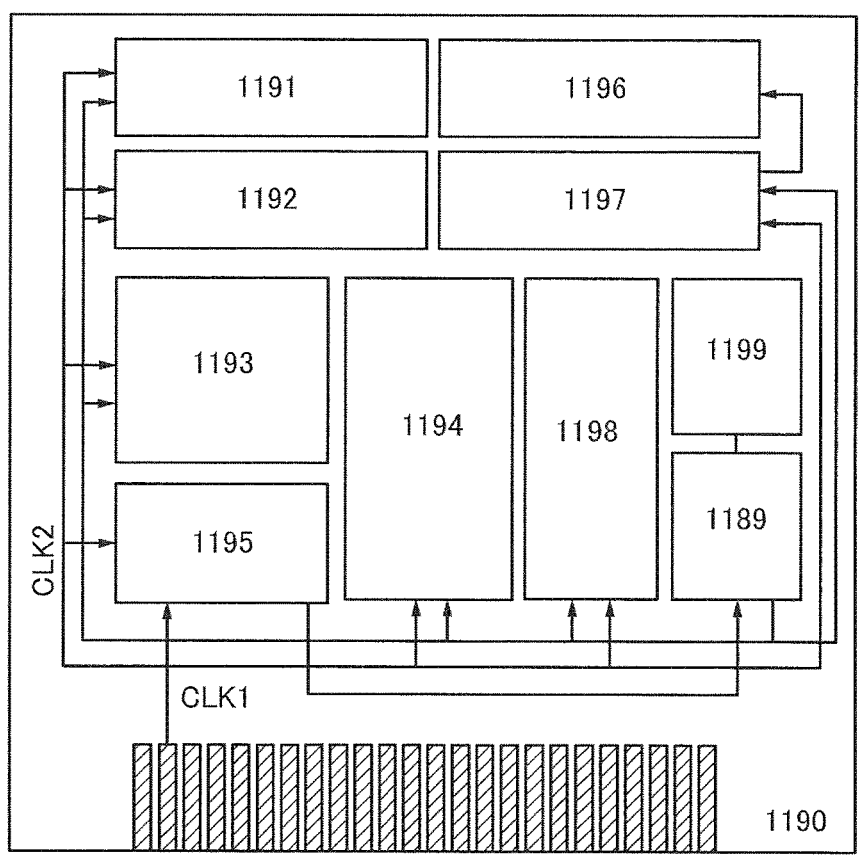
FIG. 27 is a block diagram of a semiconductor device.

FIG. 27 is a block diagram illustrating a configuration example of a CPU at least partly including any of the transistors described in Embodiment 1, 3, or 4.

The CPU illustrated in FIG. 27 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 27 is just an example in which the configuration has been simplified, and an actual CPU may have various configurations depending on the application. For example, the CPU may have the following configuration: a structure including the CPU illustrated in FIG. 27 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 27, a memory cell is provided in the register 1196. As the memory cell of the register 1196, any of the transistors described in the above embodiments can be used.

In the CPU illustrated in FIG. 27, the register controller 1197 selects operation of holding data in the register 1196 in accordance with an instruction from the ALU 1191. That is, the register controller 1197 selects whether data is stored by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 28:
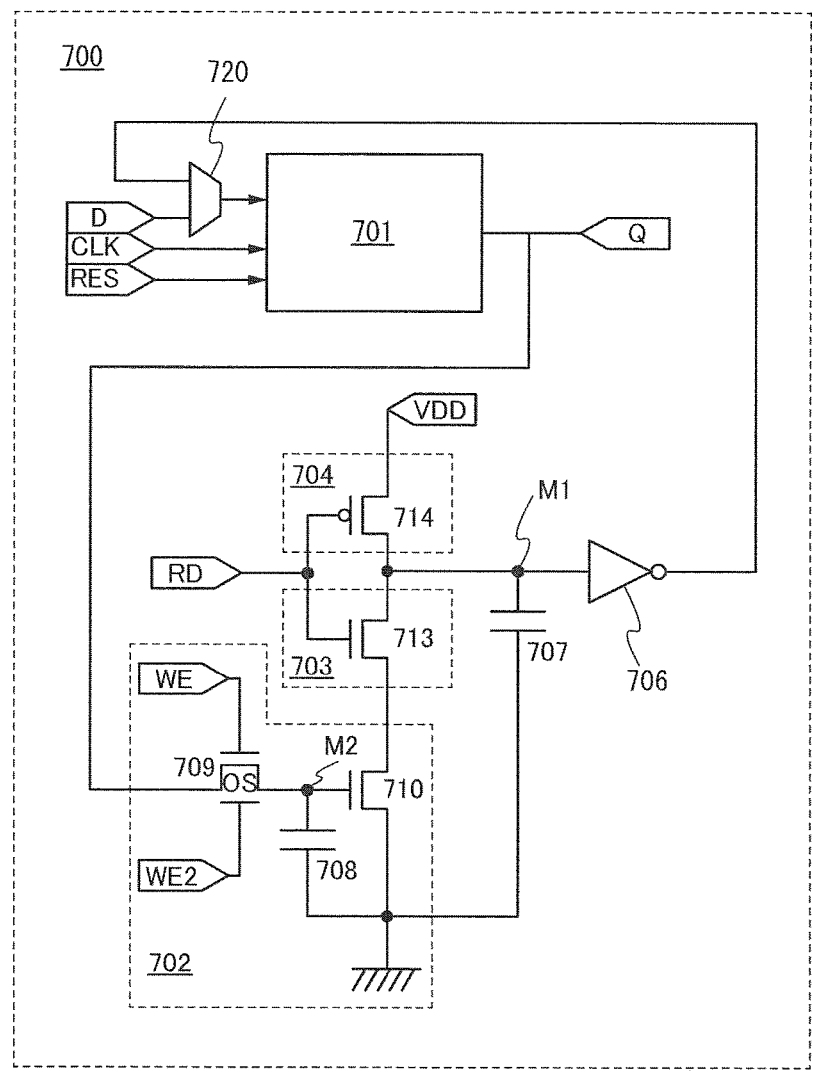
FIG. 28 is a circuit diagram of a memory device.

FIG. 28 is an example of a circuit diagram of a storage element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the storage device described in Embodiment 6 can be used as the circuit 702. When supply of the power supply voltage to the memory element 700 is stopped, a ground potential (0 V) or a potential at which the transistor 709 in the circuit 702 is turned off continues to be input to a first gate of the transistor 709. For example, the first gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode layer) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 28 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 28, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 28, any of the transistors described in Embodiments 1, 3, and 4 can be used. As described in Embodiment 6, the transistor 709 preferably includes a second gate (second gate electrode layer). The control signal WE can be input to the first gate and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 can be further reduced. Note that as the transistor 709, the transistor without the second gate can be used.

Further, in FIG. 28, the transistors included in the memory element 700 except for the transistor 709 can each be a transistor in which a channel is formed in a layer formed using a semiconductor other than an oxide semiconductor or in the substrate 1190. For example, a transistor in which a channel is formed in a silicon layer or a silicon substrate can be used. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 28, for example, a flip-flop circuit can be used. As the logic element 706, for example, an inverter, a clocked inverter, or the like can be used.

The above is the structure of the memory element 700. Next, a driving method of the memory element 700 is described.

A driving method of the memory element 700 in the case where the supply of the power supply voltage is made, stopped for a reduction in power consumption at the time of data holding, and then made again, is described with reference to a timing chart in FIG. 29. In the timing chart in FIG. 29, reference numeral 701 denotes data held in the circuit 701, reference symbol WE denotes the potential of the control signal WE, reference symbol WE2 denotes the potential of the control signal WE2, reference symbol RD denotes the potential of the control signal RD, reference symbol SEL denotes the potential of the control signal SEL of one path in the circuit 720, and reference symbol VDD denotes the power supply potential VDD. Reference symbol M1 denotes the potential of the node M1, and reference symbol M2 denotes the potential of the node M2. Note that the one path in the circuit 720 is a path connecting the output side of the circuit 702 and the input side of the circuit 701.

In the driving method below, an example is described where, in the case of using an n-channel transistor for the switch 703 and a p-channel transistor for the switch 704 in the structure illustrated in FIG. 28, the first terminal and the second terminal of the switch 703 are brought into conduction and the first terminal and the second terminal of the switch 704 are brought out of conduction when the control signal RD has a high-level potential, and the first terminal and the second terminal of the switch 703 are brought out of conduction and the first terminal and the second terminal of the switch 704 are brought into conduction when the control signal RD has a low-level potential. Further, in this example, a first terminal and a second terminal in one path in the circuit 720 are brought into conduction when the control signal SEL has a high-level potential, and the first terminal and the second terminal therein are brought out of conduction when the control signal SEL has a low-level potential. Furthermore, in the case of using an n-channel transistor for the transistor 709 in this example, the transistor 709 is turned on when the control signal WE has a high-level potential and the transistor 709 is turned off when the control signal WE has a low-level potential.

However, a driving method of the semiconductor device of one embodiment of the present invention is not limited to this, and in the following description, the potential of each control signal can be determined such that the switch 703, the switch 704, the circuit 720, and the transistor 709 are in the same state.

Figure 29:
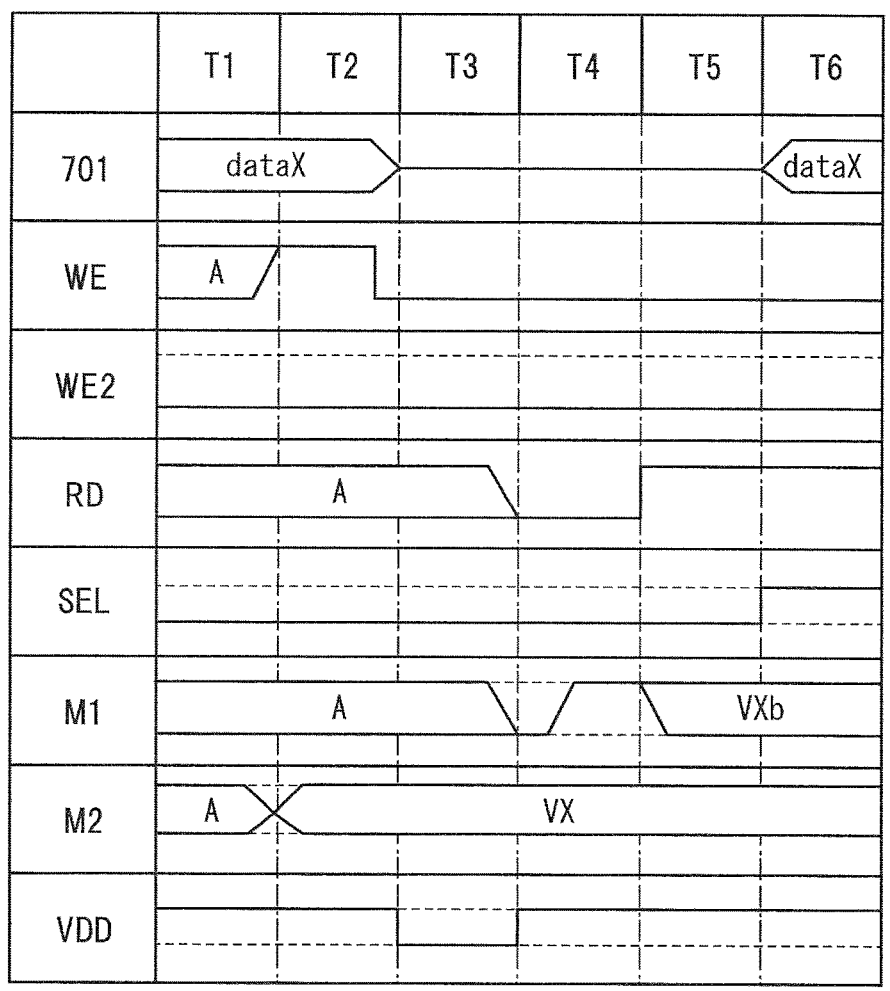
FIG. 29 is a timing chart showing operation of a memory device.

First, the operation in a period T1 in FIG. 29 is described. In T1, the power supply voltage VDD is supplied to the memory element 700. In a period during which the power supply voltage is supplied to the memory element 700, data (referred to as dataX in FIG. 29) is held in the circuit 701. At this time, the control signal SEL has a low-level potential so that the first terminal and the second terminal in the one path in the circuit 720 are out of conduction. Note that the first terminal and the second terminal of each of the switch 703 and the switch 704 may be in either the conduction state or the non-conduction state. That is, the control signal RD may have either a high-level potential or a low-level potential (referred to as A in FIG. 29). Further, the transistor 709 may be either on or off. That is, the control signal WE may have either a high-level potential or a low-level potential (referred to as A in FIG. 29). In T1, the node M1 may have any potential (referred to as A in FIG. 29). In T1, the node M2 may have any potential (referred to as A in FIG. 29). The operation in T1 is referred to as normal operation. The control signal WE2 has a constant potential, for example, a low level potential such as a ground potential in any period.

Next, the operation in a period T2 in FIG. 29 is described. Before supply of the power supply voltage to the memory element 700 is stopped, the control signal WE is set to a high-level potential so that the transistor 709 is turned on. Thus, a signal corresponding to data (dataX) held in the circuit 701 is input to the gate of the transistor 710 through the transistor 709. The signal input to the gate of the transistor 710 is held by the capacitor 708. In this manner, the potential of the node M2 becomes a signal potential (referred to as VX in FIG. 29) corresponding to the data held in the circuit 701. After that, the control signal WE is set to a low-level potential so that the transistor 709 is turned off. Thus, a signal corresponding to the data held in the circuit 701 is held in the circuit 702. Also in T2, the first terminal and the second terminal in the one path in the circuit 720 are kept in the non-conduction state owing to the control signal SEL. The first terminal and the second terminal of each of the switch 703 and the switch 704 may be in either the conduction state or the non-conduction state. That is, the control signal RD may have either a high-level potential or a low-level potential (referred to as A in FIG. 29). In T2, the node M1 may have any potential (referred to as A in FIG. 29). The operation in T2 is referred to as operation before stop of supply of the power supply voltage.

Next, the operation in a period T3 in FIG. 29 is described. The operation before stop of supply of the power supply voltage is performed, and then, the supply of the power supply voltage to the memory element 700 is stopped at the beginning of T3. When the supply of the power supply voltage is stopped, the data (dataX) held in the circuit 701 is lost. However, even after the supply of the power supply voltage to the memory element 700 is stopped, the signal potential (VX) corresponding to the data (dataX) held in the circuit 701 is held in the node M2 by the capacitor 708. Here, as the transistor 709 in which the channel is formed in the oxide semiconductor layer, an n-channel enhancement (normally-off) transistor whose leakage current (off-state current) is extremely small is used. Therefore, since a ground potential (0 V) or a potential at which the transistor 709 is turned off continues to be input to the gate of the transistor 709 when supply of the power supply voltage to the memory element 700 is stopped, the transistor 709 can be kept in the off state even after the supply of the power supply voltage to the memory element 700 is stopped. As a result, a potential held by the capacitor 708 (the potential VX of the node M2) can be held for a long time. In this manner, even after the supply of the power supply voltage to the memory element 700 is stopped, data (dataX) is held. T3 corresponds to a period during which the supply of the power supply voltage to the memory element 700 is stopped.

Then, the operation in a period T4 in FIG. 29 is described. After the supply of the power supply voltage to the memory element 700 is restarted, the control signal RD is set to a low-level potential; thus, the first terminal and the second terminal of the switch 704 are brought into conduction and the first terminal and the second terminal of the switch 703 are brought out of conduction. At this time, the control signal WE is a low-level potential, and the transistor 709 remains off. The control signal SEL is a low-level potential, and thus the first terminal and the second terminal in the one path in the circuit 720 are in the non-conduction state. In this manner, VDD is input to the second terminal of the switch 703 and the first terminal of the switch 704. Therefore, the second terminal of the switch 703 and the first terminal of the switch 704 (the potential of the node M1) can be set to a constant potential (here, VDD). The operation in T4 is referred to as pre-charge operation. The potential of the node M1 is held by the capacitor 707.

After the above pre-charge operation, in a period T5, the control signal RD is set to a high-level potential; thus, the first terminal and the second terminal of the switch 703 are brought into conduction and the first terminal and the second terminal of the switch 704 are brought out of conduction. At this time, the control signal WE is kept at a low-level potential, and the transistor 709 remains off. The control signal SEL has a low-level potential, and thus the first terminal and the second terminal in the one path in the circuit 720 are out of conduction. Depending on a signal held in the capacitor 708 (the potential VX of the node M2), the on/off state of the transistor 710 is selected, and the potential of the second terminal of the switch 703 and the first terminal of the switch 704, i.e., the potential of the node M1 is determined. In the case where the transistor 710 is on, the low power supply potential (e.g., GND) is input to the node M1. On the other hand, in the case where the transistor 710 is off, the potential of the node M1 is kept at a constant potential (e.g., VDD) which is determined by the above pre-charge operation. In this manner, depending on the on state or the off state of the transistor 710, the potential of the node M1 becomes VDD or GND. For example, in the case where a signal held in the circuit 701 is "1" and corresponds to a high-level signal (VDD), the potential of the node M1 becomes a low-level potential (GND) corresponding to a signal "0". On the other hand, in the case where a signal held in the circuit 701 is "0" and corresponds to a low-level potential (GND), the potential of the node M1 becomes a high-level potential (VDD) corresponding to a signal "1". That is, an inverted signal of a signal held in the circuit 701 is held in the node M1. This potential is denoted as VXb in FIG. 29. That is, a signal corresponding to the data (dataX) input from the circuit 701 in T2 is converted into the potential of the node M1 (VXb).

After that, in a period T6, the control signal SEL is set to a high-level potential, so that the first terminal and the second terminal in the one path in the circuit 720 are brought into conduction. At this time, the control signal RD is kept at a high-level potential. The control signal WE is kept at a low-level potential, and thus the transistor 709 remains off. Consequently, the phase of a signal corresponding to the potential of the second terminal of the switch 703 and the first terminal of the switch 704 (the potential of the node M1 (VXb)) is inverted through the logic element 706, and this inverted signal can be input to the circuit 701. In this manner, the data which has been held before the stop of supplying the power supply voltage to the memory element 700 (dataX) can be held in the circuit 701 again.

The potential of the node M1 is set to a constant potential (VDD in FIG. 29) by the pre-charge operation in T4, and becomes the potential VXb corresponding to the data (dataX) in T5. Since the pre-charge operation is performed, the time required for the potential of the node M1 to be set to the constant potential VXb can be shortened. In this manner, the time required for the circuit 701 to hold original data again after the supply of the power supply voltage is restarted can be shortened.

The above is the driving method of the memory element.

In the driving method of the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor layer is extremely small. For example, the off-state current of a transistor in which a channel is formed in an oxide semiconductor layer is significantly smaller than that of a transistor in which a channel is formed in silicon having crystallinity. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs the above pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory device can be returned to the same state as that before the power supply is stopped. Therefore, the power supply can be stopped even for a short time in the processor or one or a plurality of logic circuits included in the processor. Accordingly, power consumption can be suppressed.

Although the CPU is given as an example here, the transistor can also be applied to an LSI such as a digital signal processor (DSP), a custom LSI, or a field programmable gate array (FPGA).

(Embodiment 9)

In this embodiment, examples of an electronic device which can include the transistor described in Embodiment 1, 3, or 4, the storage device described in Embodiment 6, or 7, or the CPU described in Embodiment 8 is described.

The transistor described in Embodiment 1, 3, or 4, the storage device described in Embodiment 6, or 7, or the CPU described in Embodiment 8 can be applied to a variety of electronic devices (including game machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipments such as dialyzers and X-ray diagnostic equipments. In addition, the examples of the electronic devices include alarm devices such as smoke detectors, heat detectors, gas alarm devices, and security alarm devices. Further, the examples of the electronic devices also include industrial equipments such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 30A to 30C.

Figure 30A:
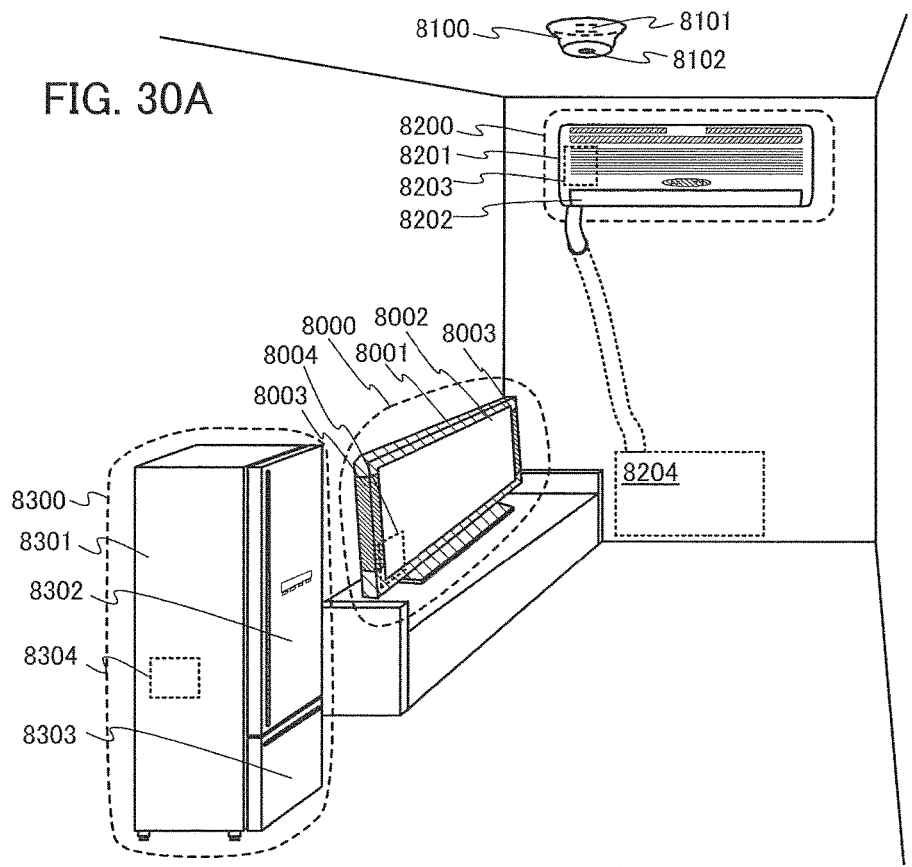
FIGS. 30A to 30C illustrate electronic devices to which semiconductor devices can be applied.
Figure 30B:
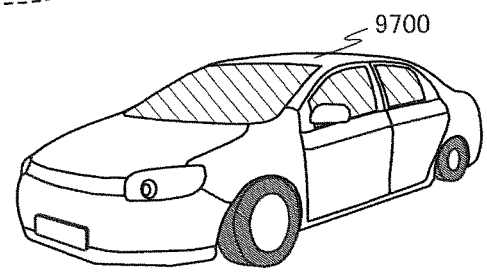
Figure 30C:
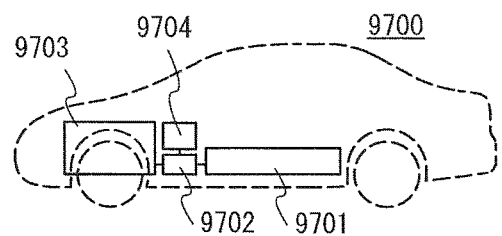

An alarm device 8100 illustrated in FIG. 30A is a residential fire which is an example of an electronic device including a sensor portion 8102 for smoke or heat and a microcomputer 8101. Note that the microcomputer 8101 includes the transistor, the storage device, or the CPU described in any of the above embodiments.

An air conditioner which includes an indoor unit 8200 and an outdoor unit 8204 illustrated in FIG. 30A is an example of an electronic device including the transistor, the storage device, or the CPU described in any of the above embodiments. Specifically, the indoor unit 8200 includes a housing 8201, an air outlet 8202, a CPU 8203, and the like. Although the CPU 8203 is provided in the indoor unit 8200 in FIG. 30A, the CPU 8203 may be provided in the outdoor unit 8204. Alternatively, the CPU 8203 may be provided in both the indoor unit 8200 and the outdoor unit 8204. By using any of the transistors described in the above embodiments for the CPU in the air conditioner, a reduction in power consumption of the air conditioner can be achieved.

An electronic refrigerator-freezer 8300 illustrated in FIG. 30A is an example of an electronic device including the transistor, the storage device, or the CPU described in any of the above embodiments. Specifically, the electric refrigerator-freezer 8300 includes a housing 8301, a door for a refrigerator 8302, a door for a freezer 8303, a CPU 8304, and the like. In FIG. 30A, the CPU 8304 is provided in the housing 8301. When any of the transistors described in the above embodiments is used as the CPU 8304 of the electric refrigerator-freezer 8300, a reduction in power consumption of the electric refrigerator-freezer 8300 can be achieved.

FIGS. 30B and 30C illustrate an example of an electronic vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When any of the transistors described in the above embodiments is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined as appropriate with any of the other embodiments in this specification.

(Embodiment 10)

Although the conductive film which is described in the above embodiment can be formed by a sputtering method, such film may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

The conductive film which is described in the above embodiment can be formed by a thermal CVD method such as a MOCVD method or an ALD method. For example, in the case where an InGaZnO$_X$ (X>0) film is formed, trimethylindium, trimethylgallium, and diethylzinc are used. Note that the chemical formula of trimethylindium is $(CH_3)_3$In. The chemical formula of trimethylgallium is $(CH_3)_3$Ga. The chemical formula of diethylzinc is $(CH_3)_2$Zn. Without limitation to the above combination, triethylgallium (chemical formula: $(C_2H_5)_3$Ga) can be used instead of trimethylgallium and dimethylzinc (chemical formula: $(C_2H_5)_2$Zn) can be used instead of diethylzinc.

For example, in the case where a hafnium oxide film is formed, two kinds of gases, i.e., ozone ($O_3$) as an oxidizer and a source gas which is obtained by vaporizing a solvent and liquid containing a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed, hexadichlorosilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

REFERENCE NUMERALS

100: transistor, 102: transistor, 110: substrate, 120: base insulating film, 130: oxide semiconductor layer, 131: first oxide semiconductor layer, 132: second oxide semiconductor layer, 133: third oxide semiconductor layer, 134: region, 135: boundary, 140: source electrode layer, 141: first source electrode layer, 142: second source electrode layer, 150: drain electrode layer, 151: first drain electrode layer, 152: second drain electrode layer, 160: gate insulating film, 170: gate electrode layer, 180: oxide insulating layer, 200: transistor, 202: transistor, 300: transistor, 302: transistor, 400:

transistor, 402: transistor, 520: base insulating film, 530: oxide semiconductor layer, 531: first oxide semiconductor layer, 532: second oxide semiconductor layer, 533: third oxide semiconductor layer, 540: source electrode layer, 550: drain electrode layer, 560: gate insulating film, 570: gate electrode layer, 580: oxide semiconductor layer, 630: silicon active layer, 631: p$^-$-type region, 632: n$^+$-type region, 700: memory element, 701: circuit, 702: circuit, 703: switch, 704: switch, 706: logic element, 707: capacitor, 708: capacitor, 709: transistor, 710: transistor, 713: transistor, 714: transistor, 720: circuit, 800: conductive film, 900: region, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3000: substrate, 3001: first wiring, 3002: second wiring, 3003: third wiring, 3004: fourth wiring, 3005: fifth wiring, 3100: element isolation insulating layer, 3150: insulating layer, 3200: transistor, 3250: electrode, 3300: transistor, 3400: capacitor, 4250: memory cell, 4300: transistor, 4400: capacitor, 4500: first wiring, 4600: second wiring, 8100: alarm device, 8101: microcomputer, 8102: sensor portion, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric vehicle, 9701: secondary battery, 9702: circuit, 9703: driving device, 9704: processing unit.

This application is based on Japanese Patent Application serial No. 2012-261795 filed with Japan Patent Office on Nov. 30, 2012, the entire contents of which are hereby incorporated by reference.

The invention claimed is:

1. A semiconductor device comprising:
a substrate;
an oxide semiconductor stack in which a first oxide semiconductor layer, a second oxide semiconductor layer, and a third oxide semiconductor layer are stacked in this order from the substrate side over the substrate;
a source electrode layer and a drain electrode layer;
a gate insulating film over the oxide semiconductor stack; and
a gate electrode layer over the gate insulating film,
wherein the first to third oxide semiconductor layers each comprise an In-M-Zn oxide (M is Al, Ti, Ga, Y, Zr, La, Ce, Nd, or Hf),
wherein a proportion of M with respect to In in an atomic ratio in each of the first oxide semiconductor layer and the third oxide semiconductor layer is higher than an atomic ratio of M to In in the second oxide semiconductor layer,
wherein the third oxide semiconductor layer is in contact with the source electrode layer and the drain electrode layer, and
wherein the second oxide semiconductor layer is not in contact with the source electrode layer and the drain electrode layer.

2. The semiconductor device according to claim 1,
wherein a proportion of M with respect to In in an atomic ratio in an end portion of the oxide semiconductor stack is higher than that in the second oxide semiconductor layer.

3. The semiconductor device according to claim 1,
wherein a proportion of M with respect to In in an atomic ratio in an end portion of the oxide semiconductor stack is substantially the same as that in the end portion of the oxide semiconductor stack.

4. The semiconductor device according to claim 1,
wherein energy of a bottom of a conduction band of each of the first oxide semiconductor layer and the third oxide semiconductor layer is closer to a vacuum level than that of the second oxide semiconductor layer, and
wherein an energy difference of the bottom of the conduction band between the second oxide semiconductor layer and the first oxide semiconductor layer and an energy difference of the bottom of the conduction band between the second oxide semiconductor layer and the third oxide semiconductor layer are each greater than or equal to 0.05 eV and smaller than or equal to 2 eV.

5. A semiconductor device comprising:
a first oxide semiconductor layer over a substrate;
a second oxide semiconductor layer over the first oxide semiconductor layer;
a third oxide semiconductor layer over the second oxide semiconductor layer;
a first source electrode layer and a first drain electrode layer over and in contact with the third oxide semiconductor layer;
a second source electrode layer covering the first source electrode layer;
a second drain electrode layer covering the first drain electrode layer;
a gate insulating film over the second source electrode layer and the second drain electrode layer; and
a gate electrode layer over the gate insulating film,
wherein the first source electrode layer and the second source electrode layer are materially different,
wherein the first drain electrode layer and the second drain electrode layer are materially different, and
wherein the second source electrode layer and the second drain electrode layer are in contact with a top surface of the third oxide semiconductor layer.

6. The semiconductor device according to claim 5,
wherein energy of a bottom of a conduction band of each of the first oxide semiconductor layer and the third oxide semiconductor layer is closer to a vacuum level than that of the second oxide semiconductor layer, and
wherein an energy difference of the bottom of the conduction band between the second oxide semiconductor layer and the first oxide semiconductor layer and an energy difference of the bottom of the conduction band between the second oxide semiconductor layer and the third oxide semiconductor layer are each greater than or equal to 0.05 eV and smaller than or equal to 2 eV.

7. The semiconductor device according to claim 5,
wherein the first to third oxide semiconductor layers are each formed using an In-M-Zn oxide (M is Al, Ti, Ga, Y, Zr, La, Ce, Nd, or Hf), and
wherein a proportion of M with respect to In in an atomic ratio in each of the first and third oxide semiconductor layers is higher than that in the second oxide semiconductor layer.

8. The semiconductor device according to claim 5,
wherein the first source electrode layer and the first drain electrode layer are each formed using Al, Cr, Cu, Ta, Ti, Mo, and W, or an alloy material comprising any of these materials as its main component.

9. The semiconductor device according to claim 5,
wherein the second source electrode layer and the second drain electrode layer are each formed using a material comprising tantalum nitride, titanium nitride, or ruthenium.

10. A semiconductor device comprising:
a first oxide semiconductor layer;
a second oxide semiconductor layer over the first oxide semiconductor layer;
a third oxide semiconductor layer over the second oxide semiconductor layer;
a source electrode layer and a drain electrode layer;
a gate insulating film over the third oxide semiconductor layer; and
a gate electrode layer over the gate insulating film,
wherein the first to third oxide semiconductor layers are materially different,
wherein the third oxide semiconductor layer is in contact with the source electrode layer and the drain electrode layer, and
wherein the second oxide semiconductor layer is not in contact with the source electrode layer and the drain electrode layer.

11. The semiconductor device according to claim 10,
wherein energy of a bottom of a conduction band of each of the first oxide semiconductor layer and the third oxide semiconductor layer is closer to a vacuum level than that of the second oxide semiconductor layer, and
wherein an energy difference of the bottom of the conduction band between the second oxide semiconductor layer and the first oxide semiconductor layer and an energy difference of the bottom of the conduction band between the second oxide semiconductor layer and the third oxide semiconductor layer are each greater than or equal to 0.05 eV and smaller than or equal to 2 eV.

* * * * *